United States Patent
Fujie et al.

(10) Patent No.: US 8,741,508 B2
(45) Date of Patent: Jun. 3, 2014

(54) COLORED CURABLE COMPOSITION, COLOR RESIST, INK-JET INK, COLOR FILTER AND METHOD FOR PRODUCING THE SAME, SOLID-STATE IMAGE PICKUP DEVICE, IMAGE DISPLAY DEVICE, LIQUID CRYSTAL DISPLAY, ORGANIC EL DISPLAY, AND COLORANT COMPOUND AND TAUTOMER THEREOF

(75) Inventors: Yoshihiko Fujie, Shizuoka (JP); Shinichi Kanna, Kanagawa (JP); Kazuya Oota, Shizuoka (JP); Yoshiharu Yabuki, Shizuoka (JP); Hiroaki Idei, Shizuoka (JP); Yasuhiro Ishiwata, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 155 days.

(21) Appl. No.: 13/259,166

(22) PCT Filed: Jun. 10, 2010

(86) PCT No.: PCT/JP2010/060250
§ 371 (c)(1),
(2), (4) Date: Sep. 23, 2011

(87) PCT Pub. No.: WO2010/143745
PCT Pub. Date: Dec. 16, 2010

(65) Prior Publication Data
US 2012/0021354 A1    Jan. 26, 2012

(30) Foreign Application Priority Data

Jun. 10, 2009 (JP) .................................. 2009-139117
Aug. 11, 2009 (JP) .................................. 2009-186381
Sep. 30, 2009 (JP) .................................. 2009-228538

(51) Int. Cl.
$G02B\ 5/20$ (2006.01)
(52) U.S. Cl.
USPC ........ 430/7; 430/270.1; 430/288.1; 106/35.1; 534/758; 526/257
(58) Field of Classification Search
None
See application file for complete search history.

(56) References Cited

U.S. PATENT DOCUMENTS

| | | | |
|---|---|---|---|
| 4,619,992 A | 10/1986 | Bergmann et al. | |
| 5,789,560 A | 8/1998 | Etzbach et al. | |
| 2007/0251414 A1* | 11/2007 | Ueno et al. | 106/31.75 |
| 2008/0076044 A1 | 3/2008 | Mizukawa et al. | |

FOREIGN PATENT DOCUMENTS

| | | |
|---|---|---|
| EP | 1 975 204 A2 | 10/2008 |
| JP | 59-075205 A | 4/1984 |
| JP | 2002-201387 A | 7/2002 |
| JP | 3309514 B2 | 7/2002 |
| JP | 2004-339332 A | 12/2004 |
| JP | 2005-255868 A | 9/2005 |
| JP | 2005-316012 A | 11/2005 |
| JP | 2006-258916 A | 9/2006 |
| WO | 2010/004312 A1 | 1/2010 |

OTHER PUBLICATIONS

Computer-generated translation of JP 2005-255868 (Sep. 2005).*
First Office Action, dated Feb. 27, 2013, issued in corresponding CN Application No. 201080017323.1, 24 pages in English and Chinese.
International Search Report and Written Opinion, issued in corresponding International Application No. PCT/JP2010/060250, 9 pages.
Notice of Reasons for Rejection, dated Aug. 27, 2013, issued in corresponding JP Application No. 2009-186381, 3 pages in English and Japanese.
Office Action dated Dec. 3, 2013 in Japanese Application No. 2009-228538.
Extended European Search Report dated Dec. 3, 2013 in European Application No. 10786272.4.

* cited by examiner

*Primary Examiner* — John A. McPherson
(74) *Attorney, Agent, or Firm* — Sughrue Mion, PLLC

(57) ABSTRACT

A colored curable composition including: at least one selected from the group consisting of a compound represented by the following Formula (1a) and a tautomer thereof; and at least one polymerizable compound, (1a)

wherein $R^{11}$, $R^{12}$, $R^{13}$, $R^{14}$, $R^{15}$, and $R^{16}$ each independently represent a hydrogen atom or a monovalent substituent; and $R^{11}$ and $R^{12}$, and $R^{15}$ and $R^{16}$ independently may bond to each other in each pair to form a ring.

20 Claims, 5 Drawing Sheets

COLORED CURABLE COMPOSITION, COLOR RESIST, INK-JET INK, COLOR FILTER AND METHOD FOR PRODUCING THE SAME, SOLID-STATE IMAGE PICKUP DEVICE, IMAGE DISPLAY DEVICE, LIQUID CRYSTAL DISPLAY, ORGANIC EL DISPLAY, AND COLORANT COMPOUND AND TAUTOMER THEREOF

TECHNICAL FIELD

The present invention relates to a colored curable composition, a color filter and a method for producing the same, a solid-state image pickup device, an image display device, a liquid crystal display, an organic EL display, and a colorant compound and a tautomer thereof.

BACKGROUND ART

In recent years, with the advancement of personal computers, and especially wide-screen liquid crystal televisions, the demand for liquid crystal displays (LCDs), in particular for liquid crystal color displays has tended to increase. Further, due to the demand for much higher image quality, the popularization of organic EL displays has been eagerly awaited.

Meanwhile, the demand for solid-state image pickup devices such as CCD image sensors has been significantly growing in accordance with the popularization of digital cameras, camera-equipped mobile phones, etc. Color filters have been used as a key device of such displays or optical devices, and the demand for cost reduction of color filters has been increasing in conjunction with the demand for higher image quality. A color filter generally has a colored pattern of three primary colors, red (R), green (G), and blue (B), and serves to color the transmitting light or separate it into the three primary colors, in image display devices or solid-state image pickup devices.

Coloring agents used in the color filter are commonly required to have the following characteristics. That is, they are required to have preferred light absorption characteristics in view of color reproducibility, to exhibit no occurrence of optical disturbance such as light scattering responsible for lowering of contrast in liquid crystal displays or non-uniformity of an optical density responsible for color unevenness or rough feeling in solid-state image pickup devices, to have favorable fastness for the environmental conditions under which they are used, such as, for example, heat resistance, light resistance and resistance to moist heat, and to provide a large molar absorption coefficient and the possibility of thickness reduction.

A pigment dispersion method has been used as one of the methods for producing color filters for use in solid-state image pickup devices, liquid crystal displays, organic EL displays or the like. In the pigment dispersion method, a color filter produced in accordance with a photolithographic method or an ink-jet method is stable against light and heat due to the use of pigments.

In a case in which the color filter is produced by the photolithographic method, a radiation-sensitive composition is coated on a substrate by a spin coater, a slit coater, a roll coater, or the like, and then dried to thereby form a coating film. Then, colored pixels are obtained by patternwise-exposing and developing the thus-formed coating film. The color filter can be prepared by repeating such an operation several times in accordance with a desired number of hues. Since patterning is performed by means of light, positional accuracy can be sufficiently secured, and accordingly, this method has widely been used as a method suitable for producing a high-definition color filter in a large screen for use in liquid crystal displays, organic EL displays, or the like.

In a color filter for use in solid-state image pickup devices, minute patterns are formed by exposure through a mask with minute patterns, development with an alkaline liquid, and dissolution of the unexposed parts in an alkaline developer solution, but it is difficult to control the solubility (developability) of the exposed parts and the unexposed parts.

Further higher definition of color filters for use in solid-state image pickup devices has been recently demanded, but further improvement of resolution has been difficult with the conventional pigment dispersion method, due to the problem of color unevenness or the like resulting from coarse particles of pigments, and application of a photolithographic method using a pigment dispersion method for enhancement of definition is becoming increasingly difficult.

Meanwhile, also in liquid crystal displays, organic EL displays or the like, the color filter produced by a photolithographic method using a pigment dispersion method is excellent in light resistance and heat resistance, but has significant problems of lowered contrast or increased haze due to light scattering by pigment particles.

Further, the photolithographic method has the problem of high-production costs due to the requirement to repeat respective processes of coating, drying, patternwise exposure and development of a radiation-sensitive composition several times in accordance with a desired number of hues as described above, and the problem of a decreased production yield due to repetition of the same processes. In particular, due to the increased demand for cost reduction of liquid crystal displays, the demand for cost reduction of the color filters, which account for a large proportion of the cost, has increased, so there has been an increasing demand for a color filter production method with higher productivity.

As a production method of a color filter intended to solve the problems of a photolithographic method, there has been proposed a method of forming a colored layer (color pixels) by jetting a colored ink with an ink-jet method (see Japanese Patent Application Laid-Open (JP-A) No. 59-75205 and JP-A No. 2004-339332).

The ink-jet method is a recording method of obtaining letters or images by directly jetting ink droplets from very minute nozzles to attach them onto a recording member. The ink-jet method has advantages in that a color filter with a large area can be produced with high productivity by sequential movement of ink-jet heads, and the production can be achieved with low noise and good operability. An ink-jet ink prepared using a pigment dispersion method is used in the production of a color filter in accordance with such an ink-jet method. As the ink-jet ink prepared using a pigment dispersion method, there has been proposed, for example, an ink-jet ink for a color filter, containing a binder component, a pigment, and a solvent having a boiling point of 180° C. to 260° C. and a vapor pressure at room temperature of 0.5 mmHg or less (JP-A No. 2002-201387).

When an ink-jet ink prepared using a pigment dispersion method is used in the production of a color filter, there are frequent occurrences of nozzle clogging due to aggregation of a pigment, so it is undesirable in terms of jetting stability. Further, the aggregated pigment leads to deterioration of the recovery function of the ink jetting state by a jetting recovery operation such as wiping or purging. In addition, when wiping is carried out, scraping of a nozzle face with the aggregated pigment may cause deflection of the jetting direction of ink.

When a dye is used in place of the pigment dispersion method, color filters for solid-state image pickup devices are expected to achieve high resolution by solving the problems of color unevenness and rough feeling, whereas liquid crystal displays or organic EL displays are expected to achieve improvements in optical properties such as contrast and haze. In addition, the ink-jet method using a dye generally has high jetting stability and is expected to achieve easy recovery of an ink jetting state by wiping or purging even when there is nozzle clogging associated with an increased ink viscosity or the like.

Based on the above-mentioned reasons, the use of a dye as a coloring agent has been examined (for example, see JP-A No. 2005-316012). However, a dye-containing colored curable composition has other problems as follows.

(1) Dyes are generally poor in light resistance and heat resistance as compared to pigments. In particular, there is a problem in that optical properties are changed due to a high-temperature process when forming a film of indium tin oxide (ITO) widely used as an electrode for liquid crystal displays or the like.

(2) Dyes tend to inhibit a radical polymerization reaction, so there is difficulty in designing of a colored curable composition, for a system where radical polymerization is used as a curing means.

Particularly, with regard to the photolithographic method, (3) Conventional dyes exhibit low solubility in an alkaline aqueous solution or organic solvent (hereinafter, also referred to simply as "solvent"), and thus, it is difficult to obtain a colored curable composition with a desired spectrum.

(4) Dyes often exhibit interaction with other components in the colored curable composition, so it is difficult to control the solubility (developability) of the exposed parts and the unexposed parts.

(5) When a molar absorption coefficient (ε) of the dye is low, a large amount of the dye needs to be added. Therefore, the amount of other components such as a polymerizable compound (monomer), a binder and a photopolymerization initiator in the colored curable composition has to be relatively decreased, thereby reducing the curability, post-curing heat resistance, and developability of the composition.

Because of these problems, it has been difficult hitherto to form a colored pattern for high-definition color filters, which is composed of a fine thin film and has excellent fastness, using a dye. In addition, with regard to color filters for solid-state image pickup devices, a colored layer is required to be formed of a thin film having a thickness of 1 μm or less. Therefore, in order to achieve desired absorption, a large amount of the colorant needs to be added to the curable composition, consequently resulting in the aforementioned problems.

Further, with regard to a colored curable composition containing a dye, it has been pointed out that, when a heating treatment is applied after the formation of a film, color transfer readily occurs between adjacent differently colored patterns or between stacked and overlapped layers. In addition to the color transfer, pattern peeling readily takes place in a low-exposure dose region due to the decreased sensitivity, and a desired shape or color density cannot be obtained due to thermal sagging, elution upon development, or the like which is caused by the decrease in the retative amount of photosensitive components contributing to photolithographic properties.

As approaches to solve these problems, there have been conventionally proposed a variety of methods involving selecting the kind of initiators, increasing an addition amount of initiators, or the like (for example, see JP-A No. 2005-316012). Further, there has been disclosed a method of producing a color filter wherein a colored pattern is formed, and then polymerization is carried out in an elevated exposure temperature state by irradiating light to the colored pattern while heating a substrate, thus increasing a polymerization rate of the system (for example, see Japanese Patent No. 3309514). In addition, there has been disclosed a method of producing a color filter wherein light irradiation is carried out between a development treatment and a heating treatment, thereby preventing shape deformation of the color filter (for example, see JP-A No. 2006-258916).

DISCLOSURE OF INVENTION

In is an object of the first aspect of the present invention to provide a colored curable composition which has excellent color purity, heat resistance and light resistance and can be formed into a thinner layer; a color resist having excellent color purity, heat resistance and light resistance, and favorable pattern formability, which is used in the formation of a colored pixel in accordance with a photolithographic method; and an ink-jet ink having excellent color purity, heat resistance, light resistance and jetting stability, which is used in the formation of a colored pixel in accordance with an ink-jet method. It is another object of the first aspect of the present invention to provide a color filter having excellent color purity, heat resistance and light resistance and a favorable pattern shape, and a method of producing the color filter. It is still another object of the first aspect of the present invention to provide an image display device, such as a solid-state image pickup device having excellent color purity, heat resistance and light resistance and high resolution, and a high-definition liquid crystal display or organic EL display having excellent color purity, heat resistance and light resistance and good color reproducibility. It is a further object of the first aspect of the present invention to provide a novel colorant compound with excellent absorption properties and a high molar absorption coefficient, which is useful in a colored curable composition or the like for use in a color filter, and a tautomer thereof.

As a result of intensive studies on a variety of colorants, the inventors of the present invention have found that an azo colorant compound having a specific structure exhibits a good color tone and a high absorption coefficient, and is excellent in fastness such as heat resistance and light resistance as well as in solubility in organic solvents, and also have found that it is possible to develop a colorant having excellent pattern formability (low dependency on a concentration of an alkaline developer solution) by introducing an alkali-soluble group, if necessary. The first aspect of the present invention has been completed based on these findings. In accordance with the first aspect of the present invention, the following <1> to <17> may be provided.

<1> A colored curable composition comprising:
at least one selected from the group consisting of a compound represented by the following Formula (1a) and a tautomer thereof; and
at least one polymerizable compound,

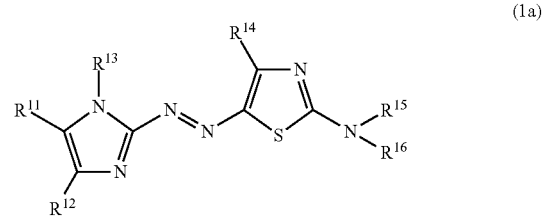

(1a)

wherein $R^{11}$, $R^{12}$, $R^{13}$, $R^{14}$, $R^{15}$, and $R^{16}$ each independently represent a hydrogen atom or a monovalent substituent; and $R^{11}$ and $R^{12}$, and $R^{15}$ and $R^{16}$ independently may bond to each other in each pair to form a ring.

<2> The colored curable composition according to <1>, wherein the compound represented by Formula (1a) is a compound represented by the following Formula (2):

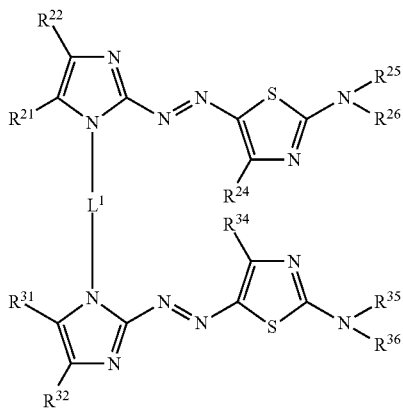

(2)

wherein $R^{21}$, $R^{22}$, $R^{24}$, $R^{25}$, $R^{26}$, $R^{31}$, $R^{32}$, $R^{34}$, $R^{35}$, and $R^{36}$ each independently represent a hydrogen atom or a monovalent substituent; $L^1$ represents a divalent linking group; and $R^{21}$ and $R^{22}$, $R^{25}$ and $R^{26}$, $R^{31}$ and $R^{32}$, and $R^{35}$ and $R^{36}$ independently may bond to each other in each pair to form a ring.

<3> The colored curable composition according to <1> or <2>, wherein the compound represented by Formula (1a) is a compound comprising at least one repeating unit represented by the following Formula (Pa):

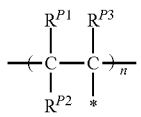

(Pa)

wherein $R^{P1}$, $R^{P2}$, and $R^{P3}$ each independently represent a hydrogen atom or a monovalent substituent; * represents a residue obtained by removing one hydrogen atom from a compound represented by Formula (1a); and n represents an integer from 1 to 100.

<4> The colored curable composition according to any one of <1> to <3>, wherein the polymerizable compound is a compound having two or more ethylenically unsaturated groups in a molecule thereof.

<5> A color resist comprising the colored curable composition of any one of <1> to <4>, wherein the color resist is used in the formation of a colored pixel according to a photolithographic method.

<6> An ink-jet ink comprising the colored curable composition of any one of <1> to <4>, where the ink-jet ink is used in the formation of a colored pixel according to an ink-jet method.

<7> A color filter formed using the colored curable composition of any one of <1> to <4>.

<8> A method for producing a color filter, comprising:
coating the colored curable composition of any one of <1> to <4> on a substrate to form a colored layer;
exposing the colored layer through a mask; and
developing the colored layer after the exposure to form a pattern.

<9> The method according to <8>, further comprising irradiating ultraviolet rays after the process of forming a pattern by the development.

<10> A method for producing a color filter, comprising depositing the colored curable composition of any one of <1> to <4> by an ink-jet method in a recessed part compartmented with partition walls formed on a substrate, to form a colored pixel.

<11> A solid-state image pickup device comprising the color filter of <7>.

<12> An image display device comprising the color filter of <7>.

<13> A liquid crystal display comprising the color filter of <7>.

<14> An organic EL display comprising the color filter of <7>.

<15> A colorant compound represented by the following Formula (2) or a tautomer thereof

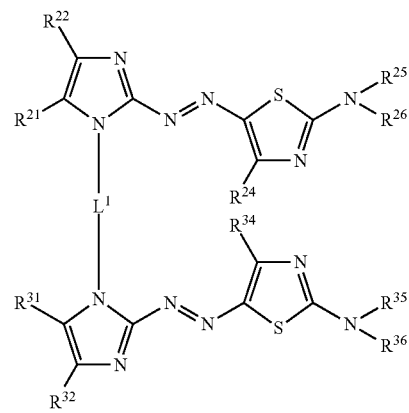

(2)

wherein $R^{21}$, $R^{22}$, $R^{24}$, $R^{25}$, $R^{26}$, $R^{31}$, $R^{32}$, $R^{34}$, $R^{35}$, and $R^{36}$ each independently represent a hydrogen atom or a monovalent substituent; $L^1$ represents a divalent linking group; and $R^{21}$ and $R^{22}$, $R^{25}$ and $R^{26}$, $R^{31}$ and $R^{32}$, and $R^{35}$ and $R^{36}$ independently may bond to each other in each pair to form a ring.

<16> A colorant compound comprising at least one repeating unit represented by the following Formula (Pa), or a tautomer thereof

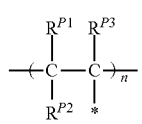

(Pa)

wherein $R^{P1}$, $R^{P2}$, and $R^{P3}$ each independently represent a hydrogen atom or a monovalent substituent; * represents a residue obtained by removing one hydrogen atom from a compound represented by Formula (1a); and n represents an integer from 1 to 100

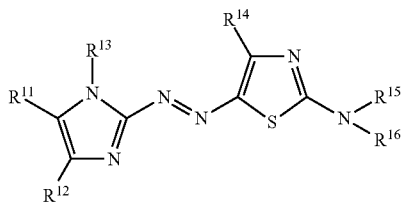

wherein $R^{11}$, $R^{12}$, $R^{13}$, $R^{14}$, $R^{15}$, and $R^{16}$ each independently represent a hydrogen atom or a monovalent substituent; and $R^{11}$ and $R^{12}$, and $R^{15}$ and $R^{16}$ independently may bond to each other in each pair to form a ring.

<17> The colorant compound or tautomer thereof according to <16>, wherein the colorant compound has an acid group in a range of from 25 mgKOH/g to 200 mgKOH/g.

Therefore, in accordance with the first aspect of the present invention, there may be provided a colored curable composition which has excellent color purity, heat resistance and light resistance and can be formed into a thinner layer; a color resist having excellent color purity, heat resistance and light resistance, and favorable pattern formability, which is used in the formation of a colored pixel in accordance with a photolithographic method; and an ink-jet ink having excellent color purity, heat resistance, light resistance and jetting stability, which is used in the formation of a colored pixel in accordance with an ink-jet method. Further, there may be provided a color filter having excellent color purity, heat resistance and light resistance and a favorable pattern shape, and a method of producing the color filter. Further, there may be provided an image display device, such as a solid-state image pickup device having excellent color purity, heat resistance and light resistance and high resolution, and a high-definition liquid crystal display or organic EL display having excellent color purity, heat resistance and light resistance and good color reproducibility. Further, there may be provided a novel colorant compound with excellent absorption properties and a high molar absorption coefficient, which is useful in a colored curable composition or the like for use in a color filter, and a tautomer thereof.

It is an object of the second aspect of the present invention to provide a colored curable composition which has excellent color purity, heat resistance and light resistance, and is capable of forming a colored layer with high color formation even in a thin film. It is another object of the second aspect of the present invention to provide a colored curable composition which is used in the formation of a colored pattern in accordance with a photolithographic method and a colored curable composition which is used in the formation of a colored pattern in accordance with an ink-jet method and has excellent jetting stability. It is still another object of the second aspect of the present invention to provide a color filter having excellent color purity, heat resistance and light resistance and a good shape of a colored pattern, and a method for producing the same. It is a further object of the second aspect of the present invention to provide a solid-state image pickup device with high resolution, and a high-definition image display device with good color reproducibility. It is yet another object of the second aspect of the present invention to provide a novel colorant compound with excellent absorption properties and a high molar absorption coefficient which is useful in a colored curable composition for use in color filters, and a tautomer thereof.

As a result of intensive studies on a variety of colorants, the inventors of the present invention have found that an azo colorant compound having a specific structure exhibits a good color tone and a high absorption coefficient, and is excellent in fastness such as heat resistance and light resistance as well as in solubility in organic solvents, and also have found that the aforementioned conventional problems are solved by using a colorant compound in which a partial structure derived from an azo colorant skeleton represented by Formula (1b) is introduced. Further, the inventors of the present invention have found that it is possible to develop a colored curable composition having excellent pattern formability (low dependency on a concentration of an alkaline developer solution) by, if necessary, using a colorant compound in which an alkali-soluble group is introduced in a colored curable composition. It has been found that such a colorant compound is capable of preventing the diffusion of a coloring agent in a thermal process, and is also capable of inhibiting heat-induced sublimation. In accordance with the second aspect of the present invention, the following <18> to <29> may be provided.

<18> A colored curable composition comprising:
at least one selected from the group consisting of a colorant compound represented by the following Formula (M) and a tautomer thereof; and
a polymerizable compound,

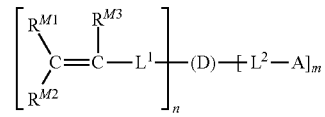

wherein $R^{M1}$, $R^{M2}$, and $R^{M3}$ each independently represent a hydrogen atom or a monovalent substituent; $L^1$ and $L^2$ each independently represent a single bond or a divalent linking group; A represents an acid group with pKa of 10 or less; D represents a residue obtained by removing (n+m) hydrogen atoms from a compound represented by the following Formula (1b); n represents an integer from 0 to 10; and m represents an integer from 1 to 10

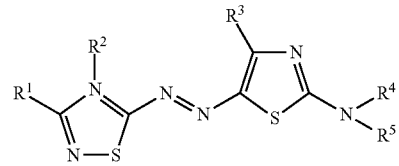

wherein $R^1$, $R^2$, $R^3$, $R^4$, and $R^5$ each independently represent a hydrogen atom or a monovalent substituent; and $R^1$ and $R^2$, and $R^4$ and $R^5$ independently may bond to each other in each pair to form a ring.

<19> A colored curable composition comprising:
at least one selected from the group consisting of a colorant compound comprising a repeating unit represented by the following Formula (Pb) and a tautomer thereof; and
a polymerizable compound,

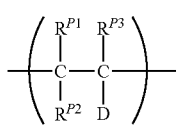
(Pb)

wherein $R^{P1}$, $R^{P2}$, and $R^{P3}$ each independently represent a hydrogen atom or a monovalent substituent; and D represents a residue obtained by removing one hydrogen atom from a compound represented by the following Formula (1b)

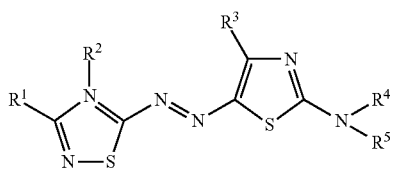
(1b)

wherein $R^1$, $R^2$, $R^3$, $R^4$, and $R^5$ each independently represent a hydrogen atom or a monovalent substituent; and $R^1$ and $R^2$, and $R^4$ and $R^5$ independently may bond to each other in each pair to form a ring.

<20> The colored curable composition according to <18> or <19>, further comprising a polymerization initiator.

<21> The colored curable composition according to any one of <18> to <20>, wherein the composition is used in the formation of a colored pattern according to a photolithographic method.

<22> The colored curable composition according to any one of <18> to <20>, wherein the composition is used in the formation of a colored pattern according to an ink-jet method.

<23> A color filter having a colored pattern formed using the colored curable composition of any one of <18> to <22>.

<24> A method for producing a color filter, comprising:
coating the colored curable composition of <21> on a substrate to form a colored layer;
patternwise-exposing the colored layer; and
developing the colored layer after the patternwise-exposure to form a colored pattern.

<25> A solid-state image pickup device comprising the color filter of <23>.

<26> An image display device comprising the color filter of <23>.

<27> A colorant compound represented by the following Formula (M) or a tautomer thereof

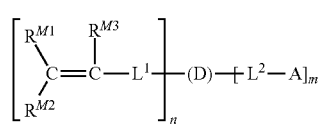
(M)

wherein $R^{M1}$, $R^{M2}$, and $R^{M3}$ each independently represent a hydrogen atom or a monovalent substituent; $L^1$ and $L^2$ each independently represent a single bond or a divalent linking group; A represents an acid group with pKa of 10 or less; D represents a residue obtained by removing (n+m) hydrogen atoms from a compound represented by the following Formula (1b); n represents an integer from 0 to 10; and m represents an integer from 1 to 10

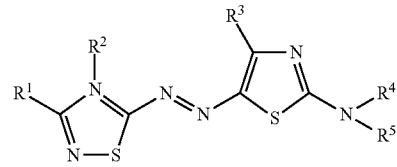
(1b)

wherein $R^1$, $R^2$, $R^3$, $R^4$, and $R^5$ each independently represent a hydrogen atom or a monovalent substituent; and $R^1$ and $R^2$, and $R^4$ and $R^5$ independently may bond to each other in each pair to form a ring.

<28> A colorant compound comprising a repeating unit represented by the following Formula (Pb) or a tautomer thereof

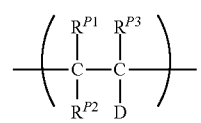
(Pb)

wherein $R^{P1}$, $R^{P2}$, and $R^{P3}$ each independently represent a hydrogen atom or a monovalent substituent; and D represents a residue obtained by removing one hydrogen atom from a compound represented by the following Formula (1b)

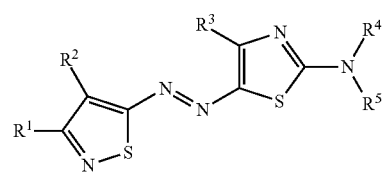
(1b)

wherein $R^1$, $R^2$, $R^3$, $R^4$, and $R^5$ each independently represent a hydrogen atom or a monovalent substituent; and $R^1$ and $R^2$, and $R^4$ and $R^5$ independently may bond to each other in each pair to form a ring.

<29> The colorant compound or tautomer thereof according to <28>, further comprising an acid group, wherein an acid value of the compound is in a range of 25 mgKOH/g to 200 mgKOH/g.

Therefore, in accordance with the second aspect of the present invention, there may be provided a colored curable composition which has excellent color purity, heat resistance and light resistance, and is capable of forming a colored layer with high color formation even in a thin film. Further, there may be provided a colored curable composition which is used in the formation of a colored pattern in accordance with a photolithographic method and a colored curable composition which is used in the formation of a colored pattern in accordance with an ink-jet method and has excellent jetting stability. Further, there may be provided a color filter having excellent color purity, heat resistance and light resistance, and a good shape of a colored pattern, and a method for producing the same. Further, there may be provided a solid-state image pickup device with high resolution, and a high-definition image display device with good color reproducibility. Further, there may be provided a novel colorant compound with excellent absorption properties and a high molar absorption coefficient which is useful in a colored curable composition for use in color filters, and a tautomer thereof.

BEST MODE FOR CARRYING OUT THE INVENTION

First Aspect of the Invention

Figure 1:
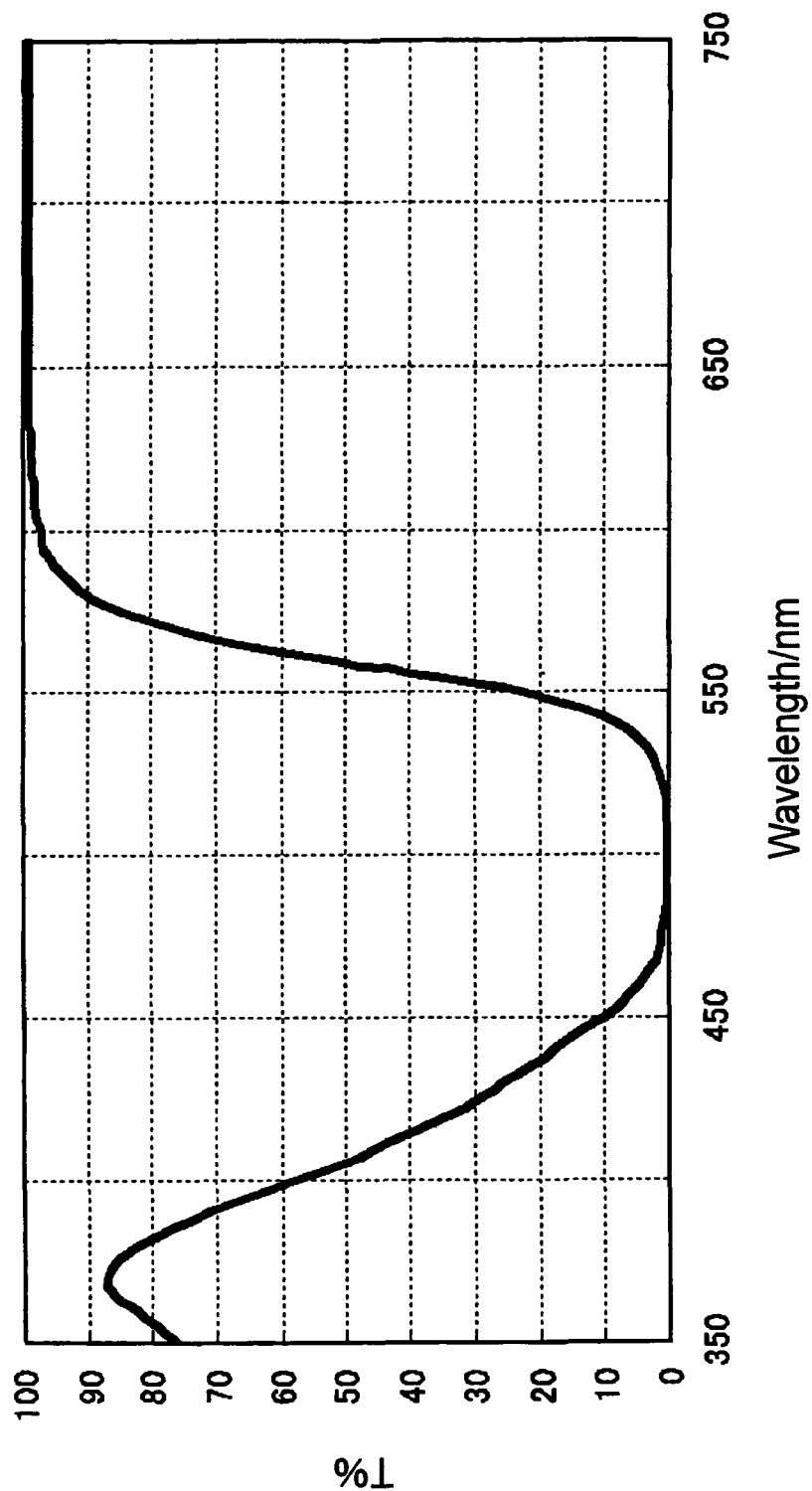
FIG. 1 shows a solution transmission spectrum of Exemplified Compound 6a of the present invention in ethyl acetate.

Hereinafter, a colored curable composition, a color filter, and a method for producing a color filter according to the first aspect of the invention will be described in more detail. Although explanation of configuration requirements described hereinbelow will be made based on representative embodiments of the present invention, the present invention is not limited thereto. Further, a numerical range represented using "-" in the present specification represents a range including numerical values described in front of and behind "-", as the minimum value and the maximum value.

—Colored Curable Composition—

The colored curable composition of the present invention contains at least one selected from the group consisting of a compound represented by Formula (1a) and a tautomer thereof as a coloring agent, and a polymerizable compound. A coloring agent used in the present invention is characterized in that it contains, within a molecule, a residue obtained by removing one or more hydrogen atoms from a compound represented by Formula (1a). The coloring agent of the present invention is at least one selected from the group consisting of a compound represented by Formula (1a) and a tautomer thereof. Examples of the compound represented by Formula (1a) include a compound containing at least one repeating unit represented by Formula (Pa). If necessary, at least one selected from the group consisting of a compound represented by Formula (1a) and a tautomer thereof may be used in combination with a compound containing at least one repeating unit represented by Formula (Pa).

The colored curable composition of the present invention is characterized in that it is cured by heat, light or both of them, and the composition may further contain other components such as a polymerization initiator, a solvent, a binder, and a crosslinking agent, if necessary.

Firstly, the compound represented by Formula (1a) will be described.

<Compound Represented by Formula (1a)>

The compound represented by Formula (1a) (hereinafter, referred to often as "specific azo colorant compound") used in the present invention will be described in more detail.

The specific azo colorant compound used in the present invention is an azo colorant compound characterized in that a coupling component is an aminothiazole and a diazo component is an imidazole. An azo colorant having an aminothiazole as a coupling component is described in JP-A No. 54-65730 and U.S. Pat. No. 5,789,560 (for example, Exemplified Compound 76), and a colorant having an imidazole as a diazo component is disclosed in JP-A No. 50-130820 and JP-A No. 55-71754.

In the present invention, when this specific azo colorant compound is used in the colored curable composition for color filters, characteristics necessary for the color filter, particularly high resolution, high definition, high color reproducibility, and high contrast can be satisfied.

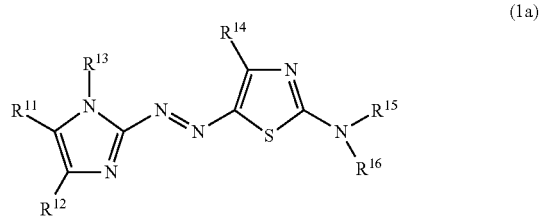

(1a)

In Formula (1a), $R^{11}$, $R^{12}$, $R^{13}$, $R^{14}$, $R^{15}$, and $R^{16}$ each independently represent a hydrogen atom or a monovalent substituent, and $R^{11}$ and $R^{12}$, and $R^{15}$ and $R^{16}$ independently may bond to each other in each pair to form a ring.

In Formula (1a), $R^{11}$, $R^{12}$, and $R^{14}$ each independently represent a hydrogen atom or a monovalent substituent. Examples of the monovalent substituent include a halogen atom, an alkyl group having a carbon number of 1 to 30 (in this application, which means a saturated aliphatic group, examples of which include a cycloalkyl group and a bicycloalkyl group), an alkenyl group having a carbon number of 2 to 30 (in this application, which means an unsaturated aliphatic group having a double bond, examples of which include a cycloalkenyl group and a bicycloalkenyl group), an alkynyl group having a carbon number of 2 to 30, an aryl group having a carbon number of 6 to 30, a heterocyclic group having a carbon number of 3 to 30, a cyano group, an aliphatic oxy group having a carbon number of 1 to 30, an aryloxy group having a carbon number of 6 to 30, an acyloxy group having a carbon number of 2 to 30, a carbamoyloxy group having a carbon number of 1 to 30, an aliphatic oxycarbonyloxy group having a carbon number of 2 to 30, an aryloxycarbonyloxy group having a carbon number of 7 to 30, an amino group having a carbon number of 0 to 30 (examples of which include an alkylamino group, an anilino group and a heterocyclic amino group), an acylamino group having a carbon number of 2 to 30, an aminocarbonylamino group having a carbon number of 1 to 30, an aliphatic oxycarbonylamino group having a carbon number of 2 to 30, an aryloxycarbonylamino group having a carbon number of 7 to 30, a sulfamoylamino group having a carbon number of 0 to 30, an alkyl- or aryl-sulfonylamino group having a carbon number of 1 to 30, an alkylthio group having a carbon number of 1 to 30, an arylthio group having a carbon number of 6 to 30, a sulfamoyl group having a carbon number of 0 to 30, an alkyl- or aryl-sulfinyl group having a carbon number of 1 to 30, an alkyl- or aryl-sulfonyl group having a carbon number of 1 to 30, an acyl group having a carbon number of 2 to 30, an aryloxycarbonyl group having a carbon number of 7 to 30, an aliphatic oxycarbonyl group having a carbon number of 2 to 30, a carbamoyl group having a carbon number of 1 to 30, an aryl or heterocyclic azo group having a carbon number of 3 to 30, and an imido group, each of which may further have a substituent.

In Formula (1a), $R^{13}$, $R^{15}$, and $R^{16}$ each independently represent a hydrogen atom or a monovalent substituent. Examples of the monovalent substituent include an alkyl group having a carbon number of 1 to 30, an alkenyl group having a carbon number of 2 to 30, an alkynyl group having a carbon number of 2 to 30, an aryl group having a carbon number of 6 to 30, a heterocyclic group having a carbon number of 3 to 30, an acyl group having a carbon number of 2 to 30, an aryloxycarbonyl group having a carbon number of 7 to 30, an alkoxycarbonyl group having a carbon number of 2 to 30, and a carbamoyl group having a carbon number of 1 to 30, each of which may further have a substituent.

Further, in a preferred embodiment, $R^{13}$ is a residue of a compound represented by Formula (1a) with a divalent linking group. In this case, it becomes a compound having a structure of Formula (2) which will be described hereinafter.

Hereinafter, monovalent substituents represented by $R^{12}$, $R^{13}$, $R^{14}$, $R^{15}$, and $R^{16}$, and substituents which may further substitute $R^{11}$, $R^{12}$, $R^{13}$, $R^{14}$, $R^{15}$, and $R^{16}$ will be described in more detail.

Examples of halogen atoms include a fluorine atom, a chlorine atom, a bromine atom, and an iodine atom. Among them, a chlorine atom and a bromine atom are preferred, and particularly a chlorine atom is preferred.

An aliphatic group is a linear, branched or cyclic aliphatic group, and as mentioned above, examples of the saturated aliphatic group include an alkyl group, a cycloalkyl group, and a bicycloalkyl group, each of which may have a substituent. A carbon number thereof is preferably in the range of 1 to 30. Examples of the aliphatic group include a methyl group, an ethyl group, an n-propyl group, an isopropyl group, a tert-butyl group, an n-octyl group, an eicosyl group, a 2-chloroethyl group, a 2-cyanoethyl group, a benzyl group and a 2-ethylhexyl group. Here, examples of the cycloalkyl group include a substituted or unsubstituted cycloalkyl group. The substituted or unsubstituted cycloalkyl group is preferably a cycloalkyl group having a carbon number of 3 to 30. Examples thereof include a cyclohexyl group, a cyclopentyl group, and a 4-n-dodecylcyclohexyl group. Examples of the bicycloalkyl group include a substituted or unsubstituted bicycloalkyl group having a carbon number of 5 to 30, i.e., a monovalent group obtained by removing one hydrogen atom from bicycloalkane having a carbon number of 5 to 30. Examples thereof include a bicyclo[1.2.2]heptan-2-yl group, and a bicyclo[2.2.2]octan-3-yl group. Further, a tricyclo structure or the like having a large number of cyclic structures is also included in the saturated aliphatic group.

An unsaturated aliphatic group is a linear, branched or cyclic unsaturated aliphatic group, and examples thereof include an alkenyl group, a cycloalkenyl group, a bicycloalkenyl group, and an alkynyl group. The alkenyl group represents a linear, branched or cyclic, substituted or unsubstituted alkenyl group. The alkenyl group is preferably a substituted or unsubstituted alkenyl group having a carbon number of 2 to 30. Examples of the alkenyl group include a vinyl group, an allyl group, a prenyl group, a geranyl group and an oleyl group. The cycloalkenyl group is preferably a substituted or unsubstituted cycloalkenyl group having a carbon number of 3 to 30, i.e., a monovalent group obtained by removing one hydrogen atom from cycloalkene having a carbon number of 3 to 30. Examples thereof include a 2-cyclopenten-1-yl group, and a 2-cyclohexen-1-yl group. Examples of the bicycloalkenyl group include a substituted or unsubstituted bicycloalkenyl group. The bicycloalkenyl group is preferably a substituted or unsubstituted bicycloalkenyl group having a carbon number of 5 to 30, i.e. a monovalent group obtained by removing one hydrogen atom from bicycloalkene having a double bond. Examples thereof include a bicyclo[2.2.1]hept-2-en-1-yl group, and a bicyclo[2.2.2]oct-2-en-4-yl group.

An alkynyl group is preferably a substituted or unsubstituted alkynyl group having a carbon number of 2 to 30, and examples thereof include an ethynyl group, and a propargyl group.

An aryl group is preferably a substituted or unsubstituted aryl group having a carbon number of 6 to 30, and examples thereof include a phenyl group, a p-tolyl group, a naphthyl group, an m-chlorophenyl group, and an o-hexadecanoylaminophenyl group, and preferred is a phenyl group which may have a substituent.

A heterocyclic group is a monovalent group obtained by removing one hydrogen atom from a substituted or unsubstituted, aromatic or non-aromatic heterocyclic compound, which may be further ring-condensed. The heterocyclic group is preferably a 5- or 6-membered heterocyclic group, and the ring-constituting heteroatom is preferably an oxygen atom, a sulfur atom, or a nitrogen atom. More preferred is a 5- or 6-membered aromatic heterocyclic group having a carbon number of 3 to 30. Examples of the heterocycle in the heterocyclic group include a pyridine ring, a pyrazine ring, a pyridazine ring, a pyrimidine ring, a triazine ring, a quinoline ring, an isoquinoline ring, a quinazoline ring, a cinnoline ring, a phthalazine ring, a quinoxaline ring, a pyrrole ring, an indole ring, a furan ring, a benzofuran ring, a thiophene ring, a benzothiophene ring, a pyrazole ring, an imidazole ring, a benzimidazole ring, a triazole ring, an oxazole ring, a benzoxazole ring, a thiazole ring, a benzothiazole ring, an isothiazole ring, a benzisothiazole ring, a thiadiazole ring, an isoxazole ring, a benzisoxazole ring, a pyrrolidine ring, a piperidine ring, a piperazine ring, an imidazolidine ring, and a thiazoline ring.

An aliphatic oxy group (typically an alkoxy group) may be a substituted or unsubstituted aliphatic oxy group (typically an alkoxy group), and a carbon number thereof is preferably in the range of 1 to 30. Examples thereof include a methoxy group, an ethoxy group, an isopropoxy group, an n-octyloxy group, a methoxyethoxy group, a hydroxyethoxy group and a 3-carboxypropoxy group.

An aryloxy group is preferably a substituted or unsubstituted aryloxy group having a carbon number of 6 to 30. Examples of the aryloxy group include a phenoxy group, a 2-methylphenoxy group, a 4-tert-butylphenoxy group, a 3-nitrophenoxy group, a 2-tetradecanoylaminophenoxy group, and the like. Preferred is a phenyloxy group which may have a substituent.

An acyloxy group is preferably a formyloxy group, a substituted or unsubstituted alkylcarbonyloxy group having a carbon number of 2 to 30, or a substituted or unsubstituted arylcarbonyloxy group having a carbon number of 7 to 30. Examples of the acyloxy group include a formyloxy group, an acetyloxy group, a pivaloyloxy group, a stearoyloxy group, a benzoyloxy group, a p-methoxyphenylcarbonyloxy group, and the like.

A carbamoyloxy group is preferably a substituted or unsubstituted carbamoyloxy group having a carbon number of 1 to 30. Examples of the carbamoyloxy group include an N,N-dimethylcarbamoyloxy group, an N,N-diethylcarbamoyloxy group, a morpholinocarbonyloxy group, an N,N-di-n-octylaminocarbonyloxy group, an N-n-octylcarbamoyloxy group, and the like.

An aliphatic oxycarbonyloxy group (typically an alkoxycarbonyloxy group) has preferably a carbon number of 2 to 30, and may have a substituent. Examples thereof include a methoxycarbonyloxy group, an ethoxycarbonyloxy group, a tert-butoxycarbonyloxy group, an n-octyloxycarbonyloxy group, and the like.

An aryloxycarbonyloxy group is preferably a substituted or unsubstituted aryloxycarbonyloxy group having a carbon number of 7 to 30. Examples of the aryloxycarbonyloxy group include a phenoxycarbonyloxy group, a p-methoxyphenoxycarbonyloxy group, a p-n-hexadecyloxyphenoxycarbonyloxy group, and the like. Preferred is a phenoxycarbonyloxy group which may have a substituent.

An amino group may be an amino group, an aliphatic amino group (typically an alkylamino group), an aryl amino group and a heterocyclic amino group. The amino group is preferably a substituted or unsubstituted aliphatic amino group (typically an alkylamino group) having a carbon number of 1 to 30 or a substituted or unsubstituted aryl amino group having a carbon number of 6 to 30. Examples of the amino group include an amino group, a methylamino group, a dimethylamino group, an anilino group, an N-methylanilino group, a diphenylamino group, a hydroxyethylamino group, a carboxyethylamino group, a sulfoethylamino group, a 3,5-dicarboxyanilino group, a 4-quinolylamino group, and the like.

An acylamino group is preferably a formylamino group, a substituted or unsubstituted alkylcarbonylamino group having a carbon number of 1 to 30 or a substituted or unsubstituted arylcarbonylamino group having a carbon number of 6 to 30. Examples of the acylamino group include a formylamino group, an acetylamino group, a pivaloylamino group, a lauroylamino group, a benzoylamino group, a 3,4,5-tri-n-octyloxyphenylcarbonylamino group, and the like.

An aminocarbonylamino group is preferably a substituted or unsubstituted aminocarbonylamino group having a carbon number of 1 to 30. Example of the aminocarbonylamino group include a carbamoylamino group, an N,N-dimethylaminocarbonylamino group, an N,N-diethylaminocarbonylamino group, a morpholinocarbonylamino group, and the like. In addition, the term "amino" in this group has the same definition as "amino" in the aforementioned amino group.

An aliphatic oxycarbonylamino group (typically an alkoxycarbonylamino group) has preferably a carbon number of 2 to 30, and may have a substituent. Examples thereof include a methoxycarbonylamino group, an ethoxycarbonylamino group, a tert-butoxycarbonylamino group, an n-octadecyloxycarbonylamino group, an N-methylmethoxycarbonylamino group, and the like.

An aryloxycarbonylamino group is preferably a substituted or unsubstituted aryloxycarbonylamino group having a carbon number of 7 to 30. Examples of the aryloxycarbonylamino group include a phenoxycarbonylamino group, a p-chlorophenoxycarbonylamino group, an m-n-octyloxyphenoxycarbonylamino group, and the like. Preferred is a phenyloxycarbonylamino group which may have a substituent.

A sulfamoylamino group is preferably a substituted or unsubstituted sulfamoylamino group having a carbon number of 0 to 30. Examples of the sulfamoylamino group include a sulfamoylamino group, an N,N-dimethylaminosulfonylamino group, an N-n-octylaminosulfonylamino group, and the like.

An aliphatic (typically alkyl) or arylsulfonylamino group is preferably a substituted or unsubstituted aliphatic sulfonylamino group (typically an alkylsulfonylamino group) having a carbon number of 1 to 30 or a substituted or unsubstituted arylsulfonylamino group (preferably a phenylsulfonylamino group which may have a substituent) having a carbon number of 6 to 30. Examples thereof include a methylsulfonylamino group, a butylsulfonylamino group, a phenylsulfonylamino group, a 2,3,5-trichlorophenylsulfonylamino group, a p-methylphenylsulfonylamino group, and the like.

An aliphatic thio group (typically an alkylthio group) is preferably a substituted or unsubstituted alkylthio group having a carbon number of 1 to 30. Examples of the alkylthio group include a methylthio group, an ethylthio group, an n-hexadecylthio group, and the like.

An arylthio group is preferably a substituted or unsubstituted arylthio group having a carbon number of 6 to 12. Examples of the arylthio group include a phenylthio group, a 1-naphthylthio group, a 2-naphthylthio group, and the like.

A sulfamoyl group is preferably a substituted or unsubstituted sulfamoyl group having a carbon number of 0 to 30. Examples of the sulfamoyl group include an N-ethylsulfamoyl group, an N-(3-dodecyloxypropyl)sulfamoyl group, an N,N-dimethylsulfamoyl group, an N-acetylsulfamoyl group, an N-benzoylsulfamoyl group, an N—(N'-phenylcarbamoyl) sulfamoyl group, and the like.

An aliphatic (typically alkyl) or arylsulfinyl group is preferably a substituted or unsubstituted aliphatic sulfinyl group (typically an alkylsulfinyl group) having a carbon number of 1 to 30 or a substituted or unsubstituted arylsulfinyl group (preferably a phenylsulfinyl group which may have a substituent) having a carbon number of 6 to 30. Examples thereof include a methylsulfinyl group, an ethylsulfinyl group, a phenylsulfinyl group, a p-methylphenylsulfinyl group, and the like.

An aliphatic (typically alkyl) or arylsulfonyl group is preferably a substituted or unsubstituted aliphatic sulfonyl group (typically an alkylsulfonyl group) having a carbon number of 1 to 30 or a substituted or unsubstituted arylsulfonyl group (preferably a phenylsulfonyl group which may have a substituent) having a carbon number of 6 to 30. Examples thereof include a methylsulfonyl group, an ethylsulfonyl group, a phenylsulfonyl group, a p-toluenesulfonyl group, and the like.

An acyl group is preferably a formyl group, a substituted or unsubstituted aliphatic carbonyl group (typically an alkylcarbonyl group) having a carbon number of 2 to 30, a substituted or unsubstituted arylcarbonyl group (preferably a phenylcarbonyl group which may have a substituent) having a carbon number of 7 to 30 or a substituted or unsubstituted heterocyclic carbonyl group having a carbon number of 4 to 30 in which a heterocycle is bonded to the carbonyl group through a carbon atom. Examples thereof include an acetyl group, a pivaloyl group, a 2-chloroacetyl group, a stearoyl group, a benzoyl group, a p-n-octyloxyphenylcarbonyl group, a 2-pyridylcarbonyl group, a 2-furylcarbonyl group, and the like.

An aryloxycarbonyl group is preferably a substituted or unsubstituted aryloxycarbonyl group having a carbon number of 7 to 30. Examples of the aryloxycarbonyl group include a phenoxycarbonyl group, an o-chlorophenoxycarbonyl group, an m-nitrophenoxycarbonyl group, a p-tert-butylphenoxycarbonyl group, and the like. Preferred is a phenyloxycarbonyl group which may have a substituent.

An aliphatic oxycarbonyl group (typically an alkoxycarbonyl group) preferably has a carbon number of 2 to 30, and may have a substituent. Examples thereof include a methoxycarbonyl group, an ethoxycarbonyl group, a tert-butoxycarbonyl group, an n-octadecyloxycarbonyl group, and the like.

A carbamoyl group is preferably a substituted or unsubstituted carbamoyl group having a carbon number of 1 to 30. Examples of the carbamoyl group include a carbamoyl group, an N-methylcarbamoyl group, an N,N-dimethylcarbamoyl group, an N,N-di-n-octylcarbamoyl group, an N-(methylsulfonyl)carbamoyl group, and the like.

Examples of an aryl or heterocyclic azo group include a phenylazo group, a 4-methoxyphenylazo group, a 4-pivaloylaminophenylazo group, a 2-hydroxy-4-propanoylphenylazo group, and the like.

Examples of an imido group include an N-succinimido group, an N-phthalimido group, and the like.

In addition, mention may be made of substituents having a hydroxyl group, a cyano group, a nitro group, the aforementioned dissociable group (for example, a sulfo group, a carboxyl group, or a phosphono group) or an ethylenically unsaturated group.

Each of these groups may further have a substituent, and examples of such a substituent include the aforementioned substituents.

$R^{11}$ and $R^{12}$ each independently represent preferably a cyano group, a substituted or unsubstituted alkoxycarbonyl group or a substituted or unsubstituted aryloxycarbonyl group in terms of being capable of effectively exerting the effect of the present invention, more preferably a cyano group or a substituted or unsubstituted alkoxycarbonyl group, and most preferably a cyano group.

$R^{13}$ represents preferably a substituted or unsubstituted alkyl group, a substituted or unsubstituted acyl group, a substituted or unsubstituted alkoxycarbonyl group, a substituted or unsubstituted aryloxycarbonyl group, a substituted or unsubstituted carbamoyl group or a heterocyclic group in terms of being capable of effectively exerting the effect of the present invention, more preferably a substituted or unsubstituted alkyl group or a substituted or unsubstituted acyl group, and most preferably a substituted or unsubstituted alkyl group.

$R^{14}$ represents preferably a substituted or unsubstituted alkyl group, a substituted or unsubstituted aryl group, a substituted or unsubstituted heterocyclic group or a substituted or unsubstituted acylamino group in terms of being capable of effectively exerting the effect of the present invention, more preferably a substituted or unsubstituted alkyl group, a substituted or unsubstituted aryl group, a 2-pyridyl group, a 3-pyridyl group, a 4-pyridyl group or a 2-thienyl group, and most preferably an unsubstituted alkyl group or a substituted or unsubstituted phenyl group.

$R^{15}$ and $R^{16}$ each independently represent preferably a hydrogen atom, a substituted or unsubstituted alkyl group, a substituted or unsubstituted aryl group or a substituted or unsubstituted acyl group in terms of being capable of effectively exerting the effect of the present invention, more preferably a substituted or unsubstituted alkyl group or a substituted or unsubstituted aryl group, and most preferably a substituted or unsubstituted alkyl group.

A preferred combination of substituents in the compound represented by Formula (1a) is preferably a combination wherein at least one of these substituents is the aforementioned preferred group, more preferably a combination wherein more numerous various substituents are the aforementioned preferred groups, and most preferably a combination wherein all the substituents are the aforementioned preferred groups.

The compound represented by Formula (1a) is particularly preferably a compound represented by Formula (2) or a compound containing at least one repeating unit represented by Formula (Pa), in terms of being capable of effectively exerting the effect of the present invention.

<Compound represented by Formula (2)>

The compound represented by Formula (1a) is preferably a compound represented by Formula (2) below.

The compound represented by Formula (2) is an azo colorant compound characterized in that a coupling component is an aminothiazole and a diazo component is an imidazole, similarly to the specific azo colorant compound represented by Formula (1a), and characterized by having a dimerization structure connected via the N-position on the imidazole ring.

Among the compounds represented by Formula (1a), a compound represented by Formula (2) can provide a colored curable composition which is particularly high in solubility in organic solvents, heat resistance and light resistance, and is excellent in stability over time and post-curing solvent resistance.

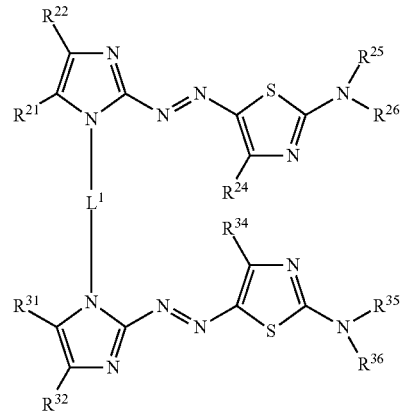

(2)

In Formula (2), $R^{21}$, $R^{22}$, $R^{24}$, $R^{25}$, $R^{26}$, $R^{31}$, $R^{32}$, $R^{34}$, and $R^{36}$ each independently represent a hydrogen atom or a monovalent substituent, and $L^1$ represents a divalent linking group. In addition, $R^{21}$ and $R^{22}$, $R^{25}$ and $R^{26}$, $R^{31}$ and $R^{32}$, and $R^{35}$ and $R^{36}$ independently may bond to each other in each pair to form a ring.

In Formula (2), $R^{21}$, $R^{22}$, $R^{24}$, $R^{31}$, $R^{32}$, and $R^{34}$ each independently represent a hydrogen atom or a monovalent substituent. Examples of the monovalent substituent represented by $R^{21}$, $R^{22}$, $R^{24}$, $R^{31}$, $R^{32}$, and $R^{34}$ include a halogen atom, an alkyl group having a carbon number of 1 to 30 (in this application, which means a saturated aliphatic group, examples of which include a cycloalkyl group and a bicycloalkyl group), an alkenyl group having a carbon number of 2 to 30 (in this application, which means an unsaturated aliphatic group having a double bond, examples of which include a cycloalkenyl group and a bicycloalkenyl group), an alkynyl group having a carbon number of 2 to 30, an aryl group having a carbon number of 6 to 30, a heterocyclic group having a carbon number of 3 to 30, a cyano group, an aliphatic oxy group having a carbon number of 1 to 30, an aryloxy group having a carbon number of 6 to 30, an acyloxy group having a carbon number of 2 to 30, a carbamoyloxy group having a carbon number of 1 to 30, an aliphatic oxycarbonyloxy group having a carbon number of 2 to 30, an aryloxycarbonyloxy group having a carbon number of 7 to 30, an amino group (examples of which include an alkylamino group, an anilino group and a heterocyclic amino group) having a carbon number of 0 to 30, an acylamino group having a carbon number of 2 to 30, an aminocarbonylamino group having a carbon number of 1 to 30, an aliphatic oxycarbonylamino group having a carbon number of 2 to 30, an aryloxycarbonylamino group having a carbon number of 7 to 30, a sulfamoylamino group having a carbon number of 0 to 30, an alkyl- or aryl-sulfonylamino group having a carbon number of 1 to 30, an alkylthio group having a carbon number of 1 to 30, a sulfamoyl group having a carbon number of 0 to 30, an alkyl- or aryl-sulfinyl group having a carbon number of 1 to 30, an alkyl- or aryl-sulfonyl group having a carbon number of 1 to 30, an acyl group having a carbon number of 2 to 30, an aryloxycarbonyl group having a carbon number of 7 to 30, an aliphatic oxycarbonyl group having a carbon number of 2 to 30, a carbamoyl group having a carbon number of 1 to 30, an aryl or heterocyclic azo group having a carbon number of 3 to 30, and an imido group, each of which may further have a substituent.

In Formula (2), $R^{25}$, $R^{26}$, $R^{35}$ and $R^{36}$ each independently represent a hydrogen atom or a monovalent substituent. Examples of the monovalent substituent represented by $R^{25}$, $R^{26}$, $R^{35}$, and $R^{36}$ include an alkyl group having a carbon number of 1 to 30, an alkenyl group having a carbon number of 2 to 30, an alkynyl group having a carbon number of 2 to 30, an aryl group having a carbon number of 6 to 30, a heterocyclic group having a carbon number of 3 to 30, an acyl group having a carbon number of 2 to 30, an aryloxycarbonyl group having a carbon number of 7 to 30, an aliphatic oxycarbonyl group having a carbon number of 2 to 30, and a carbamoyl group having a carbon number of 1 to 30, each of which may further have a substituent.

In Formula (2), $L^1$ represents a divalent linking group. Examples of the divalent linking group include an alkylene group (such as ethylene, 1,2-propylene, 1,3-propylene, or 1,4-butylene) having a carbon number of 2 to 30, an alkenylene group (such as ethenylene, or propenylene) having a carbon number of 2 to 30, an alkynylene group (such as ethynylene, or 1,3-propynylene) having a carbon number of 2 to 30, an arylene group (such as phenylene or naphthylene) having a carbon number of 6 to 30, a divalent heterocyclic group (such as a 6-chloro-1,3,5-triazine-2,4-diyl group, a pyrimidine-2,4-diyl group, or a quinoxaline-2,3-diyl group) having a carbon number of 3 to 30, —O—, —CO—, —NR— (R represents a hydrogen atom or an alkyl or aryl group having a carbon number of 1 to 30), —S—, —SO$_2$—, —SO— or a divalent substituent (such as o-xylylene, m-xylylene, or p-xylylene) consisting of a combination thereof and having a total carbon number of 0 to 30, each of which may further have a substituent.

$R^{21}$, $R^{22}$, $R^{31}$, and $R^{32}$ each independently represent preferably a cyano group, a substituted or unsubstituted alkoxycarbonyl group or a substituted or unsubstituted aryloxycarbonyl group in terms of being capable of effectively exerting the effect of the present invention, more preferably a cyano group or a substituted or unsubstituted alkoxycarbonyl group, and most preferably a cyano group.

$R^{24}$ and $R^{34}$ each independently represent preferably a substituted or unsubstituted alkyl group, a substituted or unsubstituted aryl group, a substituted or unsubstituted heterocyclic group or a substituted or unsubstituted acylamino group in terms of being capable of effectively exerting the effect of the present invention, more preferably a substituted or unsubstituted alkyl group, a substituted or unsubstituted aryl group, a 2-pyridyl group, a 3-pyridyl group, a 4-pyridyl group or a 2-thienyl group, and most preferably an unsubstituted alkyl group or a substituted or unsubstituted phenyl group.

$R^{25}$, $R^{26}$, $R^{35}$, and $R^{36}$ each independently represent preferably a hydrogen atom, a substituted or unsubstituted alkyl group, a substituted or unsubstituted aryl group or a substituted or unsubstituted acyl group in terms of being capable of effectively exerting the effect of the present invention, more preferably a substituted or unsubstituted alkyl group or a substituted or unsubstituted aryl group, and most preferably a substituted or unsubstituted alkyl group.

$L^1$ represents preferably a substituted or unsubstituted alkylene having a carbon number of 2 to 8, or a xylylene in terms of being capable of effectively exerting the effect of the present invention, more preferably a substituted or unsubstituted alkylene having a carbon number of 3 to 6, o-xylylene, or m-xylylene, and most preferably unsubstituted alkylene having a carbon number of 3 to 4 or o-xylylene.

A preferred combination of substituents in the compound represented by Formula (2) is preferably a combination wherein at least one of these substituents is the aforementioned preferred group, more preferably a combination wherein more numerous various substituents are the aforementioned preferred groups, and most preferably a combination wherein all the substituents are the aforementioned preferred groups.

In terms of being capable of effectively exerting the effect of the present invention, preferred is a combination wherein $R^{21}$ represents a cyano group, a substituted or unsubstituted alkoxycarbonyl group, or a substituted or unsubstituted aryloxycarbonyl group, $R^{22}$ represents a cyano group, a substituted or unsubstituted alkoxycarbonyl group, or a substituted or unsubstituted aryloxycarbonyl group, $R^{24}$ represents a substituted or unsubstituted alkyl group, a substituted or unsubstituted aryl group, a substituted or unsubstituted heterocyclic group, or a substituted or unsubstituted acylamino group, $R^{25}$ represents a hydrogen atom, a substituted or unsubstituted alkyl group, a substituted or unsubstituted aryl group, or a substituted or unsubstituted acyl group, $R^{26}$ represents a hydrogen atom, a substituted or unsubstituted alkyl group, a substituted or unsubstituted aryl group, or a substituted or unsubstituted acyl group, $R^{31}$ represents a cyano group, a substituted or unsubstituted alkoxycarbonyl group, or a substituted or unsubstituted aryloxycarbonyl group, $R^{32}$ represents a cyano group, a substituted or unsubstituted alkoxycarbonyl group, or a substituted or unsubstituted aryloxycarbonyl group, $R^{34}$ represents a substituted or unsubstituted alkyl group, a substituted or unsubstituted aryl group, a substituted or unsubstituted heterocyclic group, or a substituted or unsubstituted acylamino group, $R^{35}$ represents a hydrogen atom, a substituted or unsubstituted alkyl group, a substituted or unsubstituted aryl group, or a substituted or unsubstituted acyl group, $R^{36}$ represents a hydrogen atom, a substituted or unsubstituted alkyl group, a substituted or unsubstituted aryl group, or a substituted or unsubstituted acyl group, and $L^1$ represents a substituted or unsubstituted alkylene having a carbon number of 2 to 8 or a xylylene.

In terms of being capable of effectively exerting the effect of the present invention, more preferred is a combination wherein $R^{21}$ represents a cyano group, or a substituted or unsubstituted alkoxycarbonyl group, $R^{22}$ represents a cyano group, or a substituted or unsubstituted alkoxycarbonyl group, $R^{24}$ represents a substituted or unsubstituted alkyl group, a substituted or unsubstituted aryl group, a 2-pyridyl group, a 3-pyridyl group, a 4-pyridyl group, or a 2-thienyl group, $R^{25}$ represents a substituted or unsubstituted alkyl group, or a substituted or unsubstituted aryl group, $R^{26}$ represents a substituted or unsubstituted alkyl group, or a substituted or unsubstituted aryl group, $R^{31}$ represents a cyano group, or a substituted or unsubstituted alkoxycarbonyl group, $R^{32}$ represents a cyano group, or a substituted or unsubstituted alkoxycarbonyl group, $R^{34}$ represents a substituted or unsubstituted alkyl group, a substituted or unsubstituted aryl group, a 2-pyridyl group, a 3-pyridyl group, a 4-pyridyl group, or a 2-thienyl group, $R^{35}$ represents a substituted or unsubstituted alkyl group, or a substituted or unsubstituted aryl group, $R^{36}$ represents a substituted or unsubstituted alkyl group, or a substituted or unsubstituted aryl group, and L¹ represents a substituted or unsubstituted alkylene having a carbon number of 3 to 6, o-xylylene, or m-xylylene.

In terms of being capable of effectively exerting the effect of the present invention, most preferred is a combination wherein $R^{21}$ represents a cyano group, $R^{22}$ represents a cyano group, $R^{24}$ represents an unsubstituted alkyl group having a carbon number of 1 to 4, or a substituted or unsubstituted phenyl group, $R^{25}$ represents a substituted or unsubstituted alkyl group, $R^{26}$ represents a substituted or unsubstituted alkyl group, $R^{31}$ represents a cyano group, $R^{32}$ represents a cyano group, $R^{34}$ represents an unsubstituted alkyl group having a carbon number of 1 to 4, or a substituted or unsubstituted phenyl group, $R^{35}$ represents a substituted or unsubstituted alkyl group, $R^{36}$ represents a substituted or unsubstituted alkyl group, and L¹ represents an unsubstituted alkylene having a carbon number of 3 to 4 or o-xylylene.

<Compound Containing at Least One Repeating Unit Represented by Formula (Pa)>

A preferred embodiment is also a high-molecular weight azo colorant compound characterized in that the compound represented by Formula (1a) is a compound in which a high-molecular weight compound-derived group may be bonded as the substituent represented by $R^{11}$ to $R^{16}$ in Formula (1a), and which contains at least one repeating unit represented by Formula (Pa).

The compound containing at least one repeating unit represented by Formula (Pa) is a high-molecular weight azo colorant compound which is a high-molecular weight compound characterized in that similarly to the compound represented by Formula (1a), a coupling component is an aminothiazole and a diazo component is an imidazole, and characterized by having at least one repeating unit having, in the side chain thereof, a residue obtained by removing one hydrogen atom from the compound represented by Formula (1a). Among the specific azo colorant compounds, the high-molecular weight azo colorant compound containing at least one repeating unit represented by Formula (Pa) below can provide a colored curable composition which is particularly high in solubility in organic solvents, heat resistance and light resistance, and is excellent in stability over time and post-curing solvent resistance.

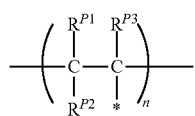

(Pa)

In Formula (Pa), $R^{P1}$, $R^{P2}$ and $R^{P3}$ each independently represent a hydrogen atom, or a monovalent substituent, * represents a residue obtained by removing one hydrogen atom from a compound represented by Formula (1a), and n represents an integer from 1 to 100.

In Formula (Pa), $R^{P1}$, $R^{P2}$, and $R^{P3}$ each independently represent a hydrogen atom or a monovalent substituent. Examples of the monovalent substituent represented by $R^{P1}$, $R^{P2}$, and $R^{P3}$ include a halogen atom, an alkyl group having a carbon number of 1 to 30 (in the present specification, which means a saturated aliphatic group, examples of which include cycloalkyl group and a bicycloalkyl group), an alkenyl group having a carbon number of 2 to 30 (in the present specification, which means an unsaturated aliphatic group having a double bond, examples of which include a cycloalkenyl group and a bicycloalkenyl group), an alkynyl group having a carbon number of 2 to 30, an aryl group having a carbon number of 6 to 30, a heterocyclic group having a carbon number of 3 to 30, a cyano group, an aliphatic oxy group having a carbon number of 1 to 30, an aryloxy group having a carbon number of 6 to 30, an acyloxy group having a carbon number of 2 to 30, a carbamoyloxy group having a carbon number of 1 to 30, an aliphatic oxycarbonyloxy group having a carbon number of 2 to 30, an aryloxycarbonyloxy group having a carbon number of 7 to 30, an amino group having a carbon number of 0 to 30 (in the present specification, examples of which include an alkylamino group, an anilino group and a heterocyclic amino group), an acylamino group having a carbon number of 2 to 30, an aminocarbonylamino group having a carbon number of 1 to 30, an aliphatic oxycarbonylamino group having a carbon number of 2 to 30, an aryloxycarbonylamino group having a carbon number of 7 to 30, a sulfamoylamino group having a carbon number of 0 to 30, an alkyl- or aryl-sulfonylamino group having a carbon number of 1 to 30, an alkylthio group having a carbon number of 1 to 30, a sulfamoyl group having a carbon number of 0 to 30, an alkyl- or aryl-sulfinyl group having a carbon number of 1 to 30, an alkyl- or aryl-sulfonyl group having a carbon number of 1 to 30, an acyl group having a carbon number of 2 to 30, an aryloxycarbonyl group having a carbon number of 7 to 30, an aliphatic oxycarbonyl group having a carbon number of 2 to 30, a carbamoyl group having a carbon number of 1 to 30, an aryl or heterocyclic azo group having a carbon number of 3 to 30, and an imido group, each of which may further have a substituent.

In Formula (Pa), n represents an integer from 1 to 100.

In Formula (Pa), * represents a residue obtained by removing one hydrogen atom from a compound represented by Formula (1a).

$R^{P1}$, $R^{P2}$, and $R^{P3}$ each independently represent preferably a hydrogen atom, a substituted or unsubstituted alkyl group, a substituted or unsubstituted aryl group, or a substituted or unsubstituted acyl group in terms of being capable of effectively exerting the effect of the present invention, more preferably a hydrogen atom or an unsubstituted alkyl group, and most preferably hydrogen or a methyl group.

n represents preferably 1 to 75 in terms of being capable of effectively exerting the effect of the present invention, more preferably 2 to 50, and most preferably 2 to 25.

The substituents in the residue have preferably the same definitions as the preferred substituents in Formula (1a), in view of being capable of effectively exerting the effect of the present invention. The site from which one hydrogen atom is removed is preferably a hydrogen atom in the hydrogen atom or substituent represented by $R^{13}$, $R^{14}$, $R^{15}$, and $R^{16}$, more preferably a hydrogen atom in the hydrogen atom or substituent represented by $R^{13}$, $R^{15}$, and $R^{16}$, and most preferably a hydrogen atom in the hydrogen atom or substituent represented by $R^{13}$.

A preferred embodiment of the compound containing at least one repeating unit represented by Formula (Pa) is a copolymerized high-molecular weight colorant compound containing a repeating unit represented by Formula (Pa) and a repeating unit having an acidic group.

Examples of the monomer for a copolymerization component used as the repeating unit having an acidic group include a vinyl monomer having a carboxyl group, a vinyl monomer having a sulfonic acid group, and the like.

Examples of the vinyl monomer having a carboxyl group include (meth)acrylic acid, vinyl benzoic acid, maleic acid, maleic acid monoalkyl ester, fumaric acid, itaconic acid, crotonic acid, cinnamic acid, an acrylic acid dimer, and the like. In addition, there may also be used a product of addition reaction between a monomer having a hydroxyl group such as 2-hydroxyethyl(meth)acrylate and a cyclic anhydride such as maleic anhydride, phthalic anhydride, or cyclohexanedicarboxylic anhydride, ω-carboxypolycaprolactone mono(meth)acrylate, and the like. Further, as the carboxyl group precursor, an anhydride-containing monomer such as a maleic anhydride, an itaconic anhydride, or a citraconic anhydride can be used. Further, among them, (meth)acrylic acid is particularly preferable in terms of copolymerization properties, costs, solubility, and the like.

Further, examples of the vinyl monomer having a sulfonic acid group include 2-(meth)acrylamide-2-methylpropane sulfonic acid, and the like, and examples of the vinyl monomer having a phosphoric acid group include phosphoric acid mono(2-(meth)acryloyloxy ethylester), phosphoric acid mono(1-methyl-2-(meth)acryloyloxy ethylester), and the like.

The compound containing at least one repeating unit represented by Formula (Pa) in the present invention preferably contains a repeating unit derived from the monomer having an acidic group as described above. By inclusion of such a repeating unit, when the pigment dispersion composition of the present invention is applied to a colored photosensitive composition, development removability of the unexposed parts is excellent.

The compound containing at least one repeating unit represented by Formula (Pa) in the present invention may contain one or two or more repeating units derived from a monomer having an acidic group.

In the compound containing at least one repeating unit represented by Formula (Pa), a content of the repeating unit derived from an acidic group-containing monomer is preferably 50 mgKOH/g or more, particularly preferably in the range of 50 mgKOH/g to 200 mgKOH/g. That is, in terms of inhibiting the formation of precipitates in a developer solution, a content of the repeating unit derived from an acidic group-containing monomer is preferably 50 mgKOH/g or more. In addition, in order to effectively inhibit the formation of secondary particles which is an aggregate of primary particles of a pigment or to effectively weaken cohesive force of secondary particles, a content of the repeating unit derived from an acidic group-containing monomer is preferably in the range of 50 mgKOH/g to 200 mgKOH/g.

The compound containing at least one repeating unit represented by Formula (Pa) may further contain a repeating unit derived from a copolymerizable vinyl monomer having another structure, as long as the effect of the invention is not impaired.

Although there is no particular limitation to the vinyl monomer that can be used herein, for example, preferred are (meth)acrylic acid esters, crotonic acid esters, vinyl esters, maleic acid diesters, fumaric acid diesters, itaconic acid diesters, (meth)acrylamides, vinyl ethers, vinyl alcohol esters, styrenes, (meth)acrylonitriles, and the like. Specific examples of the vinyl monomer include the following compounds. In addition, when it represents either or both of "acrylic, methacrylic" in the present specification, the term "acrylic, methacrylic" may be described as "(meth)acrylic" in some cases.

Examples of (meth)acrylic acid esters include methyl (meth)acrylate, ethyl (meth)acrylate, n-propyl(meth)acrylate, isopropyl(meth)acrylate, n-butyl(meth)acrylate, isobutyl(meth)acrylate, t-butyl(meth)acrylate, n-hexyl(meth)acrylate, cyclohexyl (meth)acrylate, t-butyl cyclohexyl (meth)acrylate, 2-ethylhexyl(meth)acrylate, t-octyl (meth)acrylate, dodecyl(meth)acrylate, octadecyl(meth)acrylate, acetoxyethyl(meth)acrylate, phenyl(meth)acrylate, 2-hydroxyethyl(meth)acrylate, 2-methoxyethyl(meth)acrylate, 2-ethoxyethyl(meth)acrylate, 2-(2-methoxyethoxy)ethyl (meth)acrylate, 3-phenoxy-2-hydroxypropyl(meth)acrylate, benzyl(meth)acrylate, diethylene glycol monomethylether (meth)acrylate, diethylene glycol monoethylether (meth) acrylate, triethylene glycol monomethylether (meth)acrylate, triethylene glycol monoethylether (meth)acrylate, polyethylene glycol monomethylether (meth)acrylate, polyethylene glycol monoethylether (meth)acrylate, β-phenoxyethoxyethyl(meth)acrylate, nonyl phenoxy polyethylene glycol (meth)acrylate, dicyclopentenyl(meth)acrylate, dicyclopentenyloxyethyl(meth)acrylate, trifluoroethyl(meth)acrylate, octafluoropentyl(meth)acrylate, perfluorooctylethyl (meth) acrylate, dicyclopentanyl(meth)acrylate, tribromophenyl (meth)acrylate, tribromophenyloxyethyl(meth)acrylate, and the like.

Examples of crotonic acid esters include butyl crotonate, hexyl crotonate, and the like.

Examples of vinyl esters include vinyl acetate, vinyl propionate, vinyl butyrate, vinyl methoxy acetate, vinyl benzoate, and the like.

Examples of maleic acid diesters include dimethyl maleate, diethyl maleate, dibutyl maleate, and the like.

Examples of fumaric acid diesters include dimethyl fumarate, diethyl fumarate, dibutyl fumarate, and the like.

Examples of itaconic acid diesters include dimethyl itaconate, diethyl itaconate, dibutyl itaconate, and the like.

Examples of (meth)acrylamides include (meth)acrylamide, N-methyl(meth)acrylamide, N-ethyl(meth)acrylamide, N-propyl(meth)acrylamide, N-isopropyl(meth)acrylamide, N-n-butyl(meth)acrylamide, N-t-butyl(meth) acrylamide, N-cyclohexyl(meth)acrylamide, N-(2-methoxyethyl) (meth)acrylamide, N,N-dimethyl(meth) acrylamide, N,N-diethyl(meth)acrylamide, N-phenyl(meth) acrylamide, N-benzyl(meth)acrylamide, (meth)acryloyl morpholine, diacetone acrylamide, and the like.

Examples of the vinyl ethers include methylvinyl ether, butyl vinyl ether, hexyl vinyl ether, methoxyethyl vinyl ether, and the like.

Examples of the styrenes include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, hydroxystyrene protected by a group deprotectable with an acidic substance (for example, t-Boc, and the like), methyl vinyl benzoate, and α-methylstyrene, and the like.

The compound containing at least one repeating unit represented by Formula (Pa) in the present invention preferably contains the repeating unit represented by Formula (Pa) in a molecule, in an amount of 20% by mass to 99.5% by mass, more preferably in an amount of 40% by mass to 95% by mass, based on the total mass of the compound containing at least one repeating unit represented by Formula (Pa).

If a content of the repeating unit represented by Formula (Pa) is within the above-specified range, spectral characteristics and alkaline developability in a thin film are good.

A preferred molecular weight of the compound containing at least one repeating unit represented by Formula (Pa) in the present invention is preferably in the range of 5000 to 100000 in terms of weight average molecular weight (Mw), and in the range of 2500 to 50000 in terms of number average molecular weight (Mn). More preferred is the range of 10000 to 50000 in terms of weight average molecular weight (Mw), and the range of 5000 to 30000 in terms of number average molecular weight (Mn).

Particularly, most preferred is the range of 10000 to 30000 in terms of weight average molecular weight (Mw), and the range of 5000 to 15000 in terms of number average molecular weight (Mn). From the viewpoint of developability when producing a color filter by the colored curable composition, a weight average molecular weight (Mw) is preferably 30000 or less.

Hereinafter, specific examples of the aforementioned compounds represented by Formula (1a) will be illustrated, but the present invention is not limited thereto. Further, the following Exemplified Compounds (71a) to (118a) are also Exemplified Compounds of Formula (2).

Further, Exemplified Compounds (P1a) to (P50a) are Exemplified Compounds of the aforementioned compound containing at least one repeating unit represented by Formula (Pa), but these Exemplified Compounds are also specific examples of the compound represented by Formula (1a).

$R^{41}$, $R^{42}$, $R^{43}$, $R^{44}$, $R^{45}$, and $R^{46}$ of the following Exemplified Compounds (1a) to (70a) and (119a) to (126a) represent the groups shown in Formula (3) below.

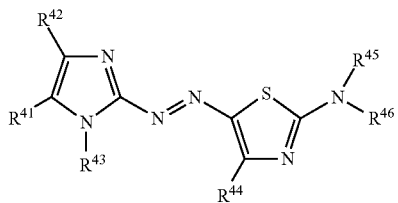

(3)

$R^{51}$, $R^{52}$, $R^{54}$, $R^{55}$, $R^{56}$, and $L^1$ of the following Exemplified Compounds (71a) to (114a) represent the groups shown in Formula (4) below.

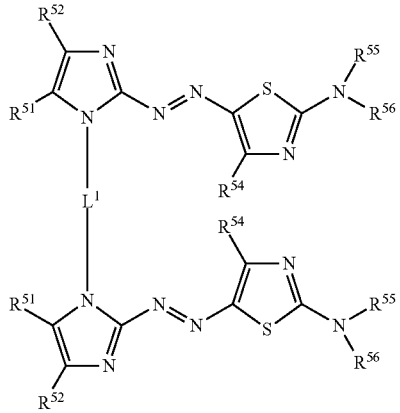

(4)

| Exemplified Compound | $R^{41}$ | $R^{42}$ | $R^{43}$ | $R^{44}$ | $R^{45}$ | $R^{46}$ |
|---|---|---|---|---|---|---|
| 1a | CN | CN | $C_2H_5$ | $t\text{-}C_4H_9$ | $C_2H_5$ | $C_2H_5$ |
| 2a | CN | CN | $n\text{-}C_3H_7$ | $t\text{-}C_4H_9$ | $C_2H_5$ | $C_2H_5$ |
| 3a | CN | CN | $n\text{-}C_8H_{17}$ | $t\text{-}C_4H_9$ | $C_2H_5$ | $C_2H_5$ |
| 4a | CN | CN | $-CH_2CH{=}CH_2$ | $t\text{-}C_4H_9$ | $C_2H_5$ | $C_2H_5$ |
| 5a | CN | CN | $-CH_2{-}C_6H_5$ | $t\text{-}C_4H_9$ | $C_2H_5$ | $C_2H_5$ |
| 6a | CN | CN | $-CH_2{-}C_6H_4{-}CH{=}CH_2$ | $t\text{-}C_4H_9$ | $C_2H_5$ | $C_2H_5$ |
| 7a | CN | CN | $-CH_2CO_2C_2H_5$ | $t\text{-}C_4H_9$ | $C_2H_5$ | $C_2H_5$ |
| 8a | CN | CN | $-CH(CH_3)CO_2C_2H_5$ | $t\text{-}C_4H_9$ | $C_2H_5$ | $C_2H_5$ |
| 9a | CN | CN | $-(CH_2)_3CO_2C_2H_5$ | $t\text{-}C_4H_9$ | $C_2H_5$ | $C_2H_5$ |
| 10a | CN | CN | $-(CH_2)_3CO_2H$ | $t\text{-}C_4H_9$ | $C_2H_5$ | $C_2H_5$ |
| 11a | CN | CN | $-(CH_2)_3SO_3H$ | $t\text{-}C_4H_9$ | $C_2H_5$ | $C_2H_5$ |
| 12a | CN | CN | $-(CH_2)_4SO_3H$ | $t\text{-}C_4H_9$ | $C_2H_5$ | $C_2H_5$ |
| 13a | CN | CN | $-COCH_3$ | $t\text{-}C_4H_9$ | $C_2H_5$ | $C_2H_5$ |
| 14a | CN | CN | $-CON(CH_3)_2$ | $t\text{-}C_4H_9$ | $C_2H_5$ | $C_2H_5$ |
| 15a | CN | CN | $-CONH(CH_2)_2OC(O)C(CH_3){=}CH_2$ | $t\text{-}C_4H_9$ | $C_2H_5$ | $C_2H_5$ |
| 16a | CN | CN | $-C_6H_4(o\text{-}NO_2)$ | $t\text{-}C_4H_9$ | $C_2H_5$ | $C_2H_5$ |
| 17a | CN | CN | $C_2H_5$ | $C_6H_5$ | $C_2H_5$ | $C_2H_5$ |
| 18a | CN | CN | $n\text{-}C_3H_7$ | $C_6H_5$ | $C_2H_5$ | $C_2H_5$ |
| 19a | CN | CN | $n\text{-}C_8H_{17}$ | $C_6H_5$ | $C_2H_5$ | $C_2H_5$ |
| 20a | CN | CN | $-CH_2CH{=}CH_2$ | $C_6H_5$ | $C_2H_5$ | $C_2H_5$ |
| 21a | CN | CN | $-CH_2{-}C_6H_5$ | $C_6H_5$ | $C_2H_5$ | $C_2H_5$ |

-continued

| Exemplified Compound | R⁴¹ | R⁴² | R⁴³ | R⁴⁴ | R⁴⁵ | R⁴⁶ |
|---|---|---|---|---|---|---|
| 22a | CN | CN | —CH₂—C₆H₄—CH=CH₂ | C₆H₅ | C₂H₅ | C₂H₅ |
| 23a | CN | CN | —CH₂CO₂C₂H₅ | C₆H₅ | C₂H₅ | C₂H₅ |
| 24a | CN | CN | —CH(CH₃)CO₂C₂H₅ | C₆H₅ | C₂H₅ | C₂H₅ |
| 25a | CN | CN | —(CH₂)₃CO₂C₂H₅ | C₆H₅ | C₂H₅ | C₂H₅ |
| 26a | CN | CN | —(CH₂)₃CO₂H | C₆H₅ | C₂H₅ | C₂H₅ |
| 27a | CN | CN | —(CH₂)₃SO₃H | C₆H₅ | C₂H₅ | C₂H₅ |
| 28a | CN | CN | —(CH₂)₄SO₃H | C₆H₅ | C₂H₅ | C₂H₅ |
| 29a | CN | CN | —COCH₃ | C₆H₅ | C₂H₅ | C₂H₅ |
| 30a | CN | CN | —CON(CH₃)₂ | C₆H₅ | C₂H₅ | C₂H₅ |
| 31a | CN | CN | —CONH(CH₂)₂OC(=O)C(CH₃)=CH₂ | C₆H₅ | C₂H₅ | C₂H₅ |
| 32a | CN | CN | 2-O₂N-C₆H₄— | C₆H₅ | C₂H₅ | C₂H₅ |
| 33a | CN | CN | —CH₂CH=CH₂ | 2-CH₃-C₆H₄— | C₂H₅ | C₂H₅ |
| 34a | CN | CN | —CH₂C₆H₅ | 2-CH₃-C₆H₄— | C₂H₅ | C₂H₅ |
| 35a | CN | CN | —CH₂CH=CH₂ | 4-CH₃-C₆H₄— | C₂H₅ | C₂H₅ |
| 36a | CN | CN | —CH₂C₆H₅ | 4-CH₃-C₆H₄— | C₂H₅ | C₂H₅ |
| 37a | CN | CN | —CH₂C₆H₅ | 2,4,6-(CH₃)₃-C₆H₂— | C₂H₅ | C₂H₅ |
| 38a | CN | CN | —CH₂C₆H₅ | 4-CH₃O-C₆H₄— | C₂H₅ | C₂H₅ |
| 39a | CN | CN | —CH₂C₆H₅ | 2-Cl-C₆H₄— | C₂H₅ | C₂H₅ |
| 40a | CN | CN | —CH₂C₆H₅ | 2-naphthyl | C₂H₅ | C₂H₅ |
| 41a | CN | CN | —CH₂C₆H₅ | 2-pyridyl | C₂H₅ | C₂H₅ |

-continued

| Exemplified Compound | $R^{41}$ | $R^{42}$ | $R^{43}$ | $R^{44}$ | $R^{45}$ | $R^{46}$ |
|---|---|---|---|---|---|---|
| 42a | CN | CN | —CH$_2$—C$_6$H$_5$ | 3-pyridyl | C$_2$H$_5$ | C$_2$H$_5$ |
| 43a | CN | CN | —CH$_2$—C$_6$H$_5$ | 4-pyridyl | C$_2$H$_5$ | C$_2$H$_5$ |
| 44a | CN | CN | —CH$_2$—C$_6$H$_5$ | 2-thienyl | C$_2$H$_5$ | C$_2$H$_5$ |
| 45a | CO$_2$CH$_3$ | CN | —CH$_2$—C$_6$H$_5$ | t-C$_4$H$_9$ | C$_2$H$_5$ | C$_2$H$_5$ |
| 46a | CO$_2$CH$_3$ | CN | —CH$_2$—C$_6$H$_5$ | C$_6$H$_5$ | C$_2$H$_5$ | C$_2$H$_5$ |
| 47a | —C(=NH)—OCH$_3$ | CN | —CH$_2$—C$_6$H$_5$ | t-C$_4$H$_9$ | C$_2$H$_5$ | C$_2$H$_5$ |
| 48a | CN | CN | —CH$_2$—C$_6$H$_5$ | t-C$_4$H$_9$ | i-C$_3$H$_7$ | i-C$_3$H$_7$ |
| 49a | CN | CN | —CH$_2$—C$_6$H$_5$ | t-C$_4$H$_9$ | n-C$_6$H$_{13}$ | n-C$_6$H$_{13}$ |
| 50a | CN | CN | —CH$_2$—C$_6$H$_5$ | t-C$_4$H$_9$ | —CH$_2$CH=CH$_2$ | —CH$_2$CH=CH$_2$ |
| 51a | CN | CN | —CH$_2$—C$_6$H$_5$ | t-C$_4$H$_9$ | —CH$_2$CH$_2$OH | C$_2$H$_5$ |
| 52a | CN | CN | —CH$_2$—C$_6$H$_5$ | C$_6$H$_5$ | —CH$_2$CH$_2$OH | C$_2$H$_5$ |
| 53a | CN | CN | —CH$_2$—C$_6$H$_5$ | t-C$_4$H$_9$ | —CH$_2$CH$_2$OH | —CH$_2$CH$_2$OH |
| 54a | CN | CN | —CH$_2$—C$_6$H$_5$ | C$_6$H$_5$ | —CH$_2$CH$_2$OH | —CH$_2$CH$_2$OH |
| 55a | CN | CN | —CH$_2$—C$_6$H$_5$ | t-C$_4$H$_9$ | —CH$_2$—C$_6$H$_5$ | —CH$_2$—C$_6$H$_5$ |
| 56a | CN | CN | —CH$_2$—C$_6$H$_5$ | t-C$_4$H$_9$ | —CH$_2$CH$_2$CO$_2$H | C$_2$H$_5$ |
| 57a | CN | CN | —CH$_2$—C$_6$H$_5$ | t-C$_4$H$_9$ | —CH$_2$CH$_2$CO$_2$H | —CH$_2$CH$_2$CO$_2$H |
| 58a | CN | CN | —CH$_2$—C$_6$H$_4$—CH=CH$_2$ | C$_6$H$_5$ | —CH$_2$CH$_2$CO$_2$H | C$_2$H$_5$ |
| 59a | CN | CN | —CH$_2$—C$_6$H$_5$ | C$_6$H$_5$ | —CH$_2$CH$_2$CO$_2$H | —CH$_2$CH$_2$CO$_2$H |
| 60a | CN | CN | —CH$_2$—C$_6$H$_5$ | t-C$_4$H$_9$ | —(CH$_2$)$_2$O—C(=O)—CH$_2$CH$_2$CO$_2$H | C$_2$H$_5$ |

-continued

| Exemplified Compound | $R^{41}$ | $R^{42}$ | $R^{43}$ | $R^{44}$ | $R^{45}$ | $R^{46}$ |
|---|---|---|---|---|---|---|
| 61a | CN | CN | —CH$_2$—C$_6$H$_5$ | C$_6$H$_5$ | —(CH$_2$)$_2$O—C(=O)—CH$_2$CH$_2$—CO$_2$H | C$_2$H$_5$ |
| 62a | CN | CN | —CH$_2$—C$_6$H$_5$ | t-C$_4$H$_9$ | —(CH$_2$)$_2$O—C(=O)—CH=CH$_2$ | C$_2$H$_5$ |
| 63a | CN | CN | —CH$_2$—C$_6$H$_5$ | C$_6$H$_5$ | —(CH$_2$)$_2$O—C(=O)—CH=CH$_2$ | C$_2$H$_5$ |
| 64a | CN | CN | —CH$_2$—C$_6$H$_5$ | t-C$_4$H$_9$ | —(CH$_2$)$_2$O—C(=O)—C(CH$_3$)=CH$_2$ | C$_2$H$_5$ |
| 65a | CN | CN | —CH$_2$—C$_6$H$_5$ | C$_6$H$_5$ | —(CH$_2$)$_2$O—C(=O)—C(CH$_3$)=CH$_2$ | C$_2$H$_5$ |
| 66a | CN | CN | —CH$_2$—C$_6$H$_5$ | C$_6$H$_5$ | —(CH$_2$)$_2$O—CH$_3$ | —(CH$_2$)$_2$O—CH$_3$ |
| 67a | CN | CN | —CH$_2$—C$_6$H$_5$ | C$_6$H$_5$ | —(CH$_2$)$_2$O—C$_2$H$_5$ | —(CH$_2$)$_2$O—C$_2$H$_5$ |
| 68a | CN | CN | —CH$_2$—C$_6$H$_5$ | C$_6$H$_5$ | —S(=O)$_2$—CH$_3$ | H |
| 69a | CN | CN | —CH$_2$—C$_6$H$_5$ | C$_6$H$_5$ | —C(=O)—CH$_3$ | H |
| 70a | CN | CN | —CH$_2$—C$_6$H$_5$ | t-C$_4$H$_9$ | —C(=O)—CH$_3$ | H |

| Exemplified Compound | $R^{51}$ | $R^{52}$ | $R^{54}$ | $R^{55}$ | $R^{56}$ | $L^1$ |
|---|---|---|---|---|---|---|
| 71a | CN | CN | t-C$_4$H$_9$ | C$_2$H$_5$ | C$_2$H$_5$ | —(CH$_2$)$_3$— |
| 72a | CN | CN | t-C$_4$H$_9$ | C$_2$H$_5$ | C$_2$H$_5$ | —(CH$_2$)$_4$— |
| 73a | CN | CN | t-C$_4$H$_9$ | C$_2$H$_5$ | C$_2$H$_5$ | —(CH$_2$)$_8$— |
| 74a | CN | CN | t-C$_4$H$_9$ | C$_2$H$_5$ | C$_2$H$_5$ | —CH$_2$CH$_2$OCH$_2$CH$_2$— |
| 75a | CN | CN | t-C$_4$H$_9$ | C$_2$H$_5$ | C$_2$H$_5$ | —CH$_2$—(1,4-C$_6$H$_4$)—CH$_2$— |
| 76a | CN | CN | t-C$_4$H$_9$ | C$_2$H$_5$ | C$_2$H$_5$ | —CH$_2$—(1,3-C$_6$H$_4$)—CH$_2$— |
| 77a | CN | CN | t-C$_4$H$_9$ | C$_2$H$_5$ | C$_2$H$_5$ | —CH$_2$—(1,2-C$_6$H$_4$)—CH$_2$— |
| 78a | CN | CN | C$_6$H$_5$ | C$_2$H$_5$ | C$_2$H$_5$ | —(CH$_2$)$_3$— |
| 79a | CN | CN | C$_6$H$_5$ | C$_2$H$_5$ | C$_2$H$_5$ | —(CH$_2$)$_8$— |
| 80a | CN | CN | C$_6$H$_5$ | C$_2$H$_5$ | C$_2$H$_5$ | —CH$_2$CH$_2$OCH$_2$CH$_2$— |

-continued
| Exemplified Compound | R⁵¹ | R⁵² | R⁵⁴ | R⁵⁵ | R⁵⁶ | L¹ |
|---|---|---|---|---|---|---|
| 81a | CN | CN | $C_6H_5$ | $C_2H_5$ | $C_2H_5$ | 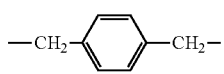 |
| 82a | CN | CN | $C_6H_5$ | $C_2H_5$ | $C_2H_5$ | 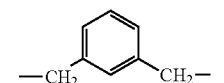 |
| 83a | CN | CN | $C_6H_5$ | $C_2H_5$ | $C_2H_5$ | 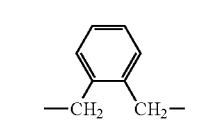 |
| 84a | CN | CN | 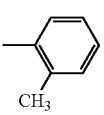 | $C_2H_5$ | $C_2H_5$ | 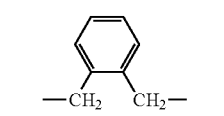 |
| 85a | CN | CN |  | $C_2H_5$ | $C_2H_5$ | 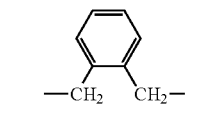 |
| 86a | CN | CN |  | $C_6H_5$ | $C_2H_5$ | 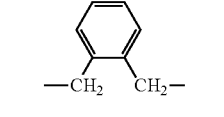 |
| 87a | CN | CN |  | $C_2H_5$ | $C_2H_5$ | 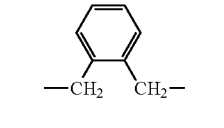 |
| 88a | CN | CN |  | $C_2H_5$ | $C_2H_5$ | 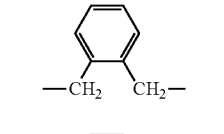 |
| 89a | CN | CN | $t-C_4H_9$ | $i-C_3H_7$ | $i-C_3H_7$ | 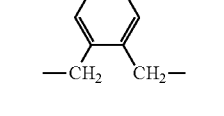 |
| 90a | CN | CN | $t-C_4H_9$ | $n-C_6H_{13}$ | $n-C_6H_{13}$ | 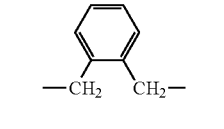 |
| 91a | CN | CN | $t-C_4H_9$ | —$CH_2CH=CH_2$ | —$CH_2CH=CH_2$ | 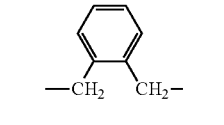 |
| 92a | CN | CN | $t-C_4H_9$ | —$CH_2CH_2OH$ | $C_2H_5$ | 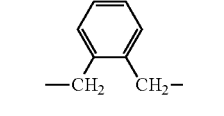 |
| 93a | CN | CN | $t-C_4H_9$ | —$CH_2CH_2OH$ | —$CH_2CH_2OH$ | 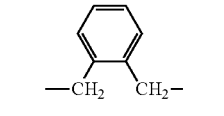 |

-continued

| Exemplified Compound | $R^{51}$ | $R^{52}$ | $R^{54}$ | $R^{55}$ | $R^{56}$ | $L^1$ |
|---|---|---|---|---|---|---|
| 94a | CN | CN | t-$C_4H_9$ | —$CH_2$—$C_6H_5$ | —$CH_2$—$C_6H_5$ | o-$C_6H_4(CH_2—)_2$ |
| 95a | CN | CN | t-$C_4H_9$ | —$CH_2CH_2CO_2H$ | $C_2H_5$ | o-$C_6H_4(CH_2—)_2$ |
| 96a | CN | CN | t-$C_4H_9$ | —$CH_2CH_2CO_2H$ | —$CH_2CH_2CO_2H$ | o-$C_6H_4(CH_2—)_2$ |
| 97a | CN | CN | t-$C_4H_9$ | —$(CH_2)_2$—O—C(=O)—$CH_2CH_2$—$CO_2H$ | $C_2H_5$ | o-$C_6H_4(CH_2—)_2$ |
| 98a | CN | CN | t-$C_4H_9$ | —$(CH_2)_2$—O—C(=O)—CH=$CH_2$ | $C_2H_5$ | o-$C_6H_4(CH_2—)_2$ |
| 99a | CN | CN | t-$C_4H_9$ | —$(CH_2)_2$—O—C(=O)—C($CH_3$)=$CH_2$ | $C_2H_5$ | o-$C_6H_4(CH_2—)_2$ |
| 100a | CN | CN | t-$C_4H_9$ | —$(CH_2)_2$O—$CH_3$ | —$(CH_2)_2$O—$CH_3$ | o-$C_6H_4(CH_2—)_2$ |
| 101a | CN | CN | t-$C_4H_9$ | —$(CH_2)_2$O—$C_2H_5$ | —$(CH_2)_2$O—$C_2H_5$ | o-$C_6H_4(CH_2—)_2$ |
| 102a | CN | CN | $C_6H_5$ | i-$C_3H_7$ | i-$C_3H_7$ | o-$C_6H_4(CH_2—)_2$ |
| 103a | CN | CN | $C_6H_5$ | n-$C_6H_{13}$ | n-$C_6H_{13}$ | o-$C_6H_4(CH_2—)_2$ |
| 104a | CN | CN | $C_6H_5$ | —$CH_2CH$=$CH_2$ | —$CH_2CH$=$CH_2$ | o-$C_6H_4(CH_2—)_2$ |
| 105a | CN | CN | $C_6H_5$ | —$CH_2CH_2OH$ | $C_2H_5$ | o-$C_6H_4(CH_2—)_2$ |
| 106a | CN | CN | $C_6H_5$ | —$CH_2CH_2OH$ | —$CH_2CH_2OH$ | o-$C_6H_4(CH_2—)_2$ |

-continued

| Exemplified Compound | $R^{51}$ | $R^{52}$ | $R^{54}$ | $R^{55}$ | $R^{56}$ | $L^1$ |
|---|---|---|---|---|---|---|
| 107a | CN | CN | $C_6H_5$ | $-CH_2-C_6H_5$ | $-CH_2-C_6H_5$ | o-xylylene ($-CH_2-C_6H_4-CH_2-$) |
| 108a | CN | CN | $C_6H_5$ | $-CH_2CH_2CO_2H$ | $C_2H_5$ | o-xylylene |
| 109a | CN | CN | $C_6H_5$ | $-CH_2CH_2CO_2H$ | $-CH_2CH_2CO_2H$ | o-xylylene |
| 110a | CN | CN | $C_6H_5$ | $-(CH_2)_2O-C(=O)-CH_2CH_2-CO_2H$ | $C_2H_5$ | o-xylylene |
| 111a | CN | CN | $C_6H_5$ | $-(CH_2)_2O-C(=O)-CH=CH_2$ | $C_2H_5$ | o-xylylene |
| 112a | CN | CN | $C_6H_5$ | $-(CH_2)_2O-C(=O)-C(CH_3)=CH_2$ | $C_2H_5$ | o-xylylene |
| 113a | CN | CN | $C_6H_5$ | $-(CH_2)_2O-CH_3$ | $-(CH_2)_2O-CH_3$ | o-xylylene |
| 114a | CN | CN | $C_6H_5$ | $-(CH_2)_2O-C_2H_5$ | $-(CH_2)_2O-C_2H_5$ | o-xylylene |

| Exemplified Compound | Structural Formula |
|---|---|
| 115a | 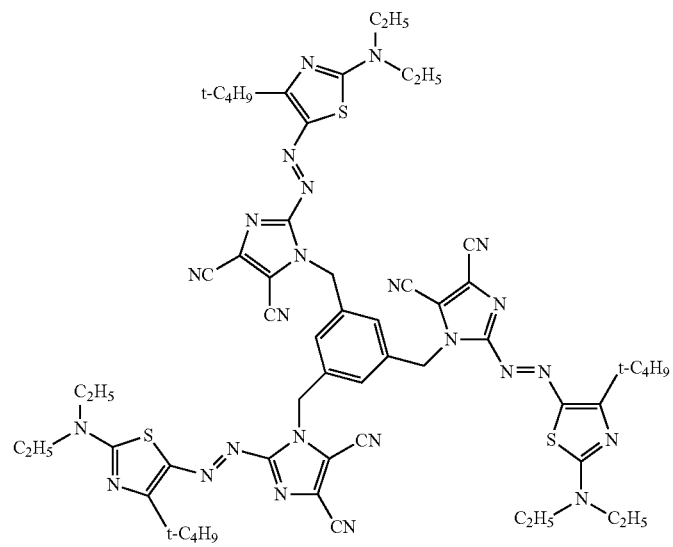 |
| 116a | 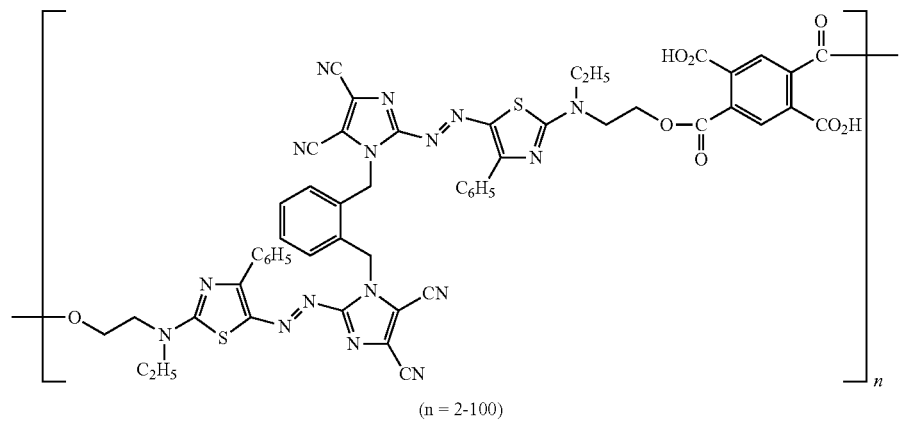 (n = 2-100) |
| 117a | 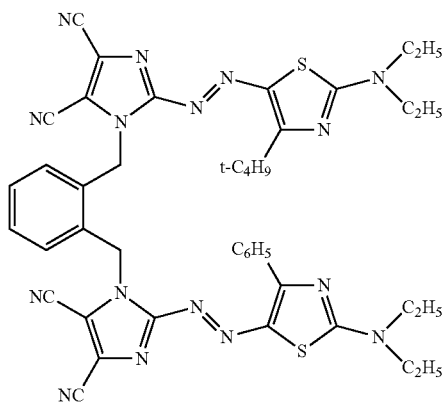 |

-continued

| Exemplified Compound | Structural Formula |
|---|---|
| 118a | (structure shown) |

| Exemplified Compound | $R^{41}$ | $R^{42}$ | $R^{43}$ | $R^{44}$ | $R^{45}$ | $R^{46}$ |
|---|---|---|---|---|---|---|
| 119a | $CO_2CH_3$ | $CO_2CH_3$ | $-CH_2-C_6H_5$ | $t-C_4H_9$ | $C_2H_5$ | $C_2H_5$ |
| 120a | $CO_2C_2H_5$ | $CO_2C_2H_5$ | $-CH_2-C_6H_5$ | $t-C_4H_9$ | $C_2H_5$ | $C_2H_5$ |
| 121a | $CONH_2$ | $CONH_2$ | $-CH_2-C_6H_5$ | $t-C_4H_9$ | $C_2H_5$ | $C_2H_5$ |
| 122a | $CO_2C_2H_5$ | CN | $-CH_2-C_6H_5$ | $t-C_4H_9$ | $C_2H_5$ | $C_2H_5$ |
| 123a | $C_6H_5$ | H | $-CH_2-C_6H_5$ | $t-C_4H_9$ | $C_2H_5$ | $C_2H_5$ |
| 124a | $C_6H_5$ | H | $-CH_2-C_6H_5$ | $t-C_4H_9$ | $C_2H_5$ | $C_2H_5$ |
| 125a | $C_6H_5$ | $C_6H_5$ | $-CH_2-C_6H_5$ | $t-C_4H_9$ | $C_2H_5$ | $C_2H_5$ |
| 126a | $CH_2CO_2H$ | H | $-CH_2-C_6H_5$ | $t-C_4H_9$ | $C_2H_5$ | $C_2H_5$ |

A and B of the following Exemplified Compounds (P1a) to (P100a) represent repeating units (A-1) to (A-20) and (B-1) to (B-27) of the following structures.

The following Exemplified Compounds (P1a) to (P100a) have a number average molecular weight (Mn) of 5,000 to 25,000, a weight average molecular weight (Mw) of 6,000 to 30,000, and a molecular weight distribution index (Mw/Mn) of 1.30 to 2.50.
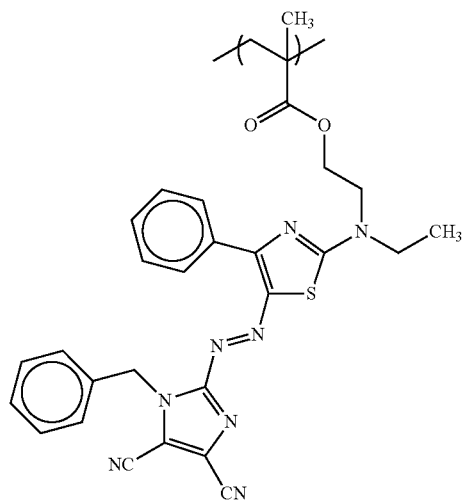
(A-1)
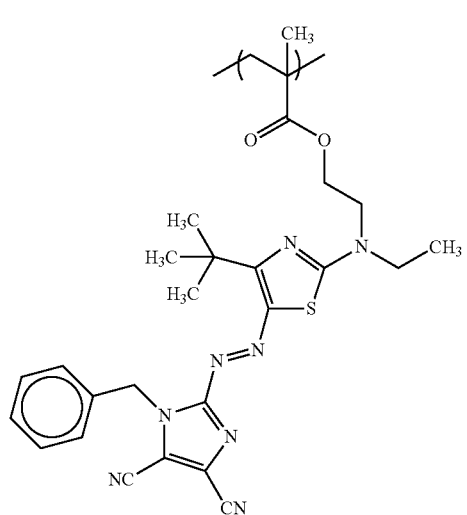
(A-2)
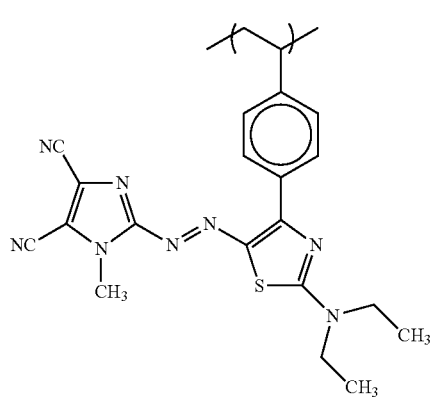
(A-3)
-continued
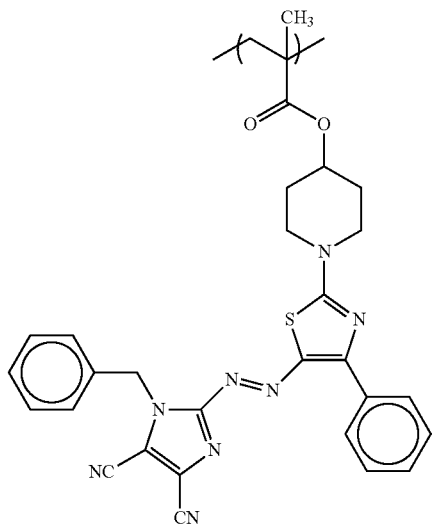
(A-4)
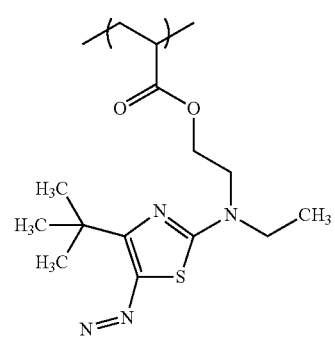
(A-5)
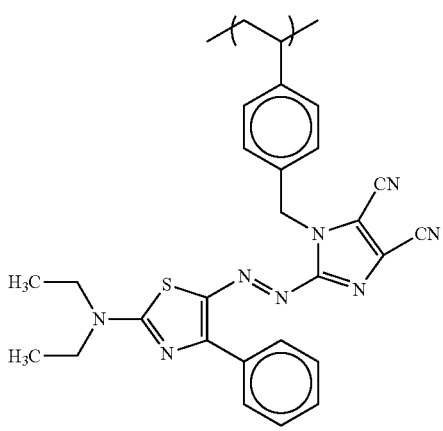
(A-6)

-continued
(A-7)
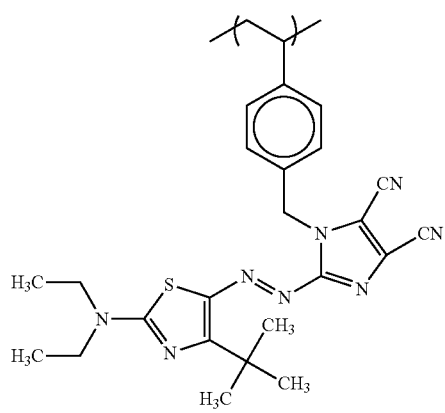
(A-10)
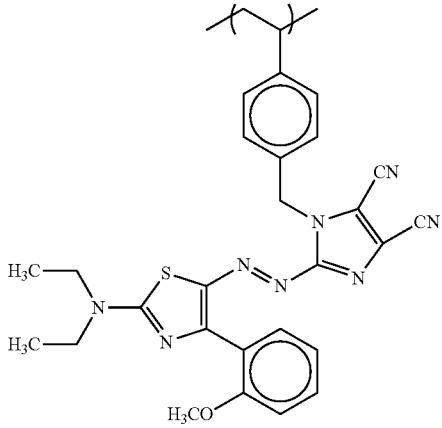
(A-8)
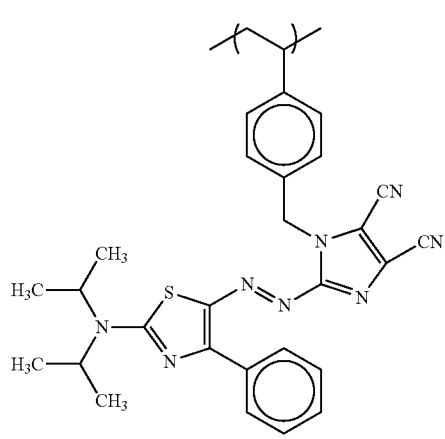
(A-11)
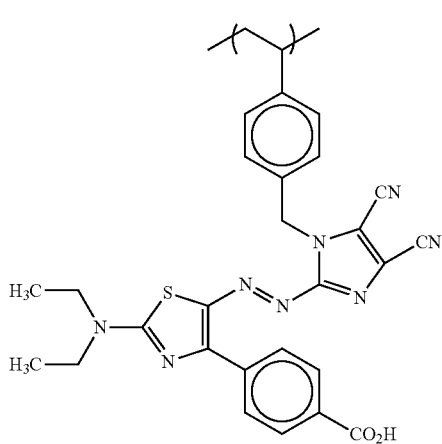
(A-9)
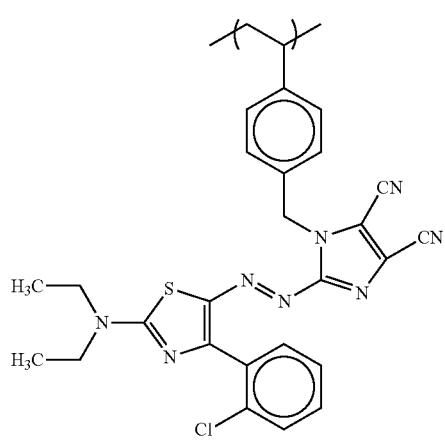
(A-12)
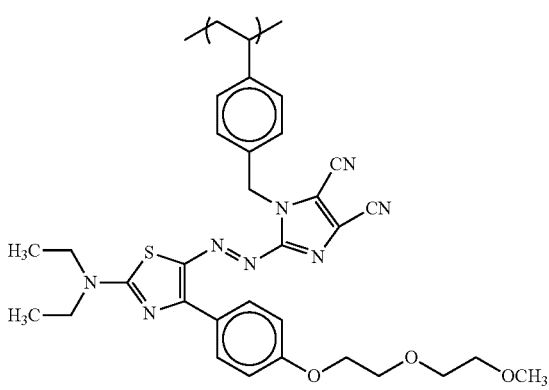

(A-13)
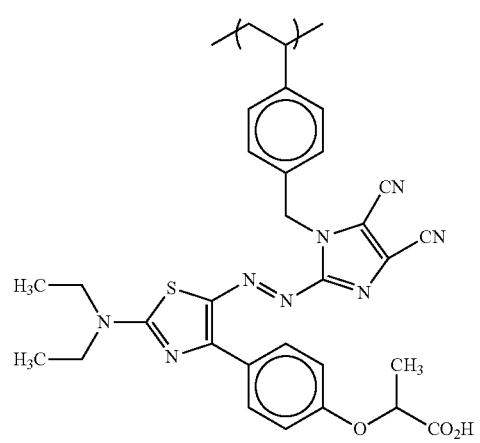
(A-14)
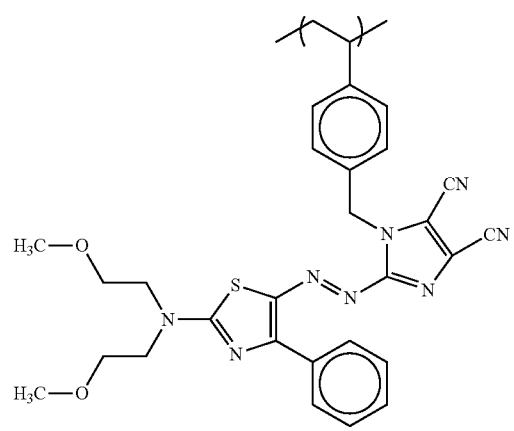
(A-15)
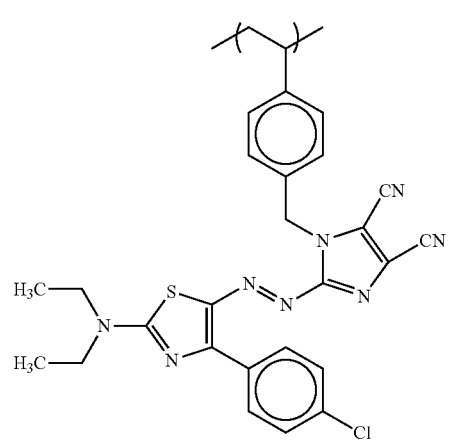
(A-16)
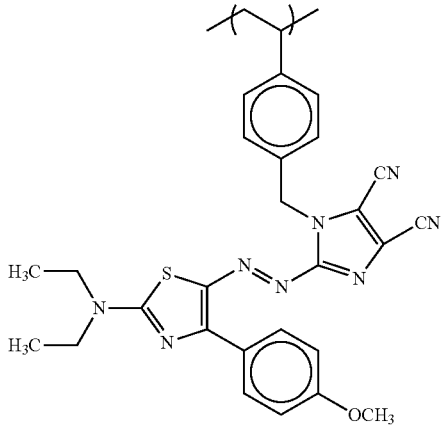
(A-17)
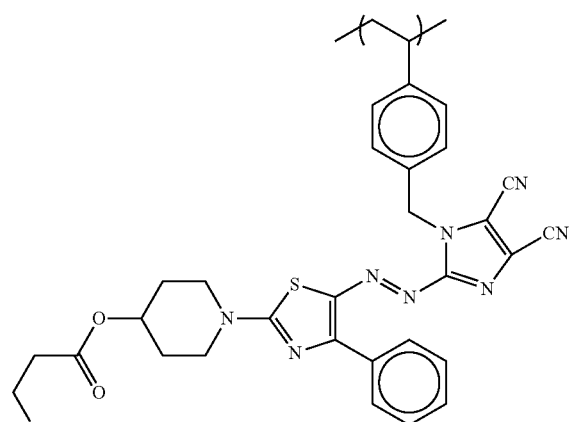
(A-18)
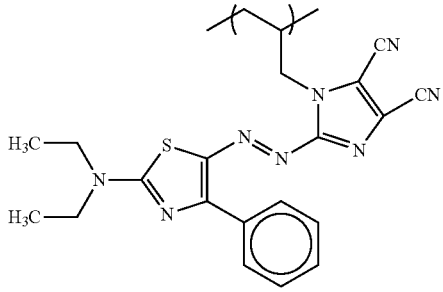
(A-19)
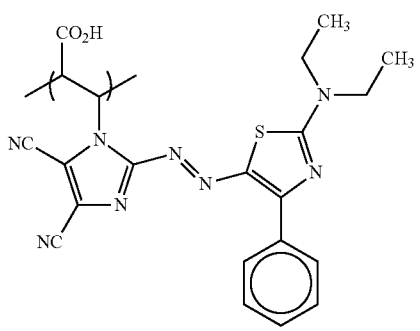

(A-20)
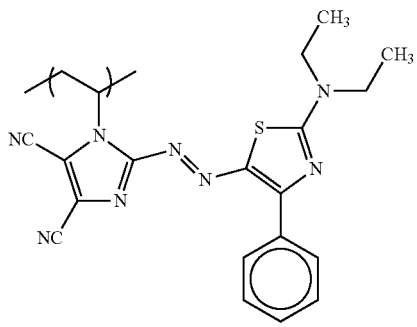
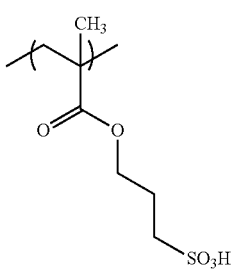
(B-1)
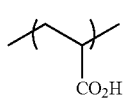
(B-2)
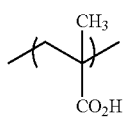
(B-3)
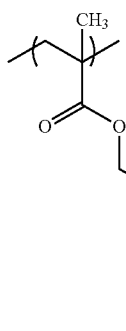
(B-4)
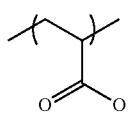
(B-5)
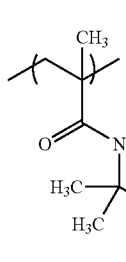
(B-6)
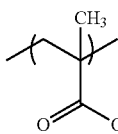
(B-7)
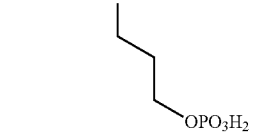
(B-8)
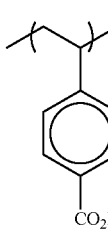
(B-9)
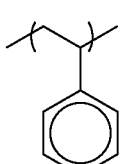
(B-10)
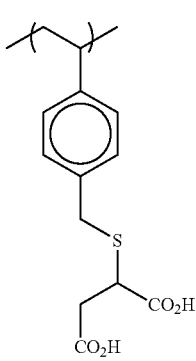
(B-11)
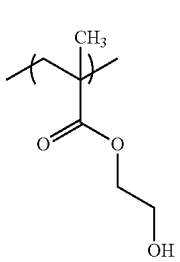

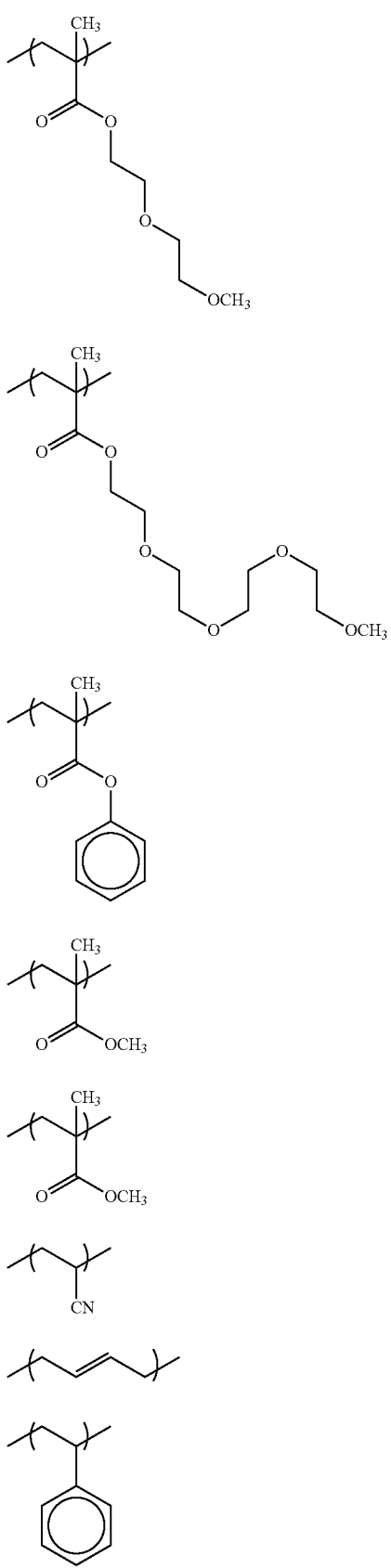
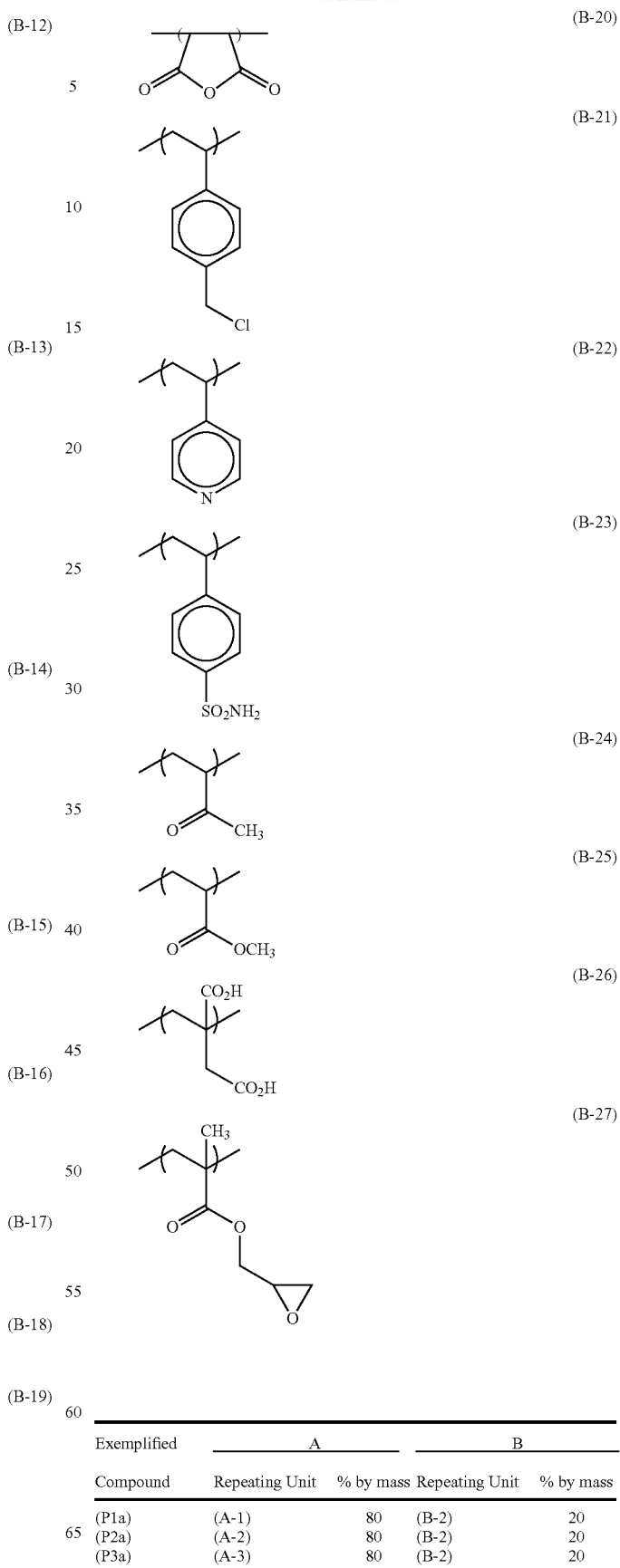
| Exemplified Compound | A Repeating Unit | % by mass | B Repeating Unit | % by mass |
|---|---|---|---|---|
| (P1a) | (A-1) | 80 | (B-2) | 20 |
| (P2a) | (A-2) | 80 | (B-2) | 20 |
| (P3a) | (A-3) | 80 | (B-2) | 20 |

-continued

| Exemplified Compound | A Repeating Unit | % by mass | B Repeating Unit | % by mass |
|---|---|---|---|---|
| (P4a) | (A-4) | 80 | (B-2) | 20 |
| (P5a) | (A-5) | 80 | (B-2) | 20 |
| (P6a) | (A-6) | 80 | (B-2) | 20 |
| (P7a) | (A-7) | 80 | (B-2) | 20 |
| (P8a) | (A-8) | 80 | (B-2) | 20 |
| (P9a) | (A-9) | 80 | (B-2) | 20 |
| (P10a) | (A-10) | 80 | (B-2) | 20 |
| (P11a) | (A-11) | 80 | (B-2) | 20 |
| (P12a) | (A-12) | 80 | (B-2) | 20 |
| (P13a) | (A-13) | 80 | (B-2) | 20 |
| (P14a) | (A-14) | 80 | (B-2) | 20 |
| (P15a) | (A-15) | 80 | (B-2) | 20 |
| (P16a) | (A-16) | 80 | (B-2) | 20 |
| (P17a) | (A-17) | 80 | (B-2) | 20 |
| (P18a) | (A-18) | 80 | (B-2) | 20 |
| (P19a) | (A-19) | 80 | (B-2) | 20 |
| (P20a) | (A-20) | 80 | (B-2) | 20 |
| (P21a) | (A-1) | 85 | (B-2) | 15 |
| (P22a) | (A-1) | 70 | (B-2) | 30 |
| (P23a) | (A-1) | 60 | (B-2) | 40 |
| (P24a) | (A-1) | 90 | (B-2) | 10 |
| (P25a) | (A-1) | 83 | (B-2) | 17 |
| (P26a) | (A-6) | 85 | (B-2) | 15 |
| (P27a) | (A-6) | 75 | (B-2) | 25 |
| (P28a) | (A-6) | 70 | (B-2) | 30 |
| (P29a) | (A-6) | 65 | (B-2) | 35 |
| (P30a) | (A-6) | 60 | (B-2) | 40 |
| (P31a) | (A-6) | 90 | (B-3) | 10 |
| (P32a) | (A-6) | 85 | (B-3) | 15 |
| (P33a) | (A-6) | 75 | (B-3) | 25 |
| (P34a) | (A-6) | 70 | (B-3) | 30 |
| (P35a) | (A-6) | 65 | (B-3) | 35 |
| (P36a) | (A-6) | 80 | (B-4) | 20 |
| (P37a) | (A-6) | 75 | (B-5) | 25 |
| (P38a) | (A-6) | 70 | (B-6) | 30 |
| (P39a) | (A-6) | 78 | (B-7) | 22 |
| (P40a) | (A-6) | 60 | (B-8) | 40 |
| (P41a) | (A-6) | 80 | (B-9) | 20 |
| (P42a) | (A-6) | 75 | (B-10) | 25 |
| (P43a) | (A-6) | 85 | (B-11) | 15 |
| (P44a) | (A-6) | 80 | (B-12) | 20 |
| (P45a) | (A-6) | 90 | (B-13) | 10 |
| (P46a) | (A-6) | 95 | (B-14) | 5 |
| (P47a) | (A-6) | 75 | (B-15) | 25 |
| (P48a) | (A-6) | 80 | (B-16) | 20 |
| (P49a) | (A-6) | 80 | (B-17) | 20 |
| (P50a) | (A-6) | 80 | (B-18) | 20 |
| (P51a) | (A-2) | 82 | (B-2) | 18 |
| (P52a) | (A-3) | 81 | (B-10) | 19 |
| (P53a) | (A-4) | 75 | (B-15) | 25 |
| (P54a) | (A-5) | 89 | (B-3) | 11 |
| (P55a) | (A-5) | 70 | (B-20) | 30 |
| (P56a) | (A-6) | 68 | (B-19) | 32 |
| (P57a) | (A-7) | 50 | (B-4) | 50 |
| (P58a) | (A-8) | 80 | (B-5) | 20 |
| (P59a) | (A-9) | 85 | (B-16) | 15 |
| (P60a) | (A-10) | 82 | (B-7) | 18 |
| (P61a) | (A-11) | 90 | (B-10) | 10 |
| (P62a) | (A-12) | 95 | (B-10) | 5 |
| (P63a) | (A-13) | 98 | (B-20) | 2 |
| (P64a) | (A-14) | 55 | (B-11) | 45 |
| (P65a) | (A-15) | 65 | (B-4) | 35 |
| (P66a) | (A-16) | 83 | (B-5) | 17 |
| (P67a) | (A-17) | 83 | (B-13) | 17 |
| (P68a) | (A-18) | 83 | (B-12) | 17 |
| (P69a) | (A-18) | 83 | (B-9) | 17 |
| (P70a) | (A-18) | 90 | (B-1) | 10 |
| (P71a) | (A-18) | 90 | (B-8) | 10 |
| (P72a) | (A-18) | 90 | (B-6) | 10 |
| (P73a) | (A-19) | 90 | (B-4) | 10 |
| (P74a) | (A-19) | 85 | (B-6) | 15 |
| (P75a) | (A-20) | 85 | (B-3) | 15 |
| (P76a) | (A-1) | 100 | — | — |
| (P77a) | (A-2) | 100 | — | — |
| (P78a) | (A-3) | 100 | — | — |
| (P79a) | (A-4) | 100 | — | — |
| (P80a) | (A-5) | 100 | — | — |
| (P81a) | (A-6) | 100 | — | — |
| (P82a) | (A-7) | 100 | — | — |
| (P83a) | (A-8) | 100 | — | — |
| (P84a) | (A-9) | 100 | — | — |
| (P85a) | (A-10) | 100 | — | — |
| (P86a) | (A-11) | 100 | — | — |
| (P87a) | (A-12) | 100 | — | — |
| (P88a) | (A-13) | 100 | — | — |
| (P89a) | (A-14) | 100 | — | — |
| (P90a) | (A-15) | 100 | — | — |
| (P91a) | (A-16) | 100 | — | — |
| (P92a) | (A-17) | 100 | — | — |
| (P93a) | (A-18) | 100 | — | — |
| (P94a) | (A-19) | 100 | — | — |
| (P95a) | (A-20) | 100 | — | — |
| (P96a) | (A-21) | 100 | — | — |
| (P97a) | (A-22) | 100 | — | — |
| (P98a) | (A-23) | 100 | — | — |
| (P99a) | (A-24) | 100 | — | — |
| (P100a) | (A-25) | 100 | — | — |

These azo colorant compounds can be easily synthesized according to the method described in U.S. Pat. No. 5,789,560, etc. That is, the azo colorant compound represented by Formula (1a) or (2) in the present invention can be synthesized by the commonly used diazocoupling, followed by alkylation using an alkylating agent.

Specifically, a 2-amino imidazole derivative represented by Formula (A) is converted into a diazonium salt of Formula (B) using a diazotizing agent, the resulting diazonium salt and a 2-aminothiazole derivative represented by Formula (C) are subjected to a coupling reaction to obtain a compound represented by Formula (D). Then, the compound of Formula (D) is alkylated with a compound of Formula (E) or the like, under basic conditions. In this way, a desired compound can easily be synthesized. Specifically, synthesis of the compound will be illustrated by way of examples.

Further, the compound containing at least one repeating unit represented by Formula (Pa) can be synthesized by polymerization of the azo colorant compound represented by Formula (1a) using a conventional method.

(A)

$$\begin{array}{c} R^1 \\ \\ R^2 \end{array} \begin{array}{c} N \\ \\ N \\ H \end{array} -NH_2$$

In Formula (A), $R^1$ and $R^2$ each independently represent a hydrogen atom or a monovalent substituent. Further, $R^1$ and $R^2$ may bond to each other to form a ring.

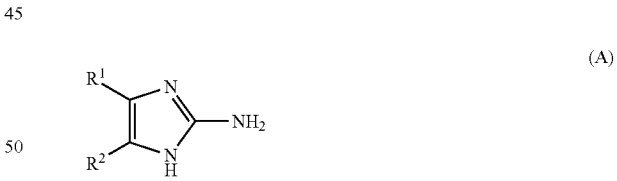

(B)

In Formula (B), $R^1$ and $R^2$ have the same definitions as $R^1$ and $R^2$ in Formula (A), respectively. $X^-$ represents a counter anion of a diazonium salt.

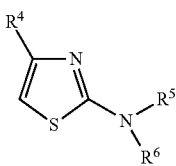

(C)

In Formula (C), $R^4$, $R^5$, and $R^6$ each independently represent a hydrogen atom or a monovalent substituent.

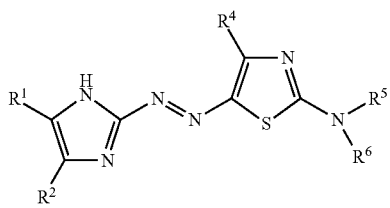

(D)

In Formula (D), $R^1$, $R^2$, $R^4$, $R^5$, and $R^6$ have the same definitions as $R^1$, $R^2$, $R^4$, $R^5$, and $R^6$ in Formulae (A) to (C), respectively.

(E)

In Formula (E), $R^3$ represents a monovalent substituent, and Y represents a leaving group (for example, a halogen atom, a tosyl group, etc.).

A number of the compounds represented by Formula (A) are commercially available (for example, catalogue number A1292, etc., manufactured by Tokyo Chemical Industry Co., Ltd.). The compound represented by Formula (C) can be synthesized by a conventional known method (for example, J. Chem. Soc. Perkin Trans. 1 (1984), vol. 2, pp 147-153, etc.). A number of the compounds represented by Formula (E) are commercially available (for example, catalogue number B0411, etc., manufactured by Tokyo Chemical Industry Co., Ltd.).

Although a total concentration of the specific azo colorant compound represented by Formula (1a) in the colored curable composition varies depending on the molecular weight and molar absorption coefficient, the concentration is preferably in the range of 0.5 to 80% by mass based on the total solid content of the composition, more preferably 0.5 to 70% by mass, and particularly preferably 1 to 70% by mass.

In the colored curable composition of the present invention, the specific azo colorant compound and a colorant having another structure may be used in combination. There is no particular limitation to the colorant having another structure, and a known colorant conventionally used for a color filter can be used. For example, there are colorants described in JP-A No. 2002-14220, JP-A No. 2002-14221, JP-A No. 2002-14222, JP-A No. 2002-14223, U.S. Pat. No. 5,667,920, U.S. Pat. No. 5,059,500, etc.

As the chemical structures, pyrazole azo dyes, anilino azo dyes, triphenylmethane dyes, anthraquinone dyes, anthrapyridone dyes, benzylidene dyes, oxonol dyes, pyrazolotriazole azo dyes, pyridone azo dyes, cyanine dyes, phenothiazine dyes, pyrrolopyrazole azomethine dyes, xanthene dyes, phthalocyanine dyes, benzopyran dyes, indigo dyes or the like may be used.

<Colored Curable Composition>

Hereinafter, a colored curable composition of the present invention will be described.

The colored curable composition of the present invention contains at least one above-mentioned specific azo colorant compound and a polymerizable compound. The polymerizable compound is polymerized or crosslinked by exposure to UV light of 400 nm or less or by heat, thereby insolubilizing the colored curable composition in an alkaline developer solution. As a result, in a photolithographic method, the exposed part and the unexposed part are distinguished to form a pattern.

Further, in an ink-jet method, cured colored pixels can be obtained.

In order to further increase a curing reaction rate, the colored curable composition preferably contains a radical or acid-generating polymerization initiator. Where pixels are formed by a photolithographic method, such an initiator is essential. When pixels are formed by an ink-jet method, curing may also be carried out by heat, so a polymerization initiator is not essential, but it is preferred to use the initiator in the colored curable composition.

Further, the colored curable composition may contain a binder, a surfactant, and other additives.

<Polymerizable Compound>

The polymerizable compound may be a compound having a boiling point of 100° C. or higher at a normal pressure and having at least one addition-polymerizable ethylenically unsaturated group. Preferred is a compound having two or more ethylenically unsaturated groups, and still more preferred is a compound having three or more ethylenically unsaturated groups. Examples thereof include compounds described in paragraphs [0254] to [0257] of JP-A No. 2008-292970, paragraphs [0054] to [0068] of JP-A No. 2009-13206, and the like. One or more selected from a (meth)acrylic monomer, an epoxy monomer, and an oxetanyl monomer are preferably contained.

In particular, preferred is an acrylic compound having three or more acryloyl groups in a molecule thereof. Examples of such an acrylic compound include trimethylolethane tri(meth)acrylate, pentaerythritol tri(meth)acrylate, pentaerythritol tetra(meth)acrylate, dipentaerythritol hexa(meth)acrylate, trimethylolpropane tri(acryloyloxypropyl)ether, tri(acryloyloxyethyl)isocyanurate, a compound obtained by adding ethylene oxide, propylene oxide or caprolactone to a polyfunctional alcohol such as glycerin or trimethylolethane followed by (meth)acrylating, a poly(meth)acrylated product of pentaerythritol or dipentaerythritol, and the like.

A content of the polymerizable compound in the colored curable composition is preferably in the range of 0.1% by mass to 90% by mass, based on the solid content of the colored curable composition, still more preferably 1.0% by mass to 80% by mass, and particularly preferably 2.0% by mass to 70% by mass.

Particularly when the composition is used as an ink-jet ink, a content of the polymerizable compound is preferably in the range of 30 to 80% by mass in the solid content of colored curable composition, and more preferably 40 to 80% by mass. When the amount of the polymerizable compound to be used is within the above-specified range, a pixel portion is sufficiently polymerized, so that the following effects, for example, are obtained: scars caused by lack of film strength of the pixel portion do not easily occur; cracks or reticulations do not easily occur upon applying a transparent electroconductive film; solvent resistance is improved at the time of formation of an orientation film; and the voltage holding ratio is not lowered.

Here, the solid content of the colored curable composition, which is used to determine the mixing ratio, includes all of the components except the solvent, and thus liquid polymerizable compound(s) and the like, if any, are also included in the solid content.

Hereinafter, a colored curable composition to be used in the photolithographic method will be described.

<Photopolymerization Initiator>

The colored curable composition of the present invention preferably contains a photopolymerization initiator.

Although there is no particular limitation to the photopolymerization initiator as long as it can polymerize a polymerizable compound, the photopolymerization initiator is preferably selected from the viewpoint of characteristics, initiation efficiency, absorption wavelength, availability, costs, and the like.

Examples of the photopolymerization initiator include compounds described in paragraphs [0260] to [0271] of JP-A No. 2008-292970.

A content of the photopolymerization initiator in the colored curable composition is preferably in the range of 0.01 to 50% by mass, based on the solid content of the polymerizable compound, more preferably 1 to 30% by mass, and particularly preferably 1 to 20% by mass. If a content of the photopolymerization initiator is within the above-specified range, polymerization proceeds satisfactorily, and favorable film strength can be achieved.

<Binder>

Further, the colored curable composition preferably contains a binder other than the compound containing at least one repeating unit represented by Formula (Pa). Although there is no particular limitation to the binder as long as it is alkali-soluble, the binder is preferably selected from the viewpoint of heat resistance, developability, availability, and the like.

The alkali-soluble binder is preferably a linear organic high-molecular weight polymer which is soluble in an organic solvent and is developable by a weak-alkali aqueous solution. The linear organic high-molecular weight polymer may be a polymer described in paragraphs [0227] to [0234] of JP-A No. 2008-292970.

A content of the binder in the colored curable composition is preferably in the range of 0.1% by mass to 50% by mass, based on the solid content of the colored curable composition, still more preferably 0.1% by mass to 40% by mass, and particularly preferably 0.1% by mass to 30% by mass.

<Crosslinking Agent>

A crosslinking agent may be preferably added to the colored curable composition. There is no particular limitation to the crosslinking agent, as long as it is capable of performing film curing through a crosslinking reaction. Examples of such a crosslinking agent include crosslinking agents described in paragraphs [0237] to [0253] of JP-A No. 2008-292970.

Where the colored curable composition contains a crosslinking agent, a content of the crosslinking agent is preferably in the range of 1 to 70% by mass based on the total solid content (mass) of the colored curable composition, more preferably 5 to 50% by mass, and particularly preferably 7 to 30% by mass. If a content of the crosslinking agent is within the above-specified range, a sufficient curing degree and dissolution property of the unexposed parts can be maintained. If a content of the crosslinking agent is insufficient, the curing degree of the exposed parts may be poor. On the other hand, if a content of the crosslinking agent is excessive, this may lead to a significant decrease in dissolution property of the unexposed parts.

<Solvent>

When preparing the colored curable composition of the present invention, the composition generally may contain a solvent. Basically, although there is no particular limitation to the solvent as long as it satisfies the solubility of respective components of the composition or the coatability of the colored curable composition, the solvent is preferably selected particularly taking into consideration solubility of the binder, coatability, and safety.

Examples of such a solvent include solvents described in paragraph [0272] of JP-A No. 2008-292970.

Among these solvents, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, propylene glycol methyl ether acetate, and the like are more preferred.

It is also preferable to mix two or more kinds of these organic solvents in view of the solubility of the ultraviolet absorbent and the alkali soluble resin, the improvement of the state of the surface to be coated, and the like. In this case, it is particularly preferable to use a mixture of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

<Polymerization Inhibitor>

In the colored curable composition of the invention, it is preferred that a small amount of a polymerization inhibitor be added in order to prevent unnecessary heat polymerization of the polymerizable compound during manufacture or storage of the colored curable composition.

Examples of the polymerization inhibitor useful in the invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butyl phenol), and N-nitrosophenylhydroxyamine cerous salt.

The addition amount of the polymerization inhibitor is preferably from about 0.01% to about 5% by mass with respect to the mass of the whole composition.

<Surfactant>

The colored curable composition of the invention may contain various surfactants from the viewpoint of improving the coatability. Examples of the surfactants which may be used in the invention include various surfactants such as a fluorine-containing surfactant, a nonionic surfactant, a cationic surfactant, an anionic surfactant, and a silicone-based surfactant.

In particular, when the colored curable composition of the invention contains a fluorine-containing surfactant, the liquid properties (in particular, fluidity) of the composition prepared as a coating liquid is improved, thereby enabling improvement in the uniformity of the coating thickness and the liquid saving.

That is, when a colored curable composition containing a fluorine-containing surfactant is used as a coating liquid to form a film, due to decrease in the surface tension between the surface to be coated and the coating liquid, the wettability on the surface to be coated is improved, so that the coatability on the surface to be coated is improved. As a result, even when a thin film of several micrometers is formed with a small amount of the liquid, a film with uniform thickness may be suitably formed.

The fluorine content in the fluorine-containing surfactant is preferably 3% by mass to 40% by mass, more preferably 5% by mass to 30% by mass, and particularly preferably 7% by mass to 25% by mass. A fluorine-containing surfactant having a fluorine content in this range is effective in the uniformity of the coating film thickness and the liquid saving, and has good solubility in the colored curable composition.

Examples of the fluorine-containing surfactant include MEGAFAC F171, F172, F173, F176, F177, F141, F142, F143, F144, R30, F437, F475, F479, F482, F780 and F781 (manufactured by DIC Corporation), FLUORAD FC430, FC431 and FC171 (manufactured by Sumitomo 3M Limited), SURFLON S-382, SC-101, SC-103, SC-104, SC-105, SC1068, SC-381, SC-383, S393 and KH-40 (manufactured by Asahi Glass Co., Ltd.), and SOLSPERSE 20000 (manufactured by Zeneca).

Examples of the nonionic surfactant include polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid ester (such as PLURONIC L10, L31, L61, L62, 10R5, 17R2 and 25R2, and TETRONIC 304, 701, 704, 901, 904 and 150R1, manufactured by BASF).

Examples of the cationic surfactant include a phthalocyanine derivative (trade name: EFKA-745, manufactured by Morishita & Co., Ltd.), an organosiloxane polymer (trade name: KP341, manufactured by Shin-Etsu Chemical Co., Ltd.), a (meth)acrylic acid based (co)polymer (trade names: POLYFLOW No. 75, No. 90, No. 95, manufactured by Kyoeisha Chemical Co., Ltd.), and W001 (trade name, manufactured by Yusho Co., Ltd.).

Examples of the anionic surfactant include W004, W005 and W017 (trade names, manufactured by Yusho Co., Ltd.).

Examples of the silicone-based surfactant include "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA", "TORAY SILICONE SH30PA" and "TORAY SILICONE SH8400" (trade names, manufactured by Dow Corning Toray Co., Ltd.), "TSF-4440", "TSF-4300", "TSF-4445", "TSF-4460" and "TSF-4452" (trade names, manufactured by Momentive Performance Materials Inc.), "KP341", "KF6001" and "KF6002" (trade names, manufactured by Shin-Etsu Chemical Co., Ltd.), and "BYK323" and "BYK330" (trade names, manufactured by BYK Chemie).

Only one surfactant may be used, or two or more surfactants may be used in combination.

<Various Additives>

The colored curable composition of the present invention may contain, if necessary, various additives, for example a filler, a high-molecular weight compound other than the above-mentioned one, a surfactant, an adhesion promoter, an antioxidant, an ultraviolet absorbent, an aggregation inhibitor, and the like. Examples of such additives include additives described in paragraphs [0274] to [0276] of JP-A No. 2008-292970.

<Preparation Method of Colored Curable Composition>

In connection with the preparation of the colored curable composition of the present invention, the aforementioned respective components of the composition may be mixed at the same time, or may be sequentially mixed after the respective components were dissolved in a solvent. Further, there is no particular limitation to the addition order or operation conditions associated with mixing of the components. All of the components may be simultaneously dissolved in a solvent to prepare a composition. Alternatively, if necessary, respective components may be appropriately dissolved to make two or more solutions, and when used (coated), these solutions may be mixed to prepare a composition.

The thus prepared composition may be preferably filtered through a filter having a pore diameter of 0.01 to 3.0 µm, and more preferably a pore diameter of 0.05 to 0.5 µm, and then used for desired applications.

The colored curable composition of the present invention can be suitably used in the formation of colored pixels of color filters or the like for use in liquid crystal displays (LCDs) or solid-state image pickup devices (for example, CCD, CMOS, etc.). In particular, the colored curable composition can be suitably used in the formation of color filters for solid-state image pickup devices such as CCD and CMOS.

The colored curable composition of the present invention is particularly suitable in forming a color filter for solid-state image pickup devices, in which a colored pattern is formed as a thin film with a minute size and in which a favorable rectangular cross-sectional profile is required.

Specifically, when a color filter-constituting pixel pattern size (a side length of the pixel pattern viewed from the substrate normal direction) is 2 µm or less (for example, 0.5 to 2.0 µm), a content of the coloring agent is increased, and line width sensitivity is deteriorated, thus resulting in narrowing of the DOF margin, which consequently tends to deteriorate the pattern formability. Such a tendency is pronounced particularly when a pixel pattern size is in the range of 1.0 to 1.7 µm (further, 1.2 to 1.5 µm). In addition, when it is a thin film having a thickness of 1 µm or less, the amount of components (other than coloring agents) contributing to photolithographic properties relatively decreases in the film, the amount of other components is further decreased due to the increase in the amount of coloring agents, and the sensitivity is lowered, whereby a pattern in a low-exposure dose region is liable to peel. In this case, when a heat treatment such as postbaking is applied, thermal sagging readily takes place. These phenomena are remarkable particularly when a film thickness is in the range of 0.005 µm to 0.9 µm (further, 0.1 µm to 0.7 µm).

On the other hand, when the colored curable composition of the present invention is used, it is possible to prepare a color filter which is excellent in pattern formability and has a favorable cross section profile even at the above-mentioned pixel pattern size of 2 µm or less.

<Pattern Formation Method Using Colored Curable Composition>

A method of forming a color filter by a photolithographic method using the colored curable composition of the present invention is characterized by including the processes of coating the colored curable composition on a substrate to form a colored layer, exposing the colored layer through a mask, and developing the colored layer after the exposure to form a pattern. Specifically, there may be used, for example, the method described in paragraphs [0277] to [0284] of JP-A No. 2008-292970.

—Post-Curing Process—

In the present invention, after the process of forming a pattern by development of the colored layer, a post-curing process for further curing the resulting pattern is preferably carried out.

The post-curing process, which is carried out by heating and/or exposure (UV irradiation), further cures the resulting pattern, and can prevent dissolution of a pattern in a process of forming a colored layer for the formation of the next-color pattern or other processes, and can improve the solvent resistance of pixels of the resulting color filter.

The post-curing process is preferably carried out by UV irradiation.

—Post-Curing Process (UV Irradiation)—

A UV irradiation process used in curing of the pattern by post-exposure irradiates ultraviolet light (UV light) to the pattern, which has undergone a development treatment in the pattern-forming process, in an irradiation dose [mJ/cm²] that is 10-fold or higher than the exposure dose [mJ/cm²] in the exposure treatment before the development treatment. By irradiation of UV light to the post-development pattern for a predetermined time between development treatment in the pattern-forming process and the heating treatment to be described hereinafter, it is possible to effectively prevent color transfer which may occur later when heated. If the irradiation dose in this process is less than 10 times the exposure dose upon exposure in the pattern-forming process, color transfer between the colored pixels or between the upper and lower layers may be not prevented.

Among them, an irradiation dose of UV light is preferably from 12-fold to 200-fold of the exposure dose upon exposure in the pattern-forming process, and more preferably from 15-fold to 100-fold.

Although the post-exposure may be carried out by g-rays, h-rays, i-rays, KrF, ArF, UV light, an electron beam, X-rays, or the like, preferred are g-rays, h-rays, i-rays, or UV light, and particularly preferred is UV light. When irradiation of UV light (UV curing) is carried out, it is preferably carried out at a low temperature from 20° C. to 50° C. (preferably from 25° C. to 40° C.). The wavelength of UV light preferably includes a wavelength ranging from 200 to 300 nm. For example, a high-pressure mercury lamp, a low-pressure mercury lamp or the like may be used as a light source. An irradiation time may be in the range of 10 to 180 seconds, preferably 20 to 120 seconds, and more preferably 30 to 60 seconds.

As a light source for irradiation of UV light, there may be used, for example, an ultra-high pressure mercury lamp, a high-pressure mercury lamp, a low-pressure mercury lamp, a DEEP UV lamp, or the like. Among them, it is preferred to irradiate light which contains light with a wavelength of 275 nm or less in the to-be-irradiated ultraviolet light and in which the irradiation illuminance [mW/cm²] of light with a wavelength of 275 nm or less is 5% or more relative to the integrated irradiation illuminance of the entire wavelength range in the ultraviolet light. By ensuring that the irradiation illuminance of light with a wavelength of 275 nm or less in the ultraviolet light is 5% or more, it is possible to effectively enhance the inhibitory effects against the color transfer between colored pixels or to the upper and lower layers, and the light resistance improving effects. In view of these facts, it is preferable to use a light source that is different from the light source such as i-rays used for exposure in the pattern-forming process, specific examples of which include a high-pressure mercury lamp, a low-pressure mercury lamp, or the like. Among them, upon considering the above-mentioned reasons, the irradiation illuminance of light with a wavelength of 275 nm or less is preferably 7% or more relative to the integrated irradiation illuminance of the entire wavelength range in the ultraviolet light. In addition, the upper limit of the irradiation illuminance of light with a wavelength of 275 nm or less is preferably 25% or less.

In addition, the term "integrated irradiation illuminance" refers to the sum (area) of the illuminance of light of each wavelength contained in the irradiation light when a curve is plotted wherein illuminance (radiation energy passing through a unit area per unit time; [mW/m²]) for each spectral wavelength is put on the ordinate and the wavelength [nm] of the light is put on the abscissa.

The integrated irradiation illuminance in the to-be-irradiated ultraviolet light in the UV irradiation process for post-exposure is preferably 200 mW/cm² or more. If the integrated irradiation illuminance is 200 mW/cm² or more, it is possible to effectively enhance the inhibitory effects against the color transfer between the colored pixels or toward the upper and lower layers and the light resistance improving effects. Among them, preferred is the range of 250 to 2000 mW/cm² and more preferred is the range of 300 to 1000 mW/cm².

Further, the post-heating is preferably carried out in a hot plate or oven at a temperature of 100° C. to 300° C., and more preferably 150° C. to 250° C. The post-heating time is preferably in the range of 30 seconds to 30000 seconds, and more preferably 60 seconds to 1000 seconds.

In the post-curing process, post-exposure and post-heating may be carried out in combination, and in this case, either of them may be carried out first, but the post-exposure is preferably carried out prior to the post-heating. This is to inhibit deformation of the shape due to thermal sagging or trailing of the pattern which may occur in the post-heating process, by accelerating the curing by post-exposure.

The thus obtained colored pattern constitutes pixels in the color filter. In the case of preparation of a color filter having multi-colored pixels, a color filter consisting of a desired number of hues can be manufactured by repeating the pattern-forming process (and curing process, if necessary) several times in accordance with a desired number of hues.

Hereinafter, a colored curable composition preferably used in an ink-jet method will be described.

The configuration of the colored curable composition when it is used as an ink-jet ink is as described above, but particularly preferred embodiments are illustrated hereinbelow.

When the colored curable composition of the present invention is used as an ink jet ink, the storage stability of ink is excellent, and aggregation or decomposition of ink is inhibited. Further, even upon continuous and intermittent jetting of ink, disorder of jetting such as non-jetting or flight bending of ink droplets does not readily takes place, and the jetting stability is excellent, and recovery properties after a given period of a pause, and further recovery properties upon the occurrence of non-jetting or the like are excellent.

With regard to the colored curable composition which is used as an ink-jet ink, a total content of an azo colorant compound represented by Formula (1a) in the ink-jet ink is preferably in the range of 1 to 20% by mass based on the total amount of ink, and more preferably 5 to 15% by mass. If a content of the azo colorant compound is less than 1% by mass, a film thickness may become thicker in order to achieve an optical density necessary as a color filter. In this case, there is also a need to increase a thickness of a black matrix which is a partition wall, but such a black matrix is difficult to form. On the other hand, if a content of the azo colorant compound exceeds 20% by mass, the ink viscosity is increased, which may cause difficulty regarding jetting and difficulty regarding dissolution in a solvent.

<Solvent>

The colored curable composition as an ink-jet ink in accordance with the present invention contains a solvent. Basically, although there is no particular limitation to the solvent as long as it satisfies the solubility of respective components or the boiling point of the solvent to be described hereinafter, the solvent is preferably selected particularly taking into consideration solubility of the binder to be described hereinafter, coatability, and safety. As specific examples of the solvent, solvents described in paragraphs [0030] to [0040] of JP-A No. 2009-13206 can be exemplified.

A content of the solvent in the ink-jet ink of the present invention is preferably in the range of 30 to 90% by mass, based on the total amount of the ink, and more preferably 50 to 90% by mass. When a content of the solvent is 30% by mass or more, the amount of an ink provided within one pixel is secured, so that an adequate wet-spreading of the ink is attained in the pixel. When a content of the solvent is 90% by mass or less, the amount of the components other than the solvent that are included in the ink and serve to form a functional film (pixel or the like, for example) can be kept above a given amount. Thereby, when a color filter is formed, the amount of ink required for each pixel is not excessively large. For example, when an ink is deposited in a recessed part compartmented with partition walls by using an ink-jet method, ink flooding out of the recessed part and color mixing with adjacent pixels can be inhibited.

The ink-jet ink of the present invention preferably contains a solvent with a high boiling point among the aforementioned solvents, from the viewpoint of the jetting property of the ink from a nozzle and the wettability to the substrate. A solvent with a low boiling point may readily vaporizes even on an ink-jet head, causing readily an increase in the ink viscosity, precipitation of solids, or the like on the head, and causing degradation of the jetting property. In addition, when ink wets and spreads on the substrate after reaching the substrate, the solvent vaporizes to increase the ink viscosity at the edge of the wet-spreading region. Thereby, wet-spreading is inhibited by a phenomenon known as "PINNING" in some cases.

A boiling point of the solvent used in the present invention is preferably in the range of 130 to 280° C. If a boiling point of the solvent is lower than 130° C., there may be a case which is undesirable from the viewpoint of the shape uniformity of pixels within the face. If a boiling point of the solvent is higher than 280° C., there may be a case which is undesirable from the viewpoint of removing the solvent by prebaking. In addition, a boiling point of the solvent means a boiling point under a pressure of 1 atm, and can be seen from physical characteristics tables of compound dictionaries (Chapman & Hall), etc. These may be used alone or in a combination of two or more thereof.

Further, when the above-mentioned ink-jet ink does not contain a polymerizable monomer or the like, a thickness of ink remainders (color pixels) obtained by the removal of a solvent contained in the ink becomes thin, so a height of the partition wall formed on the substrate for the purpose of preventing color mixing or the like can be lowered, which is therefore preferable in terms of costs/productivity.

<Binder>

It is possible to use a binder in the ink-jet ink of the present invention, for the purpose of adjusting the viscosity, adjusting the ink hardness or the like. A binder that simply dries and solidifies may be used as the binder of the ink-jet ink. For example, the binder may be composed of only a resin or resins having no polymerizability per se. However, in order to impart sufficient strength, durability, and adhesion to a coating film, it is preferred to use a binder that can cure a pixel through polymerization after the formation of a pattern of the pixel on the substrate by an ink-jet method. For example, a binder that can be cured by polymerization may be used, such as a photocurable binder that can be polymerized and cured by an action of visible light, UV light, electron beam or the like, and a thermosetting binder that can be polymerized and cured by heating.

<Crosslinking Agent>

In the case of using an epoxy monomer (epoxy group-containing monomer) or a heat-curable binder resin, generally a crosslinking agent may be combined and compounded therewith. As the crosslinking agent, there may be appropriately used curing agents and accelerators described in Chapter 3 of "General Introduction to Epoxy Resins, Basic Edition I" (The Japan Society of Epoxy Resin Technology, published on Nov. 19, 2003). For example, a polyfunctional carboxylic acid anhydride or polyfunctional carboxylic acid can be used.

<Surfactant>

The ink-jet ink of the present invention may further contain a surfactant. Suitable examples of the surfactant include surfactants described in paragraph [0021] of JP-A No. 7-216276, and in JP-A No. 2003-337424 and JP-A No. 11-133600. A content of the surfactant is preferably 5% by mass or less, based on the total amount of the colored composition.

Other additives include additives described in paragraphs [0058] to [0071] of JP-A No. 2000-310706.

A content of the solvent in the ink jet ink composition is preferably in the range of 30 to 90% by mass, based on the total amount of the colored curable composition, and more preferably 50 to 85% by mass. A content of the surfactant is preferably in the range of 0.1 to 5% by mass, based on the total amount of the colored composition.

<Preparation Method of Ink-Jet Ink>

Preparation of the ink jet ink of the present invention can be carried out by applying a known preparation method of ink-jet ink. For example, the ink-jet ink can be prepared by dissolving the compound represented by Formula (1a) in a solvent, followed by dissolution of respective components (for example, a polymerizable compound, a binder, etc.) necessary for the ink-jet ink.

In order to prepare a solution of the polymerizable compound, when the solubility of a material to be used in the solvent is low, a treatment such as heating or ultrasonic treatment can be appropriately carried out within the range where the polymerizable compound does not cause polymerization reaction.

When the compound represented by Formula (1a) is dispersed in an aqueous medium, colored fine particles containing a compound represented by the Formula and an oil-soluble polymer may be dispersed in an aqueous medium as described in JP-A No. 11-286637, JP-A No. 2001-240763 (Japanese Patent Application No. 2000-78491), JP-A No. 2001-262039 (Japanese Patent Application No. 2000-80259), and JP-A No. 2001-247788 (Japanese Patent Application No. 2000-62370), or the compound represented by each Formula dissolved in a high-boiling point organic solvent may be dispersed in an aqueous medium as described in JP-A No. 2001-262018 (Japanese Patent Application No. 2000-78454), JP-A No. 2001-240763 (Japanese Patent Application No. 2000-78491), and JP-A No. 2001-335734 (Japanese Patent Application No. 2000-203856). As the specific method for dispersing the compound represented by Formula (1a) in an aqueous medium, the oil-soluble polymer to be used, the high-boiling point organic solvent, additives, and the amount thereof, those described in the foregoing patent publications may be preferably used. Alternatively, the compound represented by each Formula may be dispersed in a fine solid particle state. Upon dispersing, a dispersant or a surfactant can be used.

As the dispersing devices, there can be used a simple stirrer, an impeller stirring system, an in-line stirring system, a mill system (such as a colloid mill, a ball mill, a sand mill, an attritor, a roll mill, or an agitator mill), an ultrasonic system, a high-pressure emulsifying and dispersing system (high-pressure homogenizer; as specific commercially available devices, Gaulin Homogenizer, Microfluidizer, DeBEE2000, and the like). The details of the method for preparing the ink-jet ink are described in, other than the foregoing patents, JP-A No. 5-148436, JP-A No. 5-295312, JP-A No. 7-97541, JP-A No. 7-82515, JP-A No. 7-118584, JP-A No. 11-286637, and JP-A No. 2001-271003 (Japanese Patent Application No.

2000-87539), which can be applied to preparation of the ink-jet ink of the present invention.

<Physical Characteristics of Ink-Jet Ink>

Although the physical characteristics of the ink-jet ink according to the present invention are not particularly limited as long as they are within the range that allows jetting through an ink-jet head, the viscosity of the ink upon jetting thereof is preferably in the range of 2 to 30 mPa·s from the viewpoint of attaining stable jetting, and more preferably 2 to 20 mPa·s. In addition, when jetted by a machine, the temperature of the ink-jet ink is preferably kept substantially constant in the range of 20° C. to 80° C. When the temperature of the machine is high, the ink viscosity is lowered and jetting of an ink with a high viscosity is possible; however, a higher temperature may easily cause thermal denaturation and/or heat polymerization reaction of the ink in the head, or evaporation of the solvent on the surface of an ink-jetting nozzle, which easily leads to nozzle clogging. Therefore, the temperature of the machine is preferably in the range of 20° C. to 80° C.

Here, the viscosity is measured with a commonly used E-type viscometer (for example, Re-80L E-type viscometer manufactured by Told Sangyo Co., Ltd.), while the ink-jet ink is kept at 25° C.

The surface tension (static surface tension) of the ink-jet ink at 25° C. is preferably in the range of 20 mN/m to 40 mN/m from the viewpoint of improving the wettability to the non-penetrative substrate and the jetting stability, and more preferably 20 mN/m to 35 mN/m. When jetted by a machine, it is preferable to maintain the temperature of the ink-jet ink substantially constant in the range of from 20° C. to 80° C., and the surface tension at that time is preferably set within a range of from 20 mN/m to 40 mN/m. In order to keep the temperature of the ink-jet ink constant with a certain accuracy, an ink temperature detection device, an ink heating or cooling device, and a controlling device that regulates heating or cooling in accordance with the detected ink temperature may preferably be equipped. Alternatively, it is also preferable to provide a device that regulates the energy applied to the device for jetting the ink in accordance with the ink temperature and reduces the influence from the change in ink characteristics.

The surface tension is measured with a commonly used surface tension meter (for example, a surface tension meter FACE SURFACE TENSIOMETER CBVB-A3 manufactured by Kyowa Interface Science Co., Ltd.), using the Wilhermy method at a liquid temperature of 25° C. and 60% RH.

In order to appropriately maintain the wet-spreading form after the ink-jet ink is deposited on a substrate, it is preferable to maintain predetermined liquid properties of the ink-jet ink after it is deposited on the substrate. For this purpose, it is preferable to maintain the substrate and/or the vicinity of the substrate within a predetermined temperature range. Alternatively, it is also effective to reduce the influence from temperature change by, for example, increasing the heat capacity of a table supporting the substrate.

<Color Filter and Method of Producing the Same>

Although there is no particular limitation to the method of producing a color filter by an ink-jet method using the colored curable composition of the present invention, there can be used, for example, the method described in paragraphs [0114] to [0128] of JP-A No. 2008-250188.

<Use of Color Filter of Present Invention>

The color filter of the present invention may further include an indium tin oxide (ITO) layer as a transparent conductive film. Examples of the method of forming the ITO layer include an in-line low temperature sputtering method, an in-line high temperature sputtering method, a batchwise low-temperature sputtering method, a batchwise high-temperature sputtering method, a vacuum deposition method, a plasma CVD method, and the like. Particularly the low-temperature sputtering method is preferably used because it reduces damage to the color filter.

The color filter of the present invention can be suitably used without particular limitation, for example, for applications to image displays (particularly color image displays) such as liquid crystal displays, organic EL displays, liquid crystal projectors, game machines, portable terminals such as mobile phones, digital cameras and car navigators. In addition, the color filter of the present invention can be suitably used as a color filter for solid-state image pickup devices such as CCD image sensors and CMOS image sensors used in digital cameras, digital video cameras, endoscopes, mobile phones, and the like. In particular, the color filter is suitable for CCD devices or CMOS devices of high resolution, which may contain more than one million pixels. The configuration of the solid-state image pickup device is not limited as long as it functions as a solid-state image pickup device and includes the color filter of the present invention, but for example, the following configuration is possible. That is, there is a configuration in which a photodiode constituting a light-receiving area and a transfer electrode formed of polysilicon or the like are provided on a substrate, a color filter layer is provided thereon, and then a microlens is stacked thereon.

From the viewpoint of light-induced discoloration of color material, it is preferred that a camera system with the color filter of the present invention is provided with a cover glass, a microlens, and the like in which a camera lens or an IR-cut film is dichroic-coated, and the materials thereof have optical properties of partially or completely absorbing UV light of 400 nm or less. Further, in order to inhibit oxidative discoloration of the color material, a structure of the camera system is preferably configured to have a structure wherein oxygen permeability to the color filter is reduced. For example, the camera system is preferably partially or completely sealed with nitrogen gas.

Although the colored curable composition, the color filter and the method for preparing the same, and the display or solid-state image pickup device using the same in accordance with the first aspect of the invention have been described in detail by way of various embodiments, the present invention is not limited to those embodiments, and it should be understood that various modifications and alterations are possible without departing from the scope of the invention.

Second Aspect of the Invention

Hereinafter, a colored curable composition, a color filter, a method for producing a color filter, and the like according to the second aspect of the invention will be described in more detail. Although explanation of configuration requirements described hereinbelow will be made based on representative embodiments of the present invention, the present invention is not limited thereto. Further, a numerical range represented using "-" in the present specification represents a range including numerical values described in front of and behind "-", as the minimum value and the maximum value.

—Colored Curable Composition—

A first colored curable composition of the present invention contains at least one selected from the group consisting of a colorant compound represented by the following Formula (M) and a tautomer thereof, and a polymerizable compound.

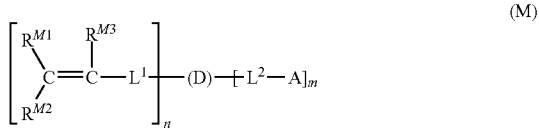

In Formula (M), $R^{M1}$, $R^{M2}$, and $R^{M3}$ each independently represent a hydrogen atom or a monovalent substituent, $L^1$ and $L^2$ each independently represent a single bond or a divalent linking group, A represents an acid group with pKa of 10 or less, D represents a residue obtained by removing (n+m) hydrogen atoms from a compound represented by the following Formula (1b), n represents an integer from 0 to 10, and m represents an integer from 1 to 10.

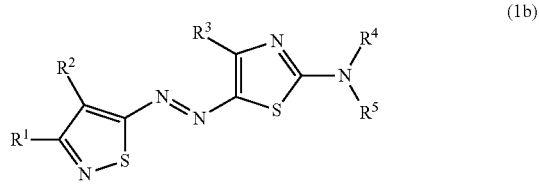

In Formula (1b), $R^1$, $R^2$, $R^3$, $R^4$, and $R^5$ each independently represent a hydrogen atom or a monovalent substituent, and $R^1$ and $R^2$, and $R^4$ and $R^5$ independently may bond to each other in each pair to form a ring.

Further, the second colored curable composition of the present invention contains at least one selected from the group consisting of a colorant compound having a repeating unit represented by the following Formula (Pb) and a tautomer thereof, and a polymerizable compound.

In Formula (Pb), $R^{P1}$, $R^{P2}$, and $R^{P3}$ each independently represent a hydrogen atom or a monovalent substituent, and D represents a residue obtained by removing one hydrogen atom from a compound represented by the following Formula (1b).

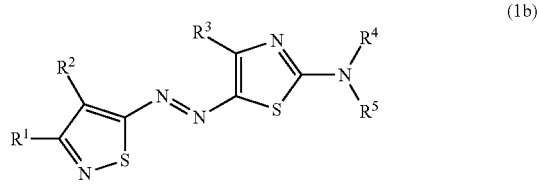

In Formula (1b), $R^1$, $R^2$, $R^3$, $R^4$, and $R^5$ each independently represent a hydrogen atom or a monovalent substituent, and $R^1$ and $R^2$, and $R^4$ and $R^5$ independently may bond to each other in each pair to form a ring.

The first colored curable composition of the present invention may contain, if necessary, at least one selected from the group consisting of a colorant compound having the repeating unit represented by Formula (Pb) and a tautomer thereof, in addition to the at least one selected from the group consisting of the colorant compound represented by Formula (M) and a tautomer thereof.

Further, the second colored curable composition of the present invention may contain, if necessary, at least one selected from the group consisting of a colorant compound represented by Formula (M) and a tautomer thereof, in addition to the at least one selected from the group consisting of a colorant compound having the repeating unit represented by Formula (Pb) and a tautomer thereof.

The first or second colored curable composition of the present invention (hereinafter, often referred to simply as "colored curable composition of the present invention") is characterized in that it is cured by heat, light or both of them, and the composition may further contain other components such as a polymerization initiator, a solvent, a binder, and a crosslinking agent, if necessary.

The colorant compound represented by Formula (M) or the colorant compound having the repeating unit represented by Formula (Pb), which is contained in the colored curable composition of the present invention, is a monomer dye or polymer-type dye characterized by having a residue of the colorant represented by Formula (1b) as a partial structure.

Firstly, a compound represented by Formula (1b) and a colorant residue which is an embodiment for introducing the compound into the dye will be described.

<Residue of Colorant Represented by Formula (1b)>

The specific azo colorant skeleton represented by Formula (1b) is an azo colorant skeleton characterized in that a coupling component is an aminothiazole and a diazo component is an isothiazole. An azo colorant containing an aminothiazole as a coupling component is described in JP-A No. 54-65730 and U.S. Pat. No. 5,789,560 (for example, Exemplified Compound 76), and a colorant containing an isothiazole as a diazo component is disclosed in JP-A No. 2-123166.

An example using the specific azo colorant compound represented by the following Formula (1b) as a diffusion (heat-sensitive) transfer colorant is disclosed in JP-A No. 2005-255868 and JP-A No. 2009-56711. Thermal sublimation is known to occur in molecules having only the chromophore of this specific azo colorant compound, so the use of such an azo colorant compound has been difficult in the formation of a colored pattern according to a photolithographic method.

In the present invention, when the monomer dye or polymer dye having a residue of this specific azo colorant as a partial structure is used in the colored curable composition for color filters, characteristics necessary for the color filter, particularly high resolution, high definition, high color reproducibility, and high contrast can be satisfied. Further, sublimability can also be inhibited.

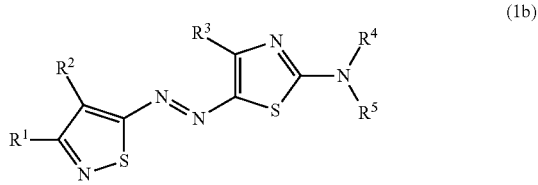

In Formula (1b), $R^1$, $R^2$, $R^3$, $R^4$, and $R^5$ each independently represent a hydrogen atom or a monovalent substituent. $R^1$ and $R^2$, and $R^4$ and $R^5$ independently may bond to each other in each pair to form a ring.

A colorant residue is obtained by removing (n+m) hydrogen atoms from $R^1$, $R^2$, $R^3$, $R^4$, and/or $R^5$ in the case of the colorant compound represented by Formula (M), and a colorant residue is obtained by removing one hydrogen atom from $R^1$, $R^2$, $R^3$, $R^4$, and/or $R^5$ in the case of the colorant compound containing a repeating unit represented by Formula (Pb).

In Formula (1b), $R^1$, $R^2$, and $R^3$ each independently represent a hydrogen atom or a monovalent substituent. Examples of the monovalent substituent include a halogen atom, an alkyl group having a carbon number of 1 to 30 (in this specification, which means a saturated aliphatic group, examples of which include a cycloalkyl group and a bicycloalkyl group), an alkenyl group having a carbon number of 2 to 30 (in this specification, which means an unsaturated aliphatic group having a double bond, examples of which include a cycloalkenyl group and a bicycloalkenyl group), an alkynyl group having a carbon number of 2 to 30, an aryl group having a carbon number of 6 to 30, a heterocyclic group having a carbon number of 3 to 30, a cyano group, an aliphatic oxy group having a carbon number of 1 to 30, an aryloxy group having a carbon number of 6 to 30, an acyloxy group having a carbon number of 2 to 30, a carbamoyloxy group having a carbon number of 1 to 30, an aliphatic oxycarbonyloxy group having a carbon number of 2 to 30, an aryloxycarbonyloxy group having a carbon number of 7 to 30, an amino group having a carbon number of 0 to 30 (examples of which include an aliphatic amino group, an aryl amino group and a heterocyclic amino group), an acylamino group having a carbon number of 2 to 30, an aminocarbonylamino group having a carbon number of 1 to 30, an aliphatic oxycarbonylamino group having a carbon number of 2 to 30, an aryloxycarbonylamino group having a carbon number of 7 to 30, a sulfamoylamino group having a carbon number of 0 to 30, an aliphatic or aryl sulfonylamino group having a carbon number of 1 to 30, an aliphatic thio group having a carbon number of 1 to 30, an arylthio group having a carbon number of 6 to 30, a sulfamoyl group having a carbon number of 0 to 30, an aliphatic or aryl sulfinyl group having a carbon number of 1 to 30, an aliphatic or aryl sulfonyl group having a carbon number of 1 to 30, an acyl group having a carbon number of 2 to 30, an aryloxycarbonyl group having a carbon number of 7 to 30, an aliphatic oxycarbonyl group having a carbon number of 2 to 30, a carbamoyl group having a carbon number of 1 to 30, an aryl or heterocyclic azo group having a carbon number of 3 to 30, and an imido group, each of which may further have a substituent.

In Formula (1b), $R^4$ and $R^5$ each independently represent a hydrogen atom or a monovalent substituent. Examples of the monovalent substituent include an alkyl group having a carbon number of 1 to 30, an alkenyl group having a carbon number of 2 to 30, an alkynyl group having a carbon number of 2 to 30, an aryl group having a carbon number of 6 to 30, a heterocyclic group having a carbon number of 3 to 30, an acyl group having a carbon number of 2 to 30, an aryloxycarbonyl group having a carbon number of 7 to 30, an alkoxycarbonyl group having a carbon number of 2 to 30, and a carbamoyl group having a carbon number of 1 to 30, each of which may further have a substituent.

Hereinafter, monovalent substituents represented by $R^1$, $R^2$, $R^3$, $R^4$, and $R^5$, and substituents which may further substitute $R^1$, $R^2$, $R^3$, $R^4$, and $R^5$, will be described in more detail.

Examples of halogen atoms include a fluorine atom, a chlorine atom, a bromine atom, and an iodine atom. Among them, a chlorine atom and a bromine atom are preferred, and particularly a chlorine atom is preferred.

An aliphatic group is a linear, branched or cyclic aliphatic group, and as mentioned above, examples of the saturated aliphatic group include an alkyl group, a cycloalkyl group, and a bicycloalkyl group, each of which may have a substituent. A carbon number thereof is preferably in the range of 1 to 30 and more preferably 1 to 15. Examples of the alkyl group include a methyl group, an ethyl group, an n-propyl group, an isopropyl group, a tert-butyl group, an n-octyl group, an eicosyl group, a 2-chloroethyl group, a 2-cyanoethyl group, a benzyl group and a 2-ethylhexyl group. Among them, a methyl group, a tert-butyl group, and a benzyl group are preferable. Here, examples of the cycloalkyl group include a substituted or unsubstituted cycloalkyl group. The substituted or unsubstituted cycloalkyl group is preferably a cycloalkyl group having a carbon number of 3 to 30. Examples thereof include a cyclohexyl group, a cyclopentyl group, and a 4-n-dodecylcyclohexyl group. Among them, a cyclohexyl group is preferable. Examples of the bicycloalkyl group include a substituted or unsubstituted bicycloalkyl group having a carbon number of 5 to 30, i.e., a monovalent group obtained by removing one hydrogen atom from bicycloalkane having a carbon number of 5 to 30. Examples thereof include a bicyclo[1.2.2]heptan-2-yl group, and a bicyclo[2.2.2]octan-3-yl group. Among them, preferred is a bicyclo[1.2.2]heptan-2-yl group.

Further, a tricyclo structure or the like having a large number of cyclic structures is also included in the aliphatic group.

An unsaturated aliphatic group is a linear, branched or cyclic unsaturated aliphatic group, and examples thereof include an alkenyl group, a cycloalkenyl group, a bicycloalkenyl group, and an alkynyl group. The alkenyl group represents a linear, branched or cyclic, substituted or unsubstituted alkenyl group. The alkenyl group is preferably a substituted or unsubstituted alkenyl group having a carbon number of 2 to 30 and more preferably a substituted or unsubstituted alkenyl group having a carbon number of 2 to 10. Examples of the alkenyl group include a vinyl group, an allyl group, a prenyl group, a geranyl group and an oleyl group. Among them, a vinyl group is preferable. Examples of the cycloalkenyl group include a substituted or unsubstituted cycloalkenyl group having a carbon number of 3 to 30, i.e., preferably a monovalent group obtained by removing one hydrogen atom from cycloalkene having a carbon number of 3 to 30. Examples thereof include a 2-cyclopenten-1-yl group, and a 2-cyclohexen-1-yl group. Among them, a 2-cyclopenten-1-yl group is preferable. Examples of the bicycloalkenyl group include a substituted or unsubstituted bicycloalkenyl group. The bicycloalkenyl group is preferably a substituted or unsubstituted bicycloalkenyl group having a carbon number of 5 to 30, i.e. a monovalent group obtained by removing one hydrogen atom from bicycloalkene having a double bond. Examples thereof include a bicyclo[2.2.1]hept-2-en-1-yl group, and a bicyclo[2.2.2]oct-2-en-4-yl group. Among them, preferred is a bicyclo[2.2.1]hept-2-en-1-yl group.

An alkynyl group is preferably a substituted or unsubstituted alkynyl group having a carbon number of 2 to 30 and more preferably a substituted or unsubstituted alkynyl group having a carbon number of 2 to 10. Examples of the alkynyl group include an ethynyl group, and a propargyl group. Among them, preferred is an ethynyl group.

An aryl group is preferably a substituted or unsubstituted aryl group having a carbon number of 6 to 30 and more preferably a substituted or unsubstituted aryl group having a carbon number of 6 to 20, and examples thereof include a phenyl group, a p-tolyl group, a naphthyl group, an m-chlorophenyl group, and an o-hexadecanoylaminophenyl group, and preferred is a phenyl group which may have a substituent.

A heterocyclic group is a monovalent group obtained by removing one hydrogen atom from a substituted or unsubstituted, aromatic or non-aromatic heterocyclic compound, which may be further ring-condensed. The heterocyclic group is preferably a 5- or 6-membered heterocyclic group, and the ring-constituting heteroatom is preferably an oxygen atom, a sulfur atom, and a nitrogen atom. More preferred is a 5- or 6-membered aromatic heterocyclic group having a carbon number of 3 to 30. Particularly preferred is a 5- or 6-membered aromatic heterocyclic group having a carbon number of 3 to 15.

Examples of the heterocycle in the heterocyclic group include a pyridine ring, a pyrazine ring, a pyridazine ring, a pyrimidine ring, a triazine ring, a quinoline ring, an isoquinoline ring, a quinazoline ring, a cinnoline ring, a phthalazine ring, a quinoxaline ring, a pyrrole ring, an indole ring, a furan ring, a benzofuran ring, a thiophene ring, a benzothiophene ring, a pyrazole ring, an imidazole ring, a benzimidazole ring, a triazole ring, an oxazole ring, a benzoxazole ring, a thiazole ring, a benzothiazole ring, an isothiazole ring, a benzisothiazole ring, a thiadiazole ring, an isoxazole ring, a benzisoxazole ring, a pyrrolidine ring, a piperidine ring, a piperazine ring, an imidazolidine ring, and a thiazoline ring. Among them, preferred are a pyridine ring, an isoquinoline ring, a pyrrole ring, a thiophene ring and an imidazole ring which may have a substituent.

An aliphatic oxy group (typically an alkoxy group) may be a substituted or unsubstituted aliphatic oxy group (typically an alkoxy group), and a carbon number thereof is preferably in the range of 1 to 30 and more preferably 1 to 15. Examples thereof include a methoxy group, an ethoxy group, an isopropoxy group, an n-octyloxy group, a methoxyethoxy group, a hydroxyethoxy group and a 3-carboxypropoxy group. Among them, preferred are a methoxy group and an isopropoxy group.

An aryloxy group is preferably a substituted or unsubstituted aryloxy group having a carbon number of 6 to 30 and more preferably a substituted or unsubstituted aryloxy group having a carbon number of 6 to 15. Examples of the aryloxy group include a phenoxy group, a 2-methylphenoxy group, a 4-tert-butylphenoxy group, a 3-nitrophenoxy group, a 2-tetradecanoylaminophenoxy group, and the like. Preferred is a phenyloxy group which may have a substituent.

An acyloxy group is preferably a formyloxy group, a substituted or unsubstituted alkylcarbonyloxy group having a carbon number of 2 to 30, and a substituted or unsubstituted arylcarbonyloxy group having a carbon number of 7 to 30. Examples of the acyloxy group include a formyloxy group, an acetyloxy group, a pivaloyloxy group, a stearoyloxy group, a benzoyloxy group, a p-methoxyphenylcarbonyloxy group, and the like. Among them, preferred are an acetyloxy group and a pivaloyloxy group.

A carbamoyloxy group is preferably a substituted or unsubstituted carbamoyloxy group having a carbon number of 1 to 30 and more preferably a substituted or unsubstituted carbamoyloxy group having a carbon number of 1 to 15. Examples of the carbamoyloxy group include an N,N-dimethylcarbamoyloxy group, an N,N-diethylcarbamoyloxy group, a morpholinocarbonyloxy group, an N,N-di-n-octylaminocarbonyloxy group, an N-n-octylcarbamoyloxy group, and the like. Among them, preferred is an N,N-dimethylcarbamoyloxy group.

An aliphatic oxycarbonyloxy group (typically an alkoxycarbonyloxy group) has preferably a carbon number of 2 to 30 and more preferably a carbon number of 2 to 15, and may have a substituent. Examples thereof include a methoxycarbonyloxy group, an ethoxycarbonyloxy group, a tert-butoxycarbonyloxy group, an n-octyloxycarbonyloxy group, and the like. Among them, preferred is a methoxycarbonyloxy group.

An aryloxycarbonyloxy group is preferably a substituted or unsubstituted aryloxycarbonyloxy group having a carbon number of 7 to 30 and more preferably a substituted or unsubstituted aryloxycarbonyloxy group having a carbon number of 7 to 15. Examples of the aryloxycarbonyloxy group include a phenoxycarbonyloxy group, a p-methoxyphenoxycarbonyloxy group, a p-n-hexadecyloxyphenoxycarbonyloxy group, and the like. Preferred is a phenoxycarbonyloxy group which may have a substituent.

An amino group may be an amino group, an aliphatic amino group (typically an alkylamino group), an aryl amino group and a heterocyclic amino group. The amino group is preferably a substituted or unsubstituted aliphatic amino group (typically an alkylamino group) having a carbon number of 1 to 30 or a substituted or unsubstituted aryl amino group having a carbon number of 6 to 30. Examples of the amino group include an amino group, a methylamino group, a dimethylamino group, an anilino group, an N-methylanilino group, a diphenylamino group, a hydroxyethylamino group, a carboxyethylamino group, a sulfoethylamino group, a 3,5-dicarboxyanilino group, a 4-quinolylamino group, and the like. Among them, preferred is an anilino group which may have a substituent.

An acylamino group is preferably a formylamino group, a substituted or unsubstituted alkylcarbonylamino group having a carbon number of 2 to 30 or a substituted or unsubstituted arylcarbonylamino group having a carbon number of 7 to 30. Examples of the acylamino group include a formylamino group, an acetylamino group, a pivaloylamino group, a lauroylamino group, a benzoylamino group, a 3,4,5-tri-n-octyloxyphenylcarbonylamino group, and the like. Among them, preferred are an acetylamino group and a pivaloylamino group.

An aminocarbonylamino group is preferably a substituted or unsubstituted aminocarbonylamino group having a carbon number of 1 to 30 and more preferably a substituted or unsubstituted aminocarbonylamino group having a carbon number of 1 to 15. Example of the aminocarbonylamino group include a carbamoylamino group, an N,N-dimethylaminocarbonylamino group, an N,N-diethylaminocarbonylamino group, a morpholinocarbonylamino group, and the like. Among them, preferred is N,N-dimethylaminocarbonylamino group. In addition, the term "amino" in this group has the same definition as "amino" in the above-mentioned amino group.

An aliphatic oxycarbonylamino group (typically an alkoxycarbonylamino group) has preferably a carbon number of 2 to 30 and more preferably a carbon number of 2 to 15, and may have a substituent. Examples thereof include a methoxycarbonylamino group, an ethoxycarbonylamino group, a tert-butoxycarbonylamino group, an n-octadecyloxycarbonylamino group, an N-methylmethoxycarbonylamino group, and the like. Among them, preferred is a methoxycarbonylamino group.

An aryloxycarbonylamino group is preferably a substituted or unsubstituted aryloxycarbonylamino group having a carbon number of 7 to 30 and more preferably a substituted or unsubstituted aryloxycarbonylamino group having a carbon number of 7 to 15. Examples of the aryloxycarbonylamino group include a phenoxycarbonylamino group, a p-chlorophenoxycarbonylamino group, an m-n-octyloxyphenoxycarbonylamino group, and the like. Preferred is a phenyloxycarbonylamino group which may have a substituent.

A sulfamoylamino group is preferably a substituted or unsubstituted sulfamoylamino group having a carbon number of 0 to 30 and more preferably a substituted or unsubstituted sulfamoylamino group having a carbon number of 0 to 10.

Examples of the sulfamoylamino group include a sulfamoylamino group, an N,N-dimethylaminosulfonylamino group, an N-n-octylaminosulfonylamino group, and the like. Among them, preferred is an N,N-dimethylaminosulfonylamino group.

An aliphatic (typically alkyl) or arylsulfonylamino group is preferably a substituted or unsubstituted aliphatic sulfonylamino group (typically an alkylsulfonylamino group) having a carbon number of 1 to 30 or a substituted or unsubstituted arylsulfonylamino group (preferably a phenylsulfonylamino group which may have a substituent) having a carbon number of 6 to 30. Examples thereof include a methylsulfonylamino group, a butylsulfonylamino group, a phenylsulfonylamino group, a 2,3,5-trichlorophenylsulfonylamino group, a p-methylphenylsulfonylamino group, and the like. Among them, preferred is a phenylsulfonylamino group which may have a substituent.

An aliphatic thio group (typically an alkylthio group) is preferably a substituted or unsubstituted alkylthio group having a carbon number of 1 to 30 and more preferably a substituted or unsubstituted alkylthio group having a carbon number of 1 to 15. Examples of the alkylthio group include a methylthio group, an ethylthio group, an n-hexadecylthio group, and the like. Among them, preferred is a methylthio group.

An arylthio group is preferably a substituted or unsubstituted arylthio group having a carbon number of 6 to 30 and more preferably a substituted or unsubstituted arylthio group having a carbon number of 6 to 12. Examples of the arylthio group include a phenylthio group, a 1-naphthylthio group, a 2-naphthylthio group, and the like. Among them, preferred is a phenyl thio group which may have a substituent.

A sulfamoyl group is preferably a substituted or unsubstituted sulfamoyl group having a carbon number of 0 to 30 and more preferably a substituted or unsubstituted sulfamoyl group having a carbon number of 0 to 15. Examples of the sulfamoyl group include an N-ethylsulfamoyl group, an N-(3-dodecyloxypropyl)sulfamoyl group, an N,N-dimethylsulfamoyl group, an N-acetylsulfamoyl group, an N-benzoylsulfamoyl group, an N—(N'-phenylcarbamoyl)sulfamoyl group, and the like. Among them, preferred is an N-ethylsulfamoyl group.

An aliphatic (typically alkyl) or arylsulfinyl group is preferably a substituted or unsubstituted aliphatic sulfinyl group (typically an alkylsulfinyl group) having a carbon number of 1 to 30 or a substituted or unsubstituted arylsulfinyl group (preferably a phenylsulfinyl group which may have a substituent) having a carbon number of 6 to 30. Examples thereof include a methylsulfinyl group, an ethylsulfinyl group, a phenylsulfinyl group, a p-methylphenylsulfinyl group, and the like. Among them, preferred is a phenylsulfinyl group which may have a substituent.

An aliphatic (typically alkyl) or arylsulfonyl group is preferably a substituted or unsubstituted aliphatic sulfonyl group (typically an alkylsulfonyl group) having a carbon number of 1 to 30 or a substituted or unsubstituted arylsulfonyl group (preferably a phenylsulfonyl group which may have a substituent) having a carbon number of 6 to 30. Examples thereof include a methylsulfonyl group, an ethylsulfonyl group, a phenylsulfonyl group, a p-toluenesulfonyl group, and the like. Among them, preferred is a phenylsulfonyl group which may have a substituent.

An acyl group is preferably a formyl group, a substituted or unsubstituted aliphatic carbonyl group (typically an alkylcarbonyl group) having a carbon number of 2 to 30, a substituted or unsubstituted arylcarbonyl group (preferably a phenylcarbonyl group which may have a substituent) having a carbon number of 7 to 30 or a substituted or unsubstituted heterocyclic carbonyl group having a carbon number of 4 to 30 in which a heterocycle is bonded to the carbonyl group through a carbon atom. Examples thereof include an acetyl group, a pivaloyl group, a 2-chloroacetyl group, a stearoyl group, a benzoyl group, a p-n-octyloxyphenylcarbonyl group, a 2-pyridylcarbonyl group, a 2-furylcarbonyl group, and the like. Among them, preferred are an acetyl group, a pivaloyl group, and a phenylcarbonyl group which may have a substituent.

An aryloxycarbonyl group is preferably a substituted or unsubstituted aryloxycarbonyl group having a carbon number of 7 to 30 and more preferably a substituted or unsubstituted aryloxycarbonyl group having a carbon number of 7 to 15. Examples of the aryloxycarbonyl group include a phenoxycarbonyl group, an o-chlorophenoxycarbonyl group, an m-nitrophenoxycarbonyl group, a p-tert-butylphenoxycarbonyl group, and the like. Preferred is a phenoxycarbonyl group which may have a substituent.

An aliphatic oxycarbonyl group (typically an alkoxycarbonyl group) preferably has a carbon number of 2 to 30 and more preferably a carbon number of 2 to 15, and may have a substituent. Examples thereof include a methoxycarbonyl group, an ethoxycarbonyl group, a tert-butoxycarbonyl group, an n-octadecyloxycarbonyl group, and the like. Among them, preferred is a methoxycarbonyl group.

A carbamoyl group is preferably a substituted or unsubstituted carbamoyl group having a carbon number of 1 to 30 and more preferably a substituted or unsubstituted carbamoyl group having a carbon number of 1 to 15. Examples of the carbamoyl group include a carbamoyl group, an N-methylcarbamoyl group, an N,N-dimethylcarbamoyl group, an N,N-di-n-octylcarbamoyl group, an N-(methylsulfonyl)carbamoyl group, and the like. Among them, preferred is an N,N-dimethylcarbamoyl group.

An aryl or heterocyclic azo group has preferably a carbon number of 3 to 30 and more preferably a carbon number of 3 to 15. Examples of the aryl or heterocyclic azo group include a phenylazo group, a 4-methoxyphenylazo group, a 4-pivaloylaminophenylazo group, a 2-hydroxy-4-propanoylphenylazo group, and the like. Among them, preferred is a phenylazo group.

Examples of an imido group include an N-succinimido group, an N-phthalimido group, and the like. Among them, preferred is an N-phthalimido group.

In addition, mention may be made of substituents having a hydroxyl group, a cyano group, a nitro group, a dissociable group (for example, a sulfo group, a carboxyl group, a phosphono group) or an ethylenically unsaturated group.

Each of these groups may further have a substituent, examples of such a substituent include the aforementioned substituents.

$R^1$ represents preferably a substituted or unsubstituted alkyl group, a substituted or unsubstituted aryl group or a substituted or unsubstituted heterocyclic group in terms of being capable of effectively exerting the effect of the present invention, more preferably a substituted or unsubstituted alkyl group, a substituted or unsubstituted aryl group, a 2-pyridyl group, a 3-pyridyl group, a 4-pyridyl group or a 2-thienyl group, and most preferably an unsubstituted alkyl group or a substituted or unsubstituted phenyl group.

$R^2$ represents preferably a cyano group, a substituted or unsubstituted alkoxycarbonyl group or a substituted or unsubstituted aryloxycarbonyl group in terms of being capable of effectively exerting the effect of the present invention, more preferably a cyano group or a substituted or unsubstituted alkoxycarbonyl group, and most preferably a cyano group.

R³ represents preferably a substituted or unsubstituted alkyl group, a substituted or unsubstituted acyl group, a substituted or unsubstituted alkoxycarbonyl group, a substituted or unsubstituted aryloxycarbonyl group, a substituted or unsubstituted carbamoyl group or a heterocyclic group in terms of being capable of effectively exerting the effect of the present invention, more preferably a substituted or unsubstituted alkyl group or a substituted or unsubstituted acyl group, and most preferably a substituted or unsubstituted alkyl group.

R⁴ and R⁵ each independently represent preferably a hydrogen atom, a substituted or unsubstituted alkyl group, a substituted or unsubstituted aryl group or a substituted or unsubstituted acyl group in terms of being capable of effectively exerting the effect of the present invention, more preferably a substituted or unsubstituted alkyl group or a substituted or unsubstituted aryl group, and most preferably a substituted or unsubstituted alkyl group.

A preferred combination of substituents in a colorant residue represented by Formula (1b) is preferably a combination wherein at least one of these substituents is the aforementioned preferred group, more preferably a combination wherein more numerous various substituents are the aforementioned preferred groups, and most preferably a combination wherein all the substituents are the aforementioned preferred groups.

<Compound Represented by Formula (M)>

Hereinafter, a colorant compound (monomer dye) represented by Formula (M) will be described.

The compound represented by Formula (M) is an azo colorant compound characterized by having a colorant residue derived from the specific azo colorant compound represented by Formula (1b) and having at least one acid group with pKa of 10 or less in the same molecule.

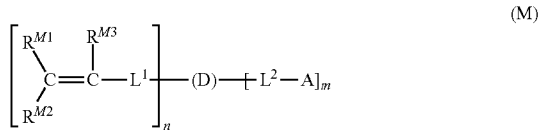

In Formula (M), $R^{M1}$, $R^{M2}$ and $R^{M3}$ each independently represent a hydrogen atom or a monovalent substituent, $L^1$ and $L^2$ each independently represent a single bond or a divalent linking group, A represents an acid group with pKa of 10 or less, D represents a residue obtained by removing (n+m) hydrogen atoms from a compound represented by the Formula (1b), n represents an integer from 0 to 10, and m represents an integer from 1 to 10.

In Formula (M), $R^{M1}$, $R^{M2}$ and $R^{M3}$ each independently represent a hydrogen atom or a monovalent substituent. Examples of the monovalent substituent represented by $R^{M1}$, $R^{M2}$ and $R^{M3}$ include an alkyl group having a carbon number of 1 to 30 (preferably a carbon number of 1 to 15), an aryl group having a carbon number of 6 to 30 (preferably a carbon number of 6 to 15), a heterocyclic group having a carbon number of 3 to 30 (preferably a carbon number of 3 to 15), a cyano group, an acyl group having a carbon number of 2 to 30 (preferably a carbon number of 2 to 15), an aryloxycarbonyl group having a carbon number of 7 to 30 (preferably a carbon number of 7 to 15), an aliphatic oxycarbonyl group having a carbon number of 2 to 30 (preferably a carbon number of 2 to 15), a carbamoyl group having a carbon number of 1 to 30 (preferably a carbon number of 1 to 15), an aliphatic oxy group having a carbon number of 1 to 30 (preferably a carbon number of 1 to 15), an aryloxy group having a carbon number of 6 to 30 (preferably a carbon number of 6 to 15), and an amino group (examples of which include an alkylamino group, an anilino group and a heterocyclic amino group) having a carbon number of 0 to 30 (preferably a carbon number of 3 to 15), each of which may further have a substituent.

In Formula (M), $L^1$ and $L^2$ each independently represent a single bond or a divalent linking group. Examples of the divalent linking group include an alkylene group (such as ethylene, 1,2-propylene, 1,3-propylene, or 1,4-butylene) having a carbon number of 2 to 30 (preferably a carbon number of 2 to 15), an alkenylene group (such as ethenylene or propenylene) having a carbon number of 2 to 30 (preferably a carbon number of 2 to 15), an alkynylene group (such as ethenylene or 1,3-propynylene) having a carbon number of 2 to 30 (preferably a carbon number of 2 to 15), an arylene group (such as phenylene or naphthylene) having a carbon number of 6 to 30 (preferably a carbon number of 6 to 15), a divalent heterocyclic group (such as 6-chloro-1,3,5-triazine-2,4-diyl group, pyrimidine-2,4-diyl group, or quinoxaline-2,3-diyl group) having a carbon number of 3 to 30 (preferably a carbon number of 3 to 15), —O—, —CO—, —NR— (R represents a hydrogen atom or an alkyl or aryl group having a carbon number of 1 to 30), —S—, —SO₂—, —SO— or a divalent substituent (such as o-xylylene, m-xylylene, or p-xylylene) consisting of a combination thereof and having a total carbon number of 0 to 30 (preferably a total carbon number of 0 to 10), each of which may further have a substituent.

In Formula (M), A represents an acid group with pKa of 10 or less. Examples of the acid group include a carboxyl group, a phosphoric acid group, a sulfonic acid group, a quaternary ammonium group, a phenol group, a thiol group, and a carbonyl group, each of which may further have a substituent.

$R^{M1}$, $R^{M2}$, and $R^{M3}$ each independently represent preferably a hydrogen atom, a substituted or unsubstituted alkyl group, or a substituted or unsubstituted aryl group in terms of being capable of effectively exerting the effect of the present invention, more preferably a hydrogen atom, or a substituted or unsubstituted alkyl group, and most preferably a hydrogen atom.

$L^1$ represents preferably a single bond, a substituted or unsubstituted alkylene having a carbon number of 2 to 8, a xylylene, or —CO— in terms of being capable of effectively exerting the effect of the present invention, more preferably a substituted or unsubstituted alkylene having a carbon number of 3 to 6, p-xylylene, m-xylylene, or —CO—, and most preferably p-xylylene, or —CO—.

$L^2$ represents preferably a single bond, a substituted or unsubstituted alkylene having a carbon number of 2 to 20, or a xylylene in terms of being capable of effectively exerting the effect of the present invention, more preferably a substituted or unsubstituted alkylene having a carbon number of 2 to 15, p-xylylene, or m-xylylene, and most preferably an unsubstituted alkylene having a carbon number of 2 to 10 or p-xylylene.

A represents preferably a carboxyl group, a phosphoric acid group, or a sulfonic acid group in terms of being capable of effectively exerting the effect of the present invention, more preferably a carboxyl group, or a phosphoric acid group, and most preferably a carboxyl group.

Substituents in the residue D are preferably the same as the preferred substituents in Formula (1b), in terms of being capable of effectively exerting the effect of the present invention. Although the position(s) of hydrogen atom(s) to be removed may be at any position(s) when the residue D is obtained by removing hydrogen atom(s) from the colorant represented by Formula (1b), preferred are hydrogen atoms at $R^1$, $R^3$, $R^4$, and $R^5$, more preferred are hydrogen atoms at $R^1$, $R^4$, and $R^5$, and most preferred are hydrogen atoms at $R^4$ and $R^5$.

In Formula (M), m represents preferably 1 to 8, more preferably 1 to 6, and particularly preferably 1 to 4.

In Formula (M), n represents preferably 0 to 8, more preferably 0 to 6, and particularly preferably 0 to 4.

A preferred combination of substituents in the compound represented by Formula (M) is preferably a combination wherein at least one of these substituents is the aforementioned preferred group, more preferably a combination wherein more numerous various substituents are the aforementioned preferred groups, and most preferably a combination wherein all the substituents are the aforementioned preferred groups.

In terms of being capable of effectively exerting the effect of the present invention, preferred is a combination wherein $M^{M1}$, $R^{M2}$ and $R^{M3}$ represent a hydrogen atom, a substituted or unsubstituted alkyl group, or a substituted or unsubstituted aryl group, $L^1$ represents a single bond, a substituted or unsubstituted alkylene having a carbon number of 2 to 8, a xylylene, or —CO—, $L^2$ represents a single bond, a substituted or unsubstituted alkylene having a carbon number of 2 to 20, or a xylylene, A represents a carboxyl group, a phosphoric acid group, or a sulfonic acid group, m represents 1 to 8 and n represents 0 to 8, and with regard to the residue, in Formula (1b), $R^1$ represents a substituted or unsubstituted alkyl group, a substituted or unsubstituted aryl group, or a substituted or unsubstituted heterocyclic group, $R^2$ represents a cyano group, a substituted or unsubstituted alkoxycarbonyl group, or a substituted or unsubstituted aryloxycarbonyl group, $R^3$ represents a substituted or unsubstituted alkyl group, a substituted or unsubstituted acyl group, a substituted or unsubstituted alkoxycarbonyl group, a substituted or unsubstituted aryloxycarbonyl group, a substituted or unsubstituted carbamoyl group, or a substituted or unsubstituted heterocyclic group, and an $R^4$ and $R^5$ represent a hydrogen atom, a substituted or unsubstituted alkyl group, a substituted or unsubstituted aryl group, or a substituted or unsubstituted acyl group.

In terms of being capable of effectively exerting the effect of the present invention, more preferred is a combination wherein $R^{M1}$, $R^{M2}$ and $R^{M3}$ represent a hydrogen atom, or a substituted or unsubstituted alkyl group, $L^1$ represents a substituted or unsubstituted alkylene having a carbon number of 3 to 6, p-xylylene, m-xylylene, or —CO—, $L^2$ represents a substituted or unsubstituted alkylene having a carbon number of 2 to 15, p-xylylene, or m-xylylene, A represents a carboxyl group, or a phosphoric acid group, m represents 1 to 6, and n represents 0 to 6, and with regard to the residue, in Formula (1b), $R^1$ represents a substituted or unsubstituted alkyl group, a substituted or unsubstituted aryl group, a 2-pyridyl group, a 3-pyridyl group, a 4-pyridyl group, or a 2-thienyl group, $R^2$ represents a cyano group, or a substituted or unsubstituted alkoxycarbonyl group, $R^3$ represents a substituted or unsubstituted alkyl group, or a substituted or unsubstituted acyl group, and $R^4$ and $R^5$ represent a substituted or unsubstituted alkyl group, or a substituted or unsubstituted aryl group.

In terms of being capable of effectively exerting the effect of the present invention, most preferred is a combination wherein $R^{M1}$, $R^{M2}$, and $R^{M3}$ represent a hydrogen atom, $L^1$ represents p-xylylene, or —CO—, $L^2$ represents an unsubstituted alkylene having a carbon number of 2 to 10 or p-xylylene, A represents a carboxyl group, m represents 1 to 4, n represents 0 to 4, and with regard to the residue, in Formula (1b), $R^1$ represents an unsubstituted alkyl group, or a substituted or unsubstituted phenyl group, $R^2$ represents a cyano group, $R^3$ represents a substituted or unsubstituted alkyl group, and $R^4$ and $R^5$ represent a substituted or unsubstituted alkyl group.

<Colorant Compound Containing Repeating Unit Represented by Formula (Pb)>

A preferred embodiment is also a high-molecular weight azo colorant compound characterized in that the compound represented by Formula (1b) is a colorant compound in which a high-molecular weight compound-derived group may be bonded as the substituent represented by $R^1$ to $R^5$ in Formula (1b), and which contains a repeating unit represented by Formula (Pb).

The colorant compound (polymer-type dye) containing a repeating unit represented by Formula (Pb) is a high-molecular weight azo colorant compound which is a high-molecular weight compound characterized in that similarly to the compound represented by Formula (1b), a coupling component is an aminothiazole and a diazo component is an imidazole, and characterized by having at least one repeating unit having, in the side chain thereof, a residue obtained by removing one hydrogen atom from the compound represented by Formula (1b).

Among the specific azo colorant compounds, the high-molecular weight azo colorant compound containing a repeating unit represented by Formula (Pb) below can provide a colored curable composition which is particularly high in solubility in organic solvents, heat resistance and light resistance, and is excellent in stability over time and post-curing solvent resistance.

(Pb)

In Formula (Pb), $R^{P1}$, $R^{P2}$ and $R^{P3}$ each independently represent a hydrogen atom, or a monovalent substituent, and D represents a residue obtained by removing one hydrogen atom from a compound represented by Formula (1b).

In Formula (Pb), $R^{P1}$, $R^{P2}$, and $R^{P3}$ each independently represent a hydrogen atom or a monovalent substituent. Examples of the monovalent substituent represented by $R^{P1}$, $R^{P2}$, and $R^{P3}$ include a halogen atom, an alkyl group having a carbon number of 1 to 30 (in the present specification, which means a saturated aliphatic group, examples of which include a cycloalkyl group and a bicycloalkyl group), an alkenyl group having a carbon number of 2 to 30 (in the present specification, which means an unsaturated aliphatic group having a double bond, examples of which include a cycloalkenyl group and a bicycloalkenyl group), an alkynyl group having a carbon number of 2 to 30, an aryl group having a carbon number of 6 to 30, a heterocyclic group having a carbon number of 3 to 30, a cyano group, an aliphatic oxy group having a carbon number of 1 to 30, an aryloxy group having a carbon number of 6 to 30, an acyloxy group having a carbon number of 2 to 30, a carbamoyloxy group having a carbon number of 1 to 30, an aliphatic oxycarbonyloxy group having a carbon number of 2 to 30, an aryloxycarbonyloxy group having a carbon number of 7 to 30, an amino group having a carbon number of 0 to 30 (in the present specification, examples of which include an aliphatic amino group, an aryl amino group and a heterocyclic amino group), an acylamino group having a carbon number of 2 to 30, an aminocarbonylamino group having a carbon number of 1 to 30, an aliphatic oxycarbonylamino group having a carbon number of 2 to 30, an aryloxycarbonylamino group having a carbon number of 7 to 30, a sulfamoylamino group having a carbon number of 0 to 30, an aliphatic or aryl sulfonylamino group having a carbon number of 1 to 30, an aliphatic thio group having a carbon number of 1 to 30, a sulfamoyl group having a carbon number of 0 to 30, an aliphatic or aryl sulfinyl group having a carbon number of 1 to 30, an aliphatic or aryl sulfonyl group having a carbon number of 1 to 30, an acyl group having a carbon number of 2 to 30, an aryloxycarbonyl group having a carbon number of 7 to 30, an aliphatic oxycarbonyl group having a carbon number of 2 to 30, a carbamoyl group having a carbon number of 1 to 30, an aryl or heterocyclic azo group having a carbon number of 3 to 30, and an imido group, each of which may further have a substituent. Specific examples of these substituents are the same as $R^1$, $R^2$, and $R^3$ in Formula (1b). $R^{P1}$, $R^{P2}$, and $R^{P3}$ each independently represent preferably a hydrogen atom, a substituted or unsubstituted alkyl group, a substituted or unsubstituted aryl group, or a substituted or unsubstituted acyl group in terms of being capable of effectively exerting the effect of the present invention, more preferably a hydrogen atom or an unsubstituted alkyl group, and most preferably hydrogen or a methyl group.

Substituents in the residue D are preferably the same as the preferred substituents in Formula (1b), in terms of being capable of effectively exerting the effect of the present invention. Although the position(s) of hydrogen atom(s) to be removed may be at any position(s) when the residue D is obtained by removing hydrogen atom(s) from the colorant represented by Formula (1b), preferred are hydrogen atoms at $R^1$, $R^3$, $R^4$, and $R^5$, more preferred are hydrogen atoms at $R^1$, $R^4$, and $R^5$, and most preferred are hydrogen atoms at $R^4$ and $R^5$.

A preferred embodiment of the colorant compound containing a repeating unit represented by Formula (Pb) is a copolymerized high-molecular weight colorant compound containing a repeating unit represented by Formula (Pb) and a repeating unit having an acid group. As the colorant compound has a repeating unit with an acid group, the formation of a colored pattern according to a photolithographic method becomes easy.

Examples of the monomer for a copolymerization component used as the repeating unit having an acid group include a vinyl monomer having a carboxyl group, a vinyl monomer having a sulfonic acid group, and the like.

Examples of the vinyl monomer having a carboxyl group include (meth)acrylic acid, vinyl benzoic acid, maleic acid, maleic acid monoalkyl ester, fumaric acid, itaconic acid, crotonic acid, cinnamic acid, an acrylic acid dimer, and the like. In addition, there may also be used a product of addition reaction between a monomer having a hydroxyl group such as 2-hydroxyethyl(meth)acrylate and a cyclic anhydride such as maleic anhydride, phthalic anhydride, or cyclohexanedicarboxylic anhydride, ω-carboxypolycaprolactone mono(meth)acrylate, and the like. Further, as the carboxyl group precursor, an anhydride-containing monomer such as a maleic anhydride, an itaconic anhydride, or a citraconic anhydride can be used. Further, among them, (meth)acrylic acid is particularly preferable in terms of copolymerization properties, costs, solubility, and the like.

Further, examples of the vinyl monomer having a sulfonic acid group include 2-(meth)acrylamide-2-methylpropane sulfonic acid, and the like, and examples of the vinyl monomer having a phosphoric acid group include phosphoric acid mono(2-(meth)acryloyloxy ethylester), phosphoric acid mono(1-methyl-2-(meth)acryloyloxy ethylester), and the like.

The colorant compound containing a repeating unit represented by Formula (Pb) in the present invention preferably contains a repeating unit derived from a monomer having an acid group as described above. By inclusion of such a repeating unit, development removability of the unexposed parts is excellent.

The colorant compound containing a repeating unit represented by Formula (Pb) in the present invention may contain one or two or more repeating units derived from a monomer having an acid group.

An acid value of the colorant compound containing a repeating unit represented by Formula (Pb) is preferably in the range of 25 mgKOH/g to 200 mgKOH/g and particularly preferably 50 mgKOH/g to 200 mgKOH/g. That is, in terms of inhibiting the formation of precipitates in a developer solution, the acid value is preferably 25 mgKOH/g or more. In addition, in order to effectively inhibit the formation of secondary particles which is an aggregate of primary particles of a pigment or to effectively weaken cohesive force of secondary particles, the acid value is preferably in the range of 25 mgKOH/g to 200 mgKOH/g.

In addition, the acid value is determined by potentiometry (solvent: tetrahydrofuran/water=54/6 (volume ratio), and titrant: 0.01N sodium hydroxide aqueous solution (acid value)).

The colorant compound containing a repeating unit represented by Formula (Pb) may further contain a repeating unit derived from a copolymerizable vinyl monomer having another structure, as long as the effect of the invention is not impaired.

Although there is no particular limitation to the vinyl monomer that can be used herein, for example, preferred are (meth)acrylic acid esters, crotonic acid esters, vinyl esters, maleic acid diesters, fumaric acid diesters, itaconic acid diesters, (meth)acrylamides, vinyl ethers, styrenes, (meth)acrylonitriles, and the like. Specific examples of the vinyl monomer include the following compounds. In addition, when it represents either or both of "acrylic, methacrylic" in the present specification, the term "acrylic, methacrylic" may be described as "(meth)acrylic" in some cases.

Examples of (meth)acrylic acid esters include methyl (meth)acrylate, ethyl (meth)acrylate, n-propyl(meth)acrylate, isopropyl(meth)acrylate, n-butyl(meth)acrylate, isobutyl(meth)acrylate, t-butyl(meth)acrylate, n-hexyl(meth)acrylate, cyclohexyl (meth)acrylate, t-butyl cyclohexyl (meth)acrylate, 2-ethylhexyl(meth)acrylate, t-octyl (meth)acrylate, dodecyl(meth)acrylate, octadecyl(meth)acrylate, acetoxyethyl(meth)acrylate, phenyl(meth)acrylate, 2-hydroxyethyl(meth)acrylate, 2-methoxyethyl(meth)acrylate, 2-ethoxyethyl(meth)acrylate, 2-(2-methoxyethoxy)ethyl (meth)acrylate, 3-phenoxy-2-hydroxypropyl(meth)acrylate, benzyl(meth)acrylate, diethylene glycol monomethylether (meth)acrylate, diethylene glycol monoethylether (meth)acrylate, triethylene glycol monomethylether (meth)acrylate, triethylene glycol monoethylether (meth)acrylate, polyethylene glycol monomethylether (meth)acrylate, polyethylene glycol monoethylether (meth)acrylate, β-phenoxyethoxyethyl(meth)acrylate, nonyl phenoxy polyethylene glycol (meth)acrylate, dicyclopentenyl(meth)acrylate, dicyclopentenyloxyethyl(meth)acrylate, trifluoroethyl(meth)acrylate, octafluoropentyl(meth)acrylate, perfluorooctylethyl (meth)acrylate, dicyclopentanyl(meth)acrylate, tribromophenyl (meth)acrylate, tribromophenyloxyethyl(meth)acrylate, and the like.

Examples of crotonic acid esters include butyl crotonate, hexyl crotonate, and the like.

Examples of vinyl esters include vinyl acetate, vinyl propionate, vinyl butyrate, vinyl methoxy acetate, vinyl benzoate, and the like.

Examples of maleic acid diesters include dimethyl maleate, diethyl maleate, dibutyl maleate, and the like.

Examples of fumaric acid diesters include dimethyl fumarate, diethyl fumarate, dibutyl fumarate, and the like.

Examples of itaconic acid diesters include dimethyl itaconate, diethyl itaconate, dibutyl itaconate, and the like.

Examples of (meth)acrylamides include (meth)acrylamide, N-methyl (meth)acrylamide, N-ethyl(meth)acrylamide, N-propyl(meth)acrylamide, N-isopropyl(meth)acrylamide, N-n-butyl(meth)acrylamide, N-t-butyl(meth)acrylamide, N-cyclohexyl(meth)acrylamide, N-(2-methoxyethyl) (meth)acrylamide, N,N-dimethyl(meth)acrylamide, N,N-diethyl(meth)acrylamide, N-phenyl(meth)acrylamide, N-benzyl(meth)acrylamide, (meth)acryloyl morpholine, diacetone acrylamide, and the like.

Examples of the vinyl ethers include methylvinyl ether, butyl vinyl ether, hexyl vinyl ether, methoxyethyl vinyl ether, and the like.

Examples of the styrenes include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, hydroxystyrene protected by a group deprotectable with an acidic substance (for example, t-Boc, and the like), methyl vinyl benzoate, and α-methylstyrene, and the like.

The colorant compound containing a repeating unit represented by Formula (Pb) in accordance with the present invention preferably contains the repeating unit represented by Formula (Pb) in a molecule, in an amount of 20% by mass to 99.5% by mass based on the total mass of the colorant compound containing the repeating unit represented by Formula (Pb), and more preferably in an amount of 40% by mass to 95% by mass.

Further, the colorant compound containing a repeating unit represented by Formula (Pb) in accordance with the present invention preferably contains a repeating unit having an acid group in a molecule, in an amount of 1% by mass to 80% by mass, more preferably in an amount of 3% by mass to 50% by mass, based on the total mass of the colorant compound containing the repeating unit represented by Formula (Pb).

If a content of the repeating unit represented by Formula (Pb) and the repeating unit having an acid group is within the above-specified range, spectral characteristics and alkaline developability in a thin film are good.

A preferred molecular weight of the colorant compound containing a repeating unit represented by Formula (Pb) in the present invention is preferably in the range of 5000 to 100000 in terms of weight average molecular weight (Mw), and in the range of 2500 to 50000 in terms of number average molecular weight (Mn). More preferred is in the range of 10000 to 50000 in terms of weight average molecular weight (Mw), and in the range of 5000 to 30000 in terms of number average molecular weight (Mn).

Particularly, most preferred is in the range of 10000 to 30000 in terms of weight average molecular weight (Mw), and in the range of 5000 to 15000 in terms of number average molecular weight (Mn). From the viewpoint of developability when producing a color filter by the colored curable composition, a weight average molecular weight (Mw) is preferably 30000 or less.

Further, a weight average molecular weight (Mw) and a number average molecular weight (Mn) in the present invention refer to a value measured in terms of polystyrene, by a GPC method.

Hereinafter, specific examples of the colorant compound represented by Formula (M) and the colorant compound containing a repeating unit represented by Formula (Pb) will be illustrated, but the present invention is not limited thereto.

(Specific Examples of Colorant Compound Represented by Formula (M))

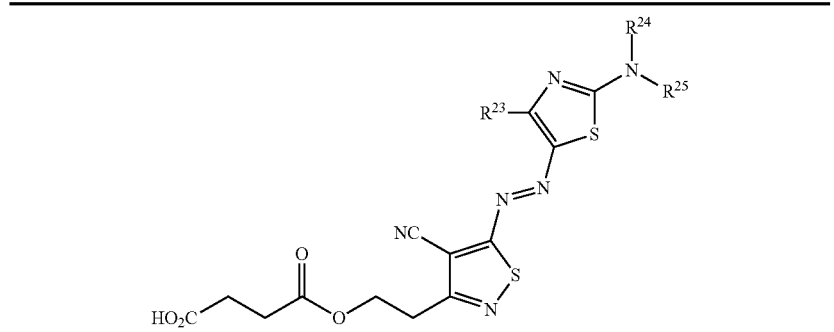

| Exemplified Compound | $R^{23}$ | $R^{24}$ | $R^{25}$ |
|---|---|---|---|
| 1b | $CH_3$ | $C_2H_5$ | $C_2H_5$ |
| 2b | $C_2H_5$ | $C_2H_5$ | $C_2H_5$ |
| 3b | $i-C_3H_7$ | $C_2H_5$ | $C_2H_5$ |
| 4b | $t-C_4H_9$ | $C_2H_5$ | $C_2H_5$ |
| 5b | $C_6H_5$ | $C_2H_5$ | $C_2H_5$ |
| 6b | (o-methylphenyl) | $C_2H_5$ | $C_2H_5$ |

-continued

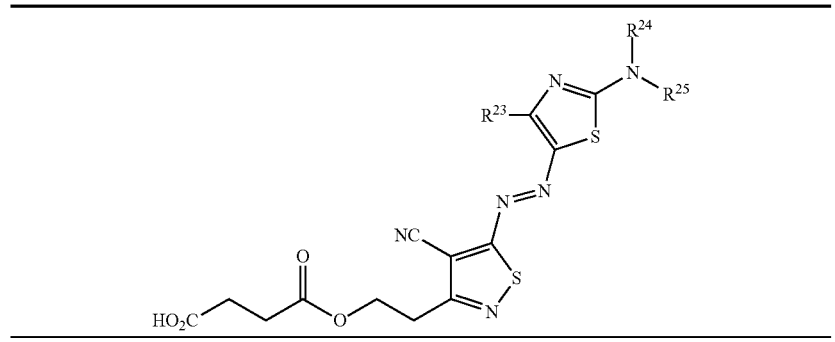

| Exemplified Compound | $R^{23}$ | $R^{24}$ | $R^{25}$ |
|---|---|---|---|
| 7b | 2-chlorophenyl | $C_2H_5$ | $C_2H_5$ |
| 8b | 2-pyridyl | $C_2H_5$ | $C_2H_5$ |
| 9b | 3-pyridyl | $C_2H_5$ | $C_2H_5$ |
| 10b | 4-pyridyl | $C_2H_5$ | $C_2H_5$ |
| 11b | 2-thienyl | $C_2H_5$ | $C_2H_5$ |
| 12b | 4-methoxyphenyl | $C_2H_5$ | $C_2H_5$ |
| 13b | 4-vinylphenyl | $C_2H_5$ | $C_2H_5$ |
| 14b | $-NH-C(=O)-t\text{-}C_4H_9$ | $C_2H_5$ | $C_2H_5$ |
| 15b | $t\text{-}C_4H_9$ | $C_2H_5$ | $C_2H_5$ |
| 16b | $t\text{-}C_4H_9$ | $i\text{-}C_3H_7$ | $i\text{-}C_3H_7$ |
| 17b | $t\text{-}C_4H_9$ | $n\text{-}C_6H_{13}$ | $n\text{-}C_6H_{13}$ |
| 18b | $t\text{-}C_4H_9$ | $CH_2CH=CH_2$ | $CH_2CH=CH_2$ |
| 19b | $t\text{-}C_4H_9$ | $CH_2CH=CH_2$ | $C_2H_5$ |
| 20b | $t\text{-}C_4H_9$ | $CH_2CH_2OH$ | $CH_2CH_2OH$ |
| 21b | $t\text{-}C_4H_9$ | $-CH_2\text{-phenyl}$ | $-CH_2\text{-phenyl}$ |
| 22b | $t\text{-}C_4H_9$ | $C_6H_5$ | H |
| 23b | $t\text{-}C_4H_9$ | $-(CH_2)_2O-C(=O)-CH_2CH_2-CO_2H$ | $C_2H_5$ |
| 24b | $t\text{-}C_4H_9$ | $-(CH_2)_2O-C(=O)-CH_2CH_2-CO_2H$ | $-(CH_2)_2O-C(=O)-CH_2CH_2-CO_2H$ |
| 25b | $t\text{-}C_4H_9$ | $-(CH_2)_2O-C(=O)-CH=CH_2$ | $C_2H_5$ |

-continued

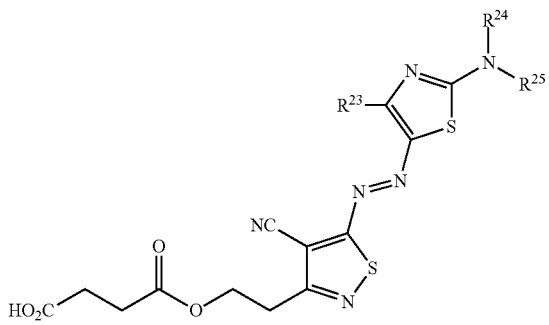

| Exemplified Compound | $R^{23}$ | $R^{24}$ | $R^{25}$ |
|---|---|---|---|
| 26b | t-$C_4H_9$ | —($CH_2$)$_2$O—C(=O)—CH=$CH_2$ | —($CH_2$)$_2$O—C(=O)—CH=$CH_2$ |
| 27b | t-$C_4H_9$ | —($CH_2$)$_2$O—C(=O)—C($CH_3$)=$CH_2$ | $C_2H_5$ |
| 28b | t-$C_4H_9$ | —($CH_2$)$_2$O—C(=O)—C($CH_3$)=$CH_2$ | —($CH_2$)$_2$O—C(=O)—C($CH_3$)=$CH_2$ |
| 29b | t-$C_4H_9$ | $CH_2CH_2OCH_3$ | $C_2H_5$ |
| 30b | t-$C_4H_9$ | $CH_2CH_2OCH_3$ | $CH_2CH_2OCH_3$ |

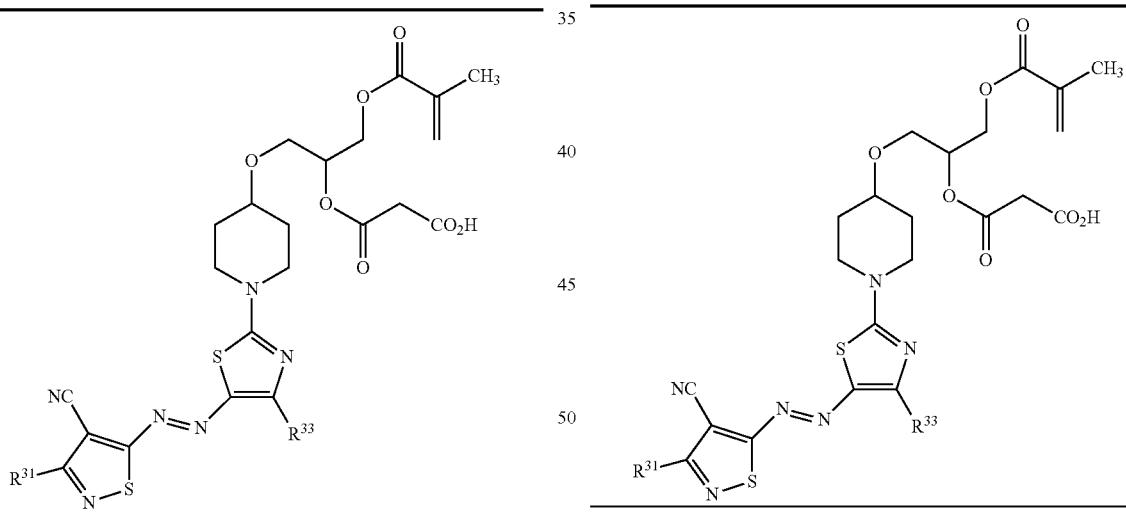

| Exemplified Compound | $R^{31}$ | $R^{33}$ |
|---|---|---|
| 31b | $CH_3$ | t-$C_4H_9$ |
| 32b | t-$C_4H_9$ | t-$C_4H_9$ |
| 33b | —$CH_2CH_2OCH_3$ | t-$C_4H_9$ |
| 34b | —($CH_2$)$_2$O—C(=O)—$CH_2CH_2$—$CO_2H$ | t-$C_4H_9$ |

| Exemplified Compound | $R^{31}$ | $R^{33}$ |
|---|---|---|
| 35b | —($CH_2$)$_2$O—C(=O)—C($CH_3$)=$CH_2$ | t-$C_4H_9$ |
| 36b | t-$C_4H_9$ | $C_6H_5$ |
| 37b | t-$C_4H_9$ | —NH—C(=O)—t-$C_4H_9$ |

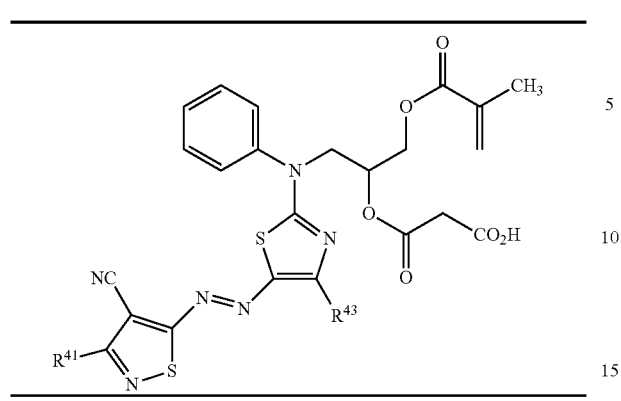

| Exemplified Compound | $R^{41}$ | $R^{43}$ |
|---|---|---|
| 38b | $CH_3$ | $t-C_4H_9$ |
| 39b | $t-C_4H_9$ | $t-C_4H_9$ |
| 40b | $-CH_2CH_2OCH_3$ | $t-C_4H_9$ |
| 41b | $-(CH_2)_2O-\underset{O}{\overset{\|}{C}}-CH_2CH_2-CO_2H$ | $t-C_4H_9$ |
| 42b | $-(CH_2)_2O-\underset{O}{\overset{\|}{C}}-\underset{CH_3}{\overset{\|}{C}}=CH_2$ | $t-C_4H_9$ |
| 43b | $t-C_4H_9$ | $C_6H_5$ |
| 44b | $t-C_4H_9$ | $-NH-\underset{O}{\overset{\|}{C}}-t-C_4H_9$ |

(Specific Examples of Colorant Compound Containing Repeating Unit Represented by Formula (Pb))

A and B of the following Exemplified Compounds (P1b) to (P100b) represent repeating units (A-1) to (A-20) and (B-1) to (B-27) of the following structures.

The following Exemplified Compounds (P1b) to (P100b) have a number average molecular weight (Mn) of 3,000 to 25,000, a weight average molecular weight (Mw) of 3,500 to 30,000, and a molecular weight distribution index (Mw/Mn) of 1.30 to 3.00.

(A-1)

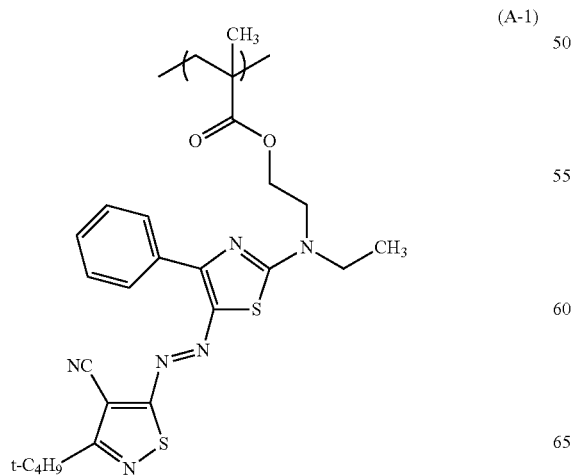

(A-2)

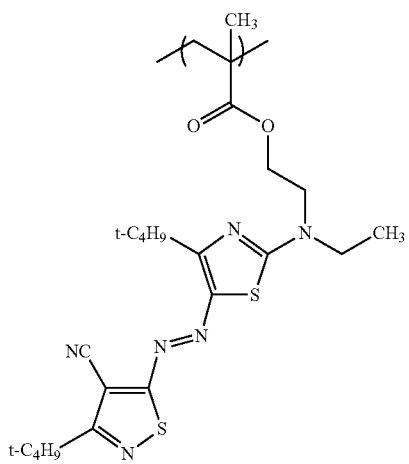

(A-3)

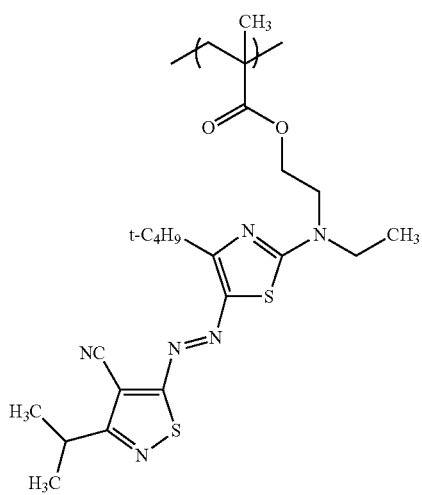

(A-4)

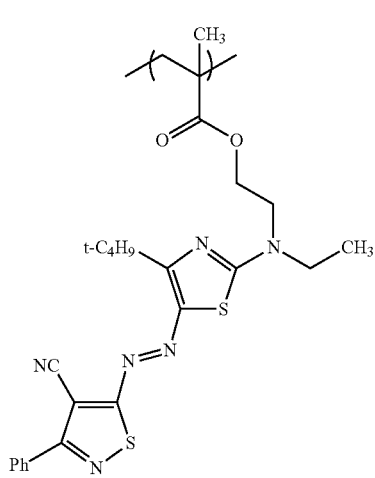

(A-5) 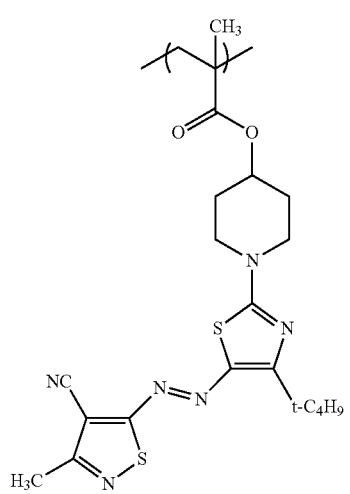
(A-6) 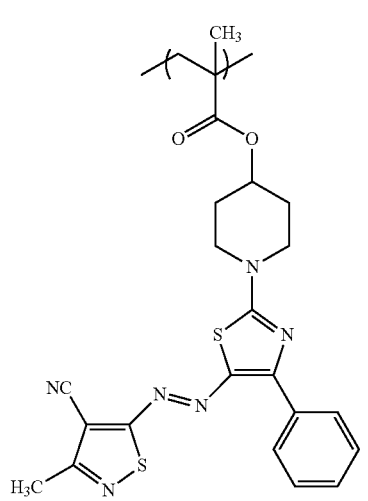
(A-7) 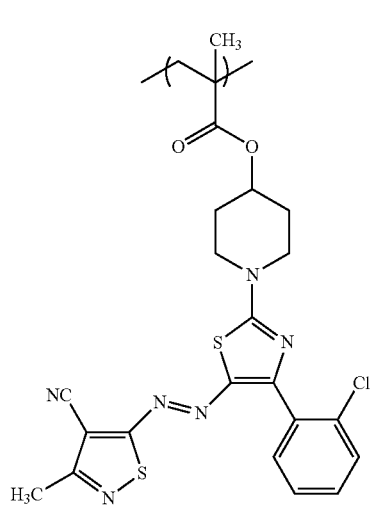
(A-8) 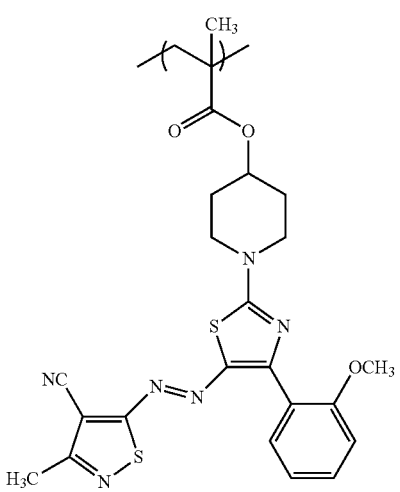
(A-9) 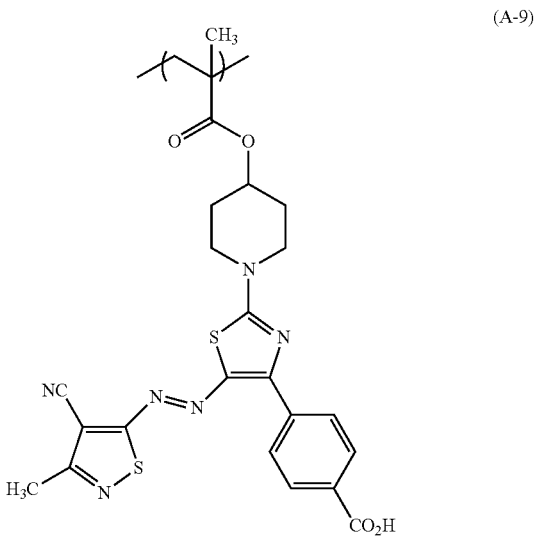
(A-10) 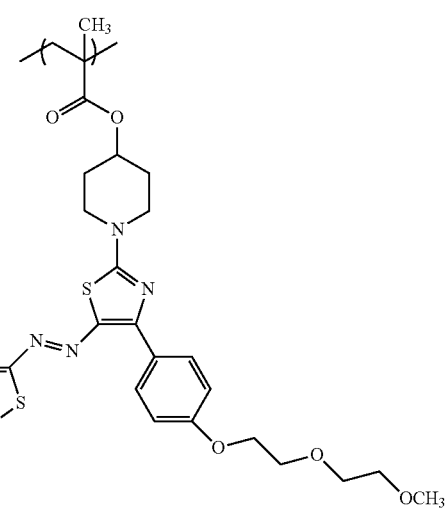

(A-11)
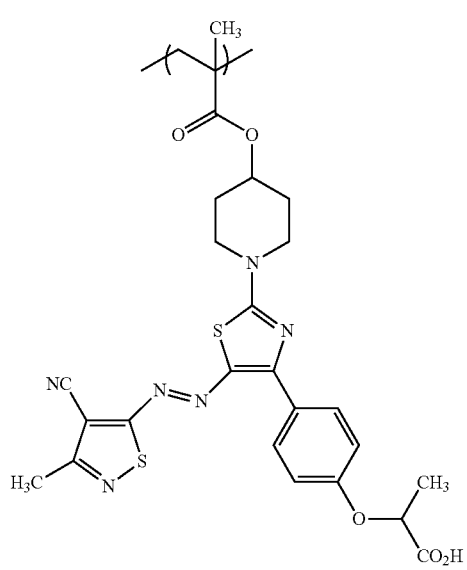
(A-12)
(A-13)
(A-14)
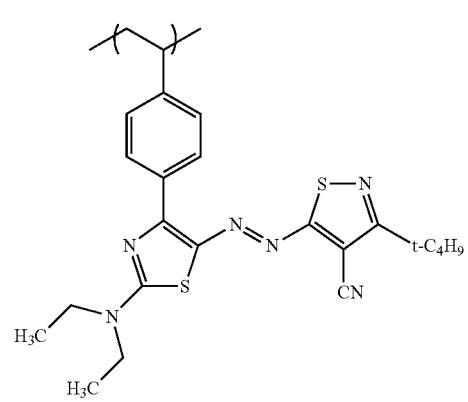
(A-15)
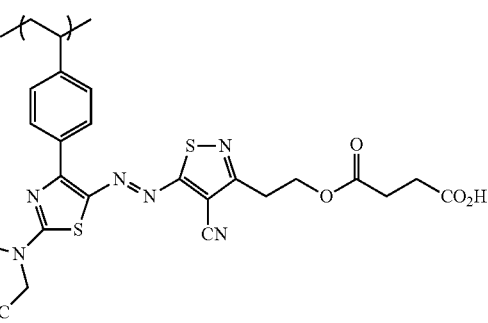
(A-16)
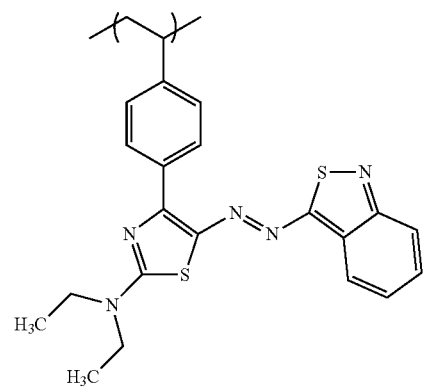
(A-17)
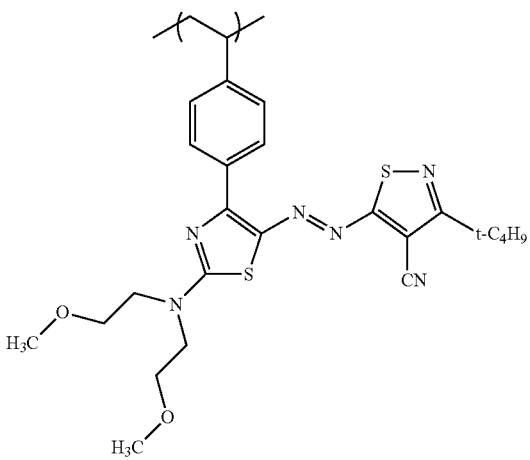

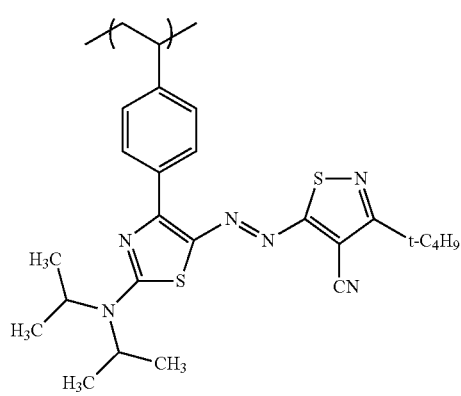
(A-18)
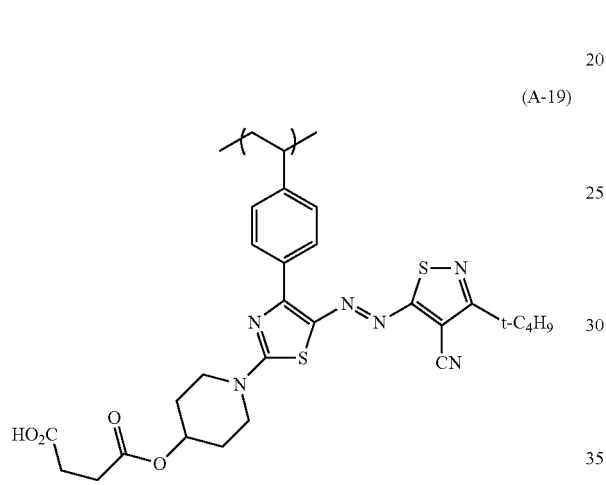
(A-19)
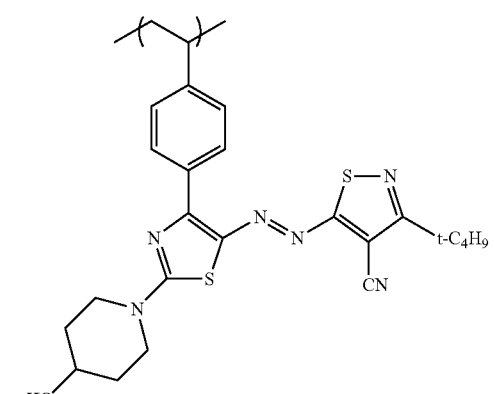
(A-20)
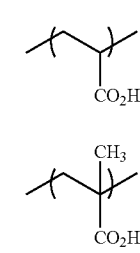
(B-1)
(B-2)
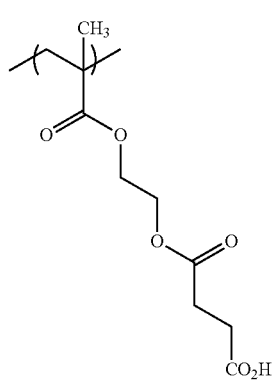
(B-3)
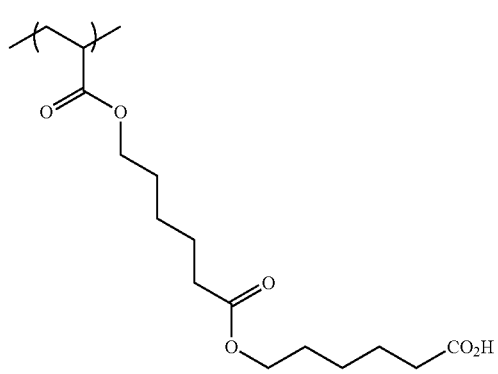
(B-4)
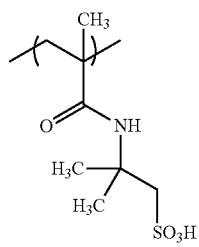
(B-5)
(B-6)
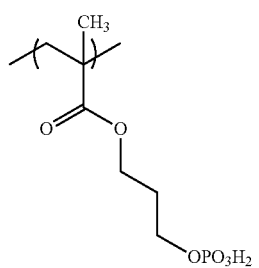
(B-7)

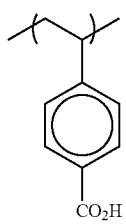 (B-8)
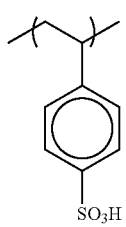 (B-9)
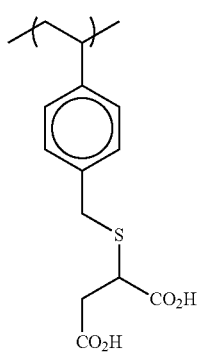 (B-10)
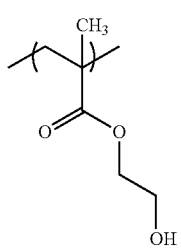 (B-11)
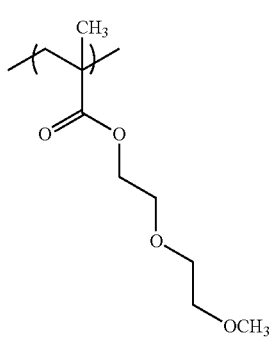 (B-12)
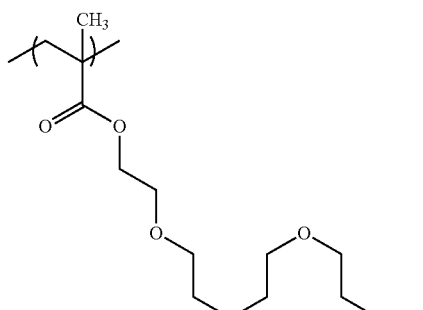 (B-13)
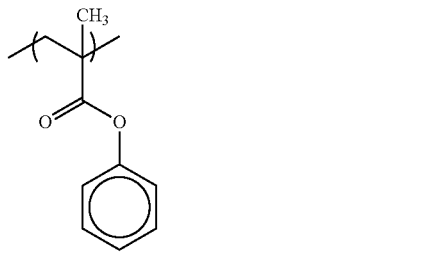 (B-14)
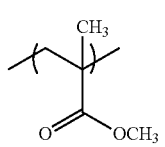 (B-15)
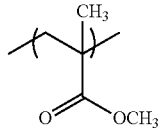 (B-16)
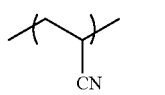 (B-17)
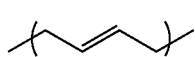 (B-18)
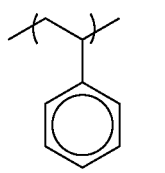 (B-19)
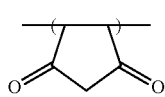 (B-20)
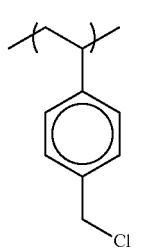 (B-21)

-continued (B-22) 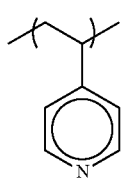

(B-23) 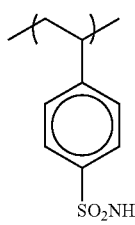

(B-24) 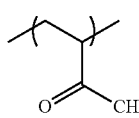

(B-25) 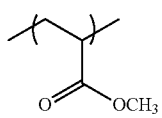

(B-26) 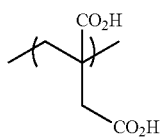

(B-27) 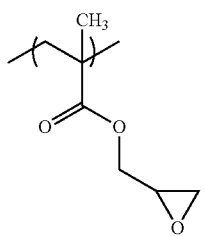

TABLE 1b

| Exemplified Compound | A Repeating Unit | % by mass | B Repeating Unit | % by mass |
|---|---|---|---|---|
| (P1b) | (A-1) | 80 | (B-2) | 20 |
| (P2b) | (A-2) | 80 | (B-2) | 20 |
| (P3b) | (A-3) | 80 | (B-2) | 20 |
| (P4b) | (A-4) | 80 | (B-2) | 20 |
| (P5b) | (A-5) | 80 | (B-2) | 20 |
| (P6b) | (A-6) | 80 | (B-2) | 20 |
| (P7b) | (A-7) | 80 | (B-2) | 20 |
| (P8b) | (A-8) | 80 | (B-2) | 20 |
| (P9b) | (A-9) | 80 | (B-2) | 20 |
| (P10b) | (A-10) | 80 | (B-2) | 20 |
| (P11b) | (A-11) | 80 | (B-2) | 20 |
| (P12b) | (A-12) | 80 | (B-2) | 20 |
| (P13b) | (A-13) | 80 | (B-2) | 20 |
| (P14b) | (A-14) | 80 | (B-2) | 20 |
| (P15b) | (A-15) | 80 | (B-2) | 20 |
| (P16b) | (A-16) | 80 | (B-2) | 20 |
| (P17b) | (A-17) | 80 | (B-2) | 20 |
| (P18b) | (A-18) | 80 | (B-2) | 20 |
| (P19b) | (A-19) | 80 | (B-2) | 20 |
| (P20b) | (A-20) | 80 | (B-2) | 20 |

TABLE 1b-continued

| Exemplified Compound | A Repeating Unit | % by mass | B Repeating Unit | % by mass |
|---|---|---|---|---|
| (P21b) | (A-1) | 85 | (B-2) | 15 |
| (P22b) | (A-1) | 70 | (B-2) | 30 |
| (P23b) | (A-1) | 60 | (B-2) | 40 |
| (P24b) | (A-1) | 90 | (B-2) | 10 |
| (P25b) | (A-1) | 83 | (B-2) | 17 |

TABLE 2b

| Exemplified Compound | A Repeating Unit | % by mass | B Repeating Unit | % by mass |
|---|---|---|---|---|
| (P26b) | (A-6) | 85 | (B-2) | 15 |
| (P27b) | (A-6) | 75 | (B-2) | 25 |
| (P28b) | (A-6) | 70 | (B-2) | 30 |
| (P29b) | (A-6) | 65 | (B-2) | 35 |
| (P30b) | (A-6) | 60 | (B-2) | 40 |
| (P31b) | (A-6) | 90 | (B-3) | 10 |
| (P32b) | (A-6) | 85 | (B-3) | 15 |
| (P33b) | (A-6) | 75 | (B-3) | 25 |
| (P34b) | (A-6) | 70 | (B-3) | 30 |
| (P35b) | (A-6) | 65 | (B-3) | 35 |
| (P36b) | (A-6) | 80 | (B-4) | 20 |
| (P37b) | (A-6) | 75 | (B-5) | 25 |
| (P38b) | (A-6) | 70 | (B-6) | 30 |
| (P39b) | (A-6) | 78 | (B-7) | 22 |
| (P40b) | (A-6) | 60 | (B-8) | 40 |
| (P41b) | (A-6) | 80 | (B-9) | 20 |
| (P42b) | (A-6) | 75 | (B-10) | 25 |
| (P43b) | (A-6) | 85 | (B-11) | 15 |
| (P44b) | (A-6) | 80 | (B-12) | 20 |
| (P45b) | (A-6) | 90 | (B-13) | 10 |
| (P46b) | (A-6) | 95 | (B-14) | 5 |
| (P47b) | (A-6) | 75 | (B-15) | 25 |
| (P48b) | (A-6) | 80 | (B-16) | 20 |
| (P49b) | (A-6) | 80 | (B-17) | 20 |
| (P50b) | (A-6) | 80 | (B-18) | 20 |

TABLE 3b

| Exemplified Compound | A Repeating Unit | % by mass | B Repeating Unit | % by mass |
|---|---|---|---|---|
| (P51b) | (A-2) | 82 | (B-2) | 18 |
| (P52b) | (A-3) | 81 | (B-10) | 19 |
| (P53b) | (A-4) | 75 | (B-15) | 25 |
| (P54b) | (A-5) | 89 | (B-3) | 11 |
| (P55b) | (A-5) | 70 | (B-20) | 30 |
| (P56b) | (A-6) | 68 | (B-19) | 32 |
| (P57b) | (A-7) | 50 | (B-4) | 50 |
| (P58b) | (A-8) | 80 | (B-5) | 20 |
| (P59b) | (A-9) | 85 | (B-16) | 15 |
| (P60b) | (A-10) | 82 | (B-7) | 18 |
| (P61b) | (A-11) | 90 | (B-10) | 10 |
| (P62b) | (A-12) | 95 | (B-10) | 5 |
| (P63b) | (A-13) | 98 | (B-20) | 2 |
| (P64b) | (A-14) | 55 | (B-11) | 45 |
| (P65b) | (A-15) | 65 | (B-4) | 35 |
| (P66b) | (A-16) | 83 | (B-5) | 17 |
| (P67b) | (A-17) | 83 | (B-13) | 17 |
| (P68b) | (A-18) | 83 | (B-12) | 17 |
| (P69b) | (A-18) | 83 | (B-9) | 17 |
| (P70b) | (A-18) | 90 | (B-1) | 10 |
| (P71b) | (A-18) | 90 | (B-8) | 10 |
| (P72b) | (A-18) | 90 | (B-6) | 10 |
| (P73b) | (A-19) | 90 | (B-4) | 10 |
| (P74b) | (A-19) | 85 | (B-6) | 15 |
| (P75b) | (A-20) | 85 | (B-3) | 15 |

TABLE 4b

| Exemplified Compound | A Repeating Unit | % by mass | B Repeating Unit | % by mass |
|---|---|---|---|---|
| (P76b) | (A-1) | 100 | — | — |
| (P77b) | (A-2) | 100 | — | — |
| (P78b) | (A-3) | 100 | — | — |
| (P79b) | (A-4) | 100 | — | — |
| (P80b) | (A-5) | 100 | — | — |
| (P81b) | (A-6) | 100 | — | — |
| (P82b) | (A-7) | 100 | — | — |
| (P83b) | (A-8) | 100 | — | — |
| (P84b) | (A-9) | 100 | — | — |
| (P85b) | (A-10) | 100 | — | — |
| (P86b) | (A-11) | 100 | — | — |
| (P87b) | (A-12) | 100 | — | — |
| (P88b) | (A-13) | 100 | — | — |
| (P89b) | (A-14) | 100 | — | — |
| (P90b) | (A-15) | 100 | — | — |
| (P91b) | (A-16) | 100 | — | — |
| (P92b) | (A-17) | 100 | — | — |
| (P93b) | (A-18) | 100 | — | — |
| (P94b) | (A-19) | 100 | — | — |
| (P95b) | (A-20) | 100 | — | — |
| (P96b) | (A-6) | 75 | (B-21) | 25 |
| (P97b) | (A-6) | 75 | (B-24) | 25 |
| (P98b) | (A-6) | 75 | (B-25) | 25 |
| (P99b) | (A-6) | 75 | (B-26) | 25 |
| (P100b) | (A-6) | 75 | (B-27) | 25 |

These azo colorant compounds can be easily synthesized according to the method described in U.S. Pat. No. 5,789,560, etc. That is, the azo colorant compound represented by Formula (1b) in the present invention can be synthesized by the commonly used diazocoupling.

Specifically, a 5-amino isothiazole derivative represented by the following Formula (A) is converted into a diazonium salt of the following Formula (B) using a diazotizing agent, and the resulting diazonium salt and a 2-aminothiazole derivative represented by the following Formula (C) are subjected to a coupling reaction to easily obtain a compound represented by the following Formula (D). Specifically, synthesis of the compound will be illustrated by way of examples.

Further, the colorant compound containing a repeating unit represented by Formula (Pb) can be synthesized by polymerization of the azo colorant compound represented by Formula (1b) using a conventional method.

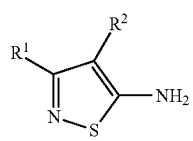
(A)

In Formula (A), $R^1$ and $R^2$ each independently represent a hydrogen atom or a monovalent substituent. Further, $R^1$ and $R^2$ may bond to each other to form a ring. Specific examples of the monovalent substituents represented by $R^1$ and $R^2$ are the same as those in Formula (1b).

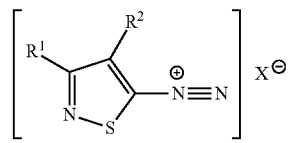
(B)

In Formula (B), $R^1$ and $R^2$ have the same definitions as $R^1$ and $R^2$ in Formula (A), respectively. $X^-$ represents a counter anion of a diazonium salt.

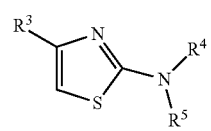
(C)

In Formula (C), $R^3$, $R^4$, and $R^5$ each independently represent a hydrogen atom or a monovalent substituent. In addition, $R^4$ and $R^5$ may bond to each other to form a ring. Specific examples of the monovalent substituents represented by $R^3$, $R^4$, and $R^5$ are the same as those in Formula (1b).

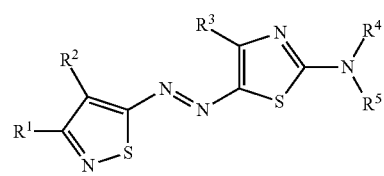
(D)

In Formula (D), $R^1$, $R^2$, $R^3$, $R^4$, and $R^5$ have the same definitions as $R^1$, $R^2$, $R^3$, $R^4$, and $R^5$ in Formulae (A) to (C), respectively.

The compound represented by Formula (A) can be synthesized by a conventional known method (for example, J. Chem. Soc. Perkin Trans. 1 (1984), vol. 2, pp 147-153, etc.).

The compound represented by Formula (C) can be synthesized by a conventional known method (for example, J. Heterocycle. Chem. (1975), pp 883-887, etc.).

Although a total concentration of a colorant compound represented by Formula (M) and a tautomer thereof, and a colorant compound containing a repeating unit represented by Formula (Pb) and a tautomer thereof in the colored curable composition varies depending on the molecular weight and molar absorption coefficient, the concentration is preferably in the range of 0.5 to 80% by mass based on the total solid components of the composition, more preferably in the range of 0.5 to 70% by mass, and particularly preferably in the range of 1 to 70% by mass.

In the colored curable composition of the present invention, the specific azo colorant compound and a colorant having another structure may be used in combination. There is no particular limitation to the colorant having another structure, and a known colorant conventionally used for a color filter can be used. For example, there are colorants described in JP-A No. 2002-14220, JP-A No. 2002-14221, JP-A No. 2002-14222, JP-A No. 2002-14223, U.S. Pat. Nos. 5,667, 920, 5,059,500, etc.

As the chemical structures, pyrazole azo dyes, anilinoazo dyes, triphenylmethane dyes, anthraquinone dyes, anthrapyridone dyes, benzylidene dyes, oxonol dyes, pyrazolotriazole azo dyes, pyridone azo dyes, cyanine dyes, phenothiazine dyes, pyrrolopyrazole azomethine dyes, xanthene dyes, phthalocyanine dyes, benzopyran dyes, indigo dyes or the like may be used.

A content of the colorant having another structure in the colored curable composition is preferably in the range of 0.1% by mass to 90% by mass based on the solid content of the colored curable composition, more preferably 1.0% by mass to 80% by mass, and particularly preferably 2.0% by mass to 70% by mass.

<Colored Curable Composition>

Hereinafter, a colored curable composition of the present invention will be described.

The colored curable composition of the present invention contains at least one selected from the group consisting of a colorant compound represented by Formula (M) and a tautomer thereof, or at least one selected from the group consisting of a colorant compound containing a repeating unit represented by Formula (Pb) and a tautomer thereof, and a polymerizable compound.

The polymerizable compound is polymerized or crosslinked by exposure to UV light of 400 nm or less or by heat, thereby insolubilizing the colored curable composition in a developer solution. In a photolithographic method, the exposed part and the unexposed part can be distinguished to form a pattern.

Further, in an ink-jet method, cured colored pixels can be obtained.

In order to further increase a curing reaction rate, the colored curable composition preferably contains a radical or acid-generating polymerization initiator. When pixels are formed by an ink-jet method, curing may also be carried out by heat, so the polymerization initiator is not essential, but it is preferred to use the initiator in the colored curable composition.

A content of the polymerization initiator in the colored curable composition is preferably in the range of 0.01 to 50% by mass, based on the solid content of the polymerizable compound, more preferably 1 to 30% by mass, and particularly preferably 1 to 20% by mass. If a content of the polymerization initiator is within the above-specified range, polymerization proceeds satisfactorily, and favorable film strength can be achieved.

Further, the colored curable composition may contain a binder, a surfactant, and other additives.

<Polymerizable compound>

The polymerizable compound may be a compound having a boiling point of 100° C. or higher at a normal pressure and having at least one addition-polymerizable ethylenically unsaturated group. Preferred is a compound having two or more ethylenically unsaturated groups, and still more preferred is a compound having three or more ethylenically unsaturated groups. Examples thereof include compounds described in paragraphs [0254] to [0257] of JP-A No. 2008-292970, paragraphs [0054] to [0068] of JP-A No. 2009-13206, and the like. One or more selected from a (meth)acrylic monomer, an epoxy monomer, and an oxetanyl monomer are preferably contained.

In particular, preferred is an acrylic compound having three or more acryloyl groups in a molecule thereof. Examples of such an acrylic compound include trimethylolethane tri(meth)acrylate, pentaerythritol tri(meth)acrylate, pentaerythritol tetra(meth)acrylate, dipentaerythritol hexa(meth)acrylate, trimethylolpropane tri(acryloyloxypropyl)ether, tri(acryloyloxyethyl)isocyanurate, a compound obtained by adding ethylene oxide, propylene oxide or caprolactone to a polyfunctional alcohol such as glycerin or trimethylolethane followed by (meth)acrylating, a poly(meth)acrylated product of pentaerythritol or dipentaerythritol, and the like.

A content of the polymerizable compound in the colored curable composition is preferably in the range of 0.1% by mass to 90% by mass, based on the solid content of the colored curable composition, still more preferably 1.0% by mass to 80% by mass, and particularly preferably 2.0% by mass to 70% by mass.

With regard to the first colored curable composition of the present invention, when n in Formula (M) is 1 or more, a colorant compound represented by Formula (M) and a tautomer thereof function as a polymerizable compound. In this case, a content ratio of the sum total of the colorant compound represented by Formula (M) and a tautomer thereof to the polymerizable compound other than the colorant compound represented by Formula (M) and a tautomer thereof is preferably in the range of 6:1 to 1:6 (by mass) and more preferably 5:1 to 1:2.

Particularly when the colored curable composition is used as an ink-jet ink, a content of the polymerizable compound is preferably in the range of 30% by mass to 80% by mass in the solid content of colored curable composition, and more preferably 40% by mass to 80% by mass. When the amount of the polymerizable compound to be used is within the above-specified range, a pixel portion is sufficiently polymerized, so that the following effects, for example, are obtained: scars caused by lack of film strength of the pixel portion do not easily occur; cracks or reticulations do not easily occur upon applying a transparent electroconductive film; solvent resistance is improved at the time of formation of an orientation film; and the voltage holding ratio is not lowered.

Here, the solid content of the colored curable composition, which is used to determine the mixing ratio, includes all of the components except the solvent, and thus liquid polymerizable compound(s) and the like, if any, are also included in the solid content.

Hereinafter, a colored curable composition to be used in the photolithographic method will be described. The colored curable composition of the present invention which is used in the formation of a colored pattern in accordance with a photolithographic method is suitable as a composition for color resist.

<Photopolymerization initiator>

The colored curable composition of the present invention preferably contains a photopolymerization initiator.

Although there is no particular limitation to the photopolymerization initiator as long as it can polymerize a polymerizable compound, the photopolymerization initiator is preferably selected from the viewpoint of characteristics, initiation efficiency, absorption wavelength, availability, costs, and the like.

Examples of the photopolymerization initiator include compounds described in paragraphs [0260] to [0271] of JP-A No. 2008-292970.

A content of the photopolymerization initiator in the colored curable composition is preferably in the range of 0.01 to 50% by mass, based on the solid content of the polymerizable compound, more preferably 1 to 30% by mass, and particularly preferably 1 to 20% by mass. If a content of the photopolymerization initiator is within the above-specified range, polymerization proceeds satisfactorily, and favorable film strength can be achieved.

<Binder>

Further, the colored curable composition preferably contains a binder. Although there is no particular limitation to the binder as long as it is alkali-soluble, the binder is preferably selected from the viewpoint of heat resistance, developability, availability, and the like.

The alkali-soluble binder is preferably a linear organic high-molecular weight polymer which is soluble in an organic solvent and is developable by a weak-alkali aqueous solution. The linear organic high-molecular weight polymer may be a polymer described in paragraphs [0227] to [0234] of JP-A No. 2008-292970.

A content of the binder in the colored curable composition is preferably in the range of 0.1% by mass to 50% by mass, based on the solid content of the colored curable composition, still more preferably 0.1% by mass to 40% by mass, and particularly preferably 0.1% by mass to 30% by mass.

<Crosslinking Agent>

A crosslinking agent may be preferably added to the colored curable composition. There is no particular limitation to the crosslinking agent, as long as it is capable of performing film curing through a crosslinking reaction. Examples of such a crosslinking agent include crosslinking agents described in paragraphs [0237] to [0253] of JP-A No. 2008-292970.

Where the colored curable composition contains a crosslinking agent, a content of the crosslinking agent is preferably in the range of 1 to 70% by mass based on the total solid content of the colored curable composition, more preferably 5 to 50% by mass, and particularly preferably 7 to 30% by mass. If a content of the crosslinking agent is within the above-specified range, a sufficient curing degree and dissolution property of the unexposed parts can be maintained. If a content of the crosslinking agent is insufficient, the curing degree of the exposed parts may be poor. On the other hand, if a content of the crosslinking agent is excessive, this may lead to a significant decrease in dissolution property of the unexposed parts.

<Solvent>

When preparing the colored curable composition of the present invention, the composition generally may contain a solvent. Basically, although there is no particular limitation to the solvent as long as it satisfies the solubility of respective components of the composition or the coatability of the colored curable composition, the solvent is preferably selected particularly taking into consideration solubility of the binder, coatability, and safety.

Examples of such a solvent include solvents described in paragraph [0272] of JP-A No. 2008-292970.

Among these solvents, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, propylene glycol methyl ether acetate, and the like are more preferred.

It is also preferable to mix two or more kinds of these organic solvents in view of the solubility of the ultraviolet absorbent and the alkali soluble resin, the improvement of the state of the surface to be coated, and the like. In this case, it is particularly preferable to use a mixture of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

<Polymerization Inhibitor>

In the colored curable composition of the invention, it is preferred that a small amount of a polymerization inhibitor be added in order to prevent unnecessary heat polymerization of the polymerizable compound during manufacture or storage of the colored curable composition.

Examples of the polymerization inhibitor useful in the invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butyl phenol), and N-nitrosophenylhydroxyamine cerous salt.

The addition amount of the polymerization inhibitor is preferably from about 0.01% to about 5% by mass with respect to the mass of the whole composition.

<Surfactant>

The colored curable composition of the invention may contain various surfactants from the viewpoint of improving the coatability. Examples of the surfactants which may be used in the invention include various surfactants such as a fluorine-containing surfactant, a nonionic surfactant, a cationic surfactant, an anionic surfactant, and a silicone-based surfactant.

In particular, when the colored curable composition of the invention contains a fluorine-containing surfactant, the liquid properties (in particular, fluidity) of the composition prepared as a coating liquid is improved, thereby enabling improvement in the uniformity of the coating thickness and the liquid saving.

That is, when a colored curable composition containing a fluorine-containing surfactant is used as a coating liquid to form a film, due to decrease in the surface tension between the surface to be coated and the coating liquid, the wettability on the surface to be coated is improved, so that the coatability on the surface to be coated is improved. As a result, even when a thin film of several micrometers is formed with a small amount of the liquid, a film with uniform thickness may be suitably formed.

The fluorine content in the fluorine-containing surfactant is preferably 3% by mass to 40% by mass, more preferably 5% by mass to 30% by mass, and particularly preferably 7% by mass to 25% by mass. A fluorine-containing surfactant having a fluorine content in this range is effective in the uniformity of the coating film thickness and the liquid saving, and has good solubility in the colored curable composition.

Examples of the fluorine-containing surfactant include MEGAFAC F171, F 172, F173, F176, F177, F141, F142, F143, F144, R30, F437, F475, F479, F482, F780 and F781 (manufactured by DIC Corporation), FLUORAD FC430, FC431 and FC171 (manufactured by Sumitomo 3M Limited), SURFLON S-382, SC-101, SC-103, SC-104, SC-105, SC1068, SC-381, SC-383, S393 and KH-40 (manufactured by Asahi Glass Co., Ltd.), and SOLSPERSE 20000 (manufactured by Zeneca).

Examples of the nonionic surfactant include polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan fatty acid ester (such as PLURONIC L10, L31, L61, L62, 10R5, 17R2 and 25R2, and TETRONIC 304, 701, 704, 901, 904 and 150R1, manufactured by BASF).

Examples of the cationic surfactant include a phthalocyanine derivative (trade name: EFKA-745, manufactured by Morishita & Co., Ltd.), an organosiloxane polymer (trade name: KP341, manufactured by Shin-Etsu Chemical Co., Ltd.), a (meth)acrylic acid based (co)polymer (trade names: POLYFLOW No. 75, No. 90, No. 95, manufactured by Kyoeisha Chemical Co., Ltd.), and W001 (trade name, manufactured by Yusho Co., Ltd.).

Examples of the anionic surfactant include W004, W005 and W017 (trade names, manufactured by Yusho Co., Ltd.).

Examples of the silicone-based surfactant include "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA", "TORAY SILICONE SH30PA" and "TORAY SILICONE SH8400" (trade names, manufactured by Dow Corning Toray Co., Ltd.), "TSF-4440", "TSF-4300", "TSF-4445", "TSF-4460" and "TSF-4452" (trade names, manufactured by Momentive Performance Materials Inc.), "KP341", "KF6001" and "KF6002" (trade names, manufactured by Shin-Etsu Chemical Co., Ltd.), and "BYK323" and "BYK330" (trade names, manufactured by BYK Chemie).

Only one surfactant may be used, or two or more surfactants may be used in combination.

<Various Additives>

The colored curable composition of the present invention may contain, if necessary, various additives, for example a filler, a high-molecular weight compound other than the above-mentioned one, a surfactant, an adhesion promoter, an antioxidant, an ultraviolet absorbent, an aggregation inhibitor, and the like. Examples of such additives include additives described in paragraphs [0274] to [0276] of JP-A No. 2008-292970.

<Preparation Method of Colored Curable Composition>

In connection with the preparation of the colored curable composition of the present invention, the aforementioned respective components of the composition may be mixed at the same time, or may be sequentially mixed after the respective components were dissolved in a solvent. Further, there is no particular limitation to the addition order or operation conditions associated with mixing of the components. All of the components may be simultaneously dissolved in a solvent to prepare a composition. Alternatively, if necessary, respective components may be appropriately dissolved to make two or more solutions, and when used (coated), these solutions may be mixed to prepare a composition.

The thus prepared composition may be preferably filtered through a filter having a pore diameter of 0.01 to 3.0 µm, and more preferably a pore diameter of 0.05 to 0.5 µm, and then used for desired applications.

The colored curable composition of the present invention can be suitably used in the formation of colored patterns of color filters or the like for use in liquid crystal displays (LCDs) or solid-state image pickup devices (for example, CCD, CMOS, etc.). In particular, the colored curable composition can be suitably used in the formation of color filters for solid-state image pickup devices such as CCD and CMOS.

The colored curable composition of the present invention is particularly suitable in forming a color filter for solid-state image pickup devices, in which a colored pattern is formed as a thin film with a minute size and in which a favorable rectangular cross-sectional profile is required.

Specifically, when a color filter-constituting pixel pattern size (a side length of the pixel pattern viewed from the substrate normal direction) is 2 µm or less (for example, 0.5 to 2.0 µm), a content of the coloring agent is increased, and line width sensitivity is deteriorated, thus resulting in narrowing of the DOF margin, which consequently tends to deteriorate the pattern formability. Such a tendency is pronounced particularly when a pixel pattern size is in the range of 1.0 to 1.7 µm (further, 1.2 to 1.5 µm). In addition, when it is a thin film having a thickness of 1 µm or less, the amount of components (other than coloring agents) contributing to photolithographic properties relatively decreases in the film, the amount of other components is further decreased due to the increase in the amount of the coloring agents, and the sensitivity is lowered, whereby a pattern in a low-exposure dose region is liable to peel. In this case, when a heat treatment such as postbaking is applied, thermal sagging readily takes place. These phenomena are remarkable particularly when a film thickness is in the range of 0.005 µm to 0.9 µm (further, 0.1 µm to 0.7 µm).

On the other hand, when the colored curable composition of the present invention is used, it is possible to prepare a color filter which is excellent in pattern formability and has a favorable cross section profile even at the above-mentioned pixel pattern size of 2 µm or less.

<Pattern Formation Method Using Colored Curable Composition>

A method of forming a color filter by a photolithographic method using the colored curable composition of the present invention is characterized by including the processes of coating the colored curable composition on a substrate to form a colored layer, patternwise-exposing the colored layer through a mask, and developing the colored layer after the patternwise-exposure to form a colored pattern. Specifically, there may be used, for example, the method described in paragraphs [0277] to [0284] of JP-A No. 2008-292970.

—Post-Curing Process—

In the present invention, after the process of forming a colored pattern by the above-mentioned development, a post-curing process for further curing the pattern is preferably carried out.

The post-curing process, which is carried out by heating and/or exposure (UV irradiation), further cures the resulting colored pattern, and can prevent dissolution of a coloered pattern in a process of forming a colored layer for the formation of the next-color pattern or other processes, and can improve the solvent resistance of pixels of the resulting color filter.

The post-curing process is preferably carried out by UV irradiation.

—Post-Curing Process (UV Irradiation)—

A UV irradiation process used in curing of the colored pattern by post-exposure irradiates ultraviolet light (UV light) to the colored pattern, which has undergone a development treatment in the pattern-forming process, in an irradiation dose [mJ/cm$^2$] that is 10-fold or higher than the exposure dose [mJ/cm$^2$] in the exposure treatment before the development treatment. By irradiation of UV light to the post-development colored pattern for a predetermined time between development treatment in the pattern-forming process and the heating treatment to be described hereinafter, it is possible to effectively prevent color transfer which may occur later when heated. If the irradiation dose in this process is less than 10 times the exposure dose in the exposure treatment before development, color transfer between the colored patterns (colored pixels) or between the upper and lower layers may be not prevented.

Among them, an irradiation dose of UV light is preferably from 12-fold to 200-fold of the exposure dose upon exposure in the pattern-forming process, and more preferably from 15-fold to 100-fold.

Although the post-exposure may be carried out by g-rays, h-rays, i-rays, KrF, ArF, UV light, an electron beam, X-rays, or the like, preferred are g-rays, h-rays, i-rays, or UV light, and particularly preferred is UV light. When irradiation of UV light (UV curing) is carried out, it is preferably carried out at a low temperature from 20° C. to 50° C. (preferably from 25° C. to 40° C.). The wavelength of UV light preferably includes a wavelength ranging from 200 to 300 nm. An irradiation time may be in the range of 10 to 180 seconds, preferably 20 to 120 seconds, and more preferably 30 to 60 seconds.

As a light source for irradiation of UV light, there may be used, for example, an ultra-high pressure mercury lamp, a high-pressure mercury lamp, a low-pressure mercury lamp, a DEEP UV lamp, or the like. Among them, it is preferred to irradiate light which contains light with a wavelength of 275 nm or less in the to-be-irradiated ultraviolet light and in which the irradiation illuminance [$mW/cm^2$] of light with a wavelength of 275 nm or less is 5% or more relative to the integrated irradiation illuminance of the entire wavelength range in the ultraviolet light. By ensuring that the irradiation illuminance of light with a wavelength of 275 nm or less in the ultraviolet light is 5% or more, it is possible to effectively enhance the inhibitory effects against the color transfer between colored pixels or to the upper and lower layers, and the light resistance improving effects. In view of these facts, it is preferable to use a light source that is different from the light source such as i-rays used for exposure in the pattern-forming process, specific examples of which include a high-pressure mercury lamp, a low-pressure mercury lamp, or the like. Among them, upon considering the above-mentioned reasons, the irradiation illuminance of light with a wavelength of 275 nm or less is prefeably 7% or more relative to the integrated irradiation illuminance of the entire wavelength range in the ultraviolet light. In addition, the upper limit of the irradiation illuminance of light with a wavelength of 275 nm or less is preferably 25% or less.

In addition, the term "integrated irradiation illuminance" refers to the sum (area) of illuminance of light of each wavelength contained in the irradiation light when a curve is plotted wherein illuminance (radiation energy passing through a unit area/unit time; [$mW/m^2$]) for each spectral wavelength is put on the ordinate and the wavelength [nm] of the light is put on the abscissa.

The integrated irradiation illuminance in the to-be-irradiated ultraviolet light in the UV irradiation process for post-exposure is preferably 200 $mW/cm^2$ or more. If the integrated irradiation illuminance is 200 $mW/cm^2$ or more, it is possible to effectively enhance the inhibitory effects against the color transfer between the colored pixels or toward the upper and lower layers and the light resistance improving effects. Among them, preferred is the range of 250 to 2000 $mW/cm^2$ and more preferred is the range of 300 to 1000 $mW/cm^2$.

Further, the post-heating is preferably carried out in a hot plate or oven at a temperature of 100° C. to 300° C., and more preferably 150° C. to 250° C. The post-heating time is preferably in the range of 30 seconds to 30000 seconds, and more preferably 60 seconds to 1000 seconds.

In the post-curing process, post-exposure and post-heating may be carried out in combination, and in this case, either of them may be carried out first, but the post-exposure is preferably carried out prior to the post-heating. This is to inhibit deformation of the shape due to thermal sagging or trailing of the pattern which may occur in the post-heating process, by accelerating the curing by post-exposure.

The thus obtained colored pattern constitutes pixels in the color filter. In the case of preparation of a color filter having multi-colored pixels, a color filter consisting of a desired number of hues can be manufactured by repeating the pattern-forming process (and curing process, if necessary) several times in accordance with a desired number of hues.

Hereinafter, a colored curable composition used in an ink-jet method will be described. The colored curable composition of the present invention which is used in the formation of a colored pattern in accordance with an ink-jet method is suitable as an ink-jet ink.

Particularly preferred embodiments of the configuration of the colored curable composition when it is used as an ink-jet ink are illustrated hereinbelow.

When the colored curable composition of the present invention is used as an ink-jet ink, the storage stability of ink is excellent, so aggregation or decomposition of ink is inhibited. Further, even upon continuous and intermittent jetting of ink, disorder of jetting such as non-jetting or flight bending of ink droplets does not readily takes place, and the jetting stability is excellent, and recovery properties after a given period of a pause, and further recovery properties upon the occurrence of non-jetting or the like are excellent.

With regard to the colored curable composition which is used as an ink-jet ink, a total content of the colorant compound represented by Formula (M) and a tautomer thereof, and the colorant compound containing a repeating unit represented by Formula (Pb) and a tautomer thereof in the colored curable composition is preferably in the range of 1 to 20% by mass based on the total amount of ink, and more preferably 5 to 15% by mass. If a content of the colorant compound is less than 1% by mass, a film thickness may become thicker in order to achieve an optical density necessary as a color filter. In this case, there is also a need to increase a thickness of a black matrix which is a partition wall, but such a black matrix is difficult to form. On the other hand, if a content of the colorant compound exceeds 20% by mass, the ink viscosity is increased, which may cause difficulty regarding jetting and difficulty regarding dissolution in a solvent.

<Solvent>

The colored curable composition as an ink-jet ink in accordance with the present invention (hereinafter, often referred to simply as "ink-jet ink") contains a solvent. Basically, although there is no particular limitation to the solvent as long as it satisfies the solubility of respective components or the boiling point of the solvent to be described hereinafter, the solvent is preferably selected particularly taking into consideration solubility of the binder to be described hereinafter, coatability, and safety. Specific examples of the solvent include solvents described in paragraphs [0030] to [0040] of JP-A No. 2009-13206.

A content of the solvent in the ink-jet ink of the present invention is preferably in the range of 30 to 90% by mass, based on the total amount of the ink composition, and still more preferably 50 to 90% by mass. When a content of the solvent is 30% by mass or more, the amount of an ink provided within one pixel is secured, so that an adequate wet-spreading of the ink is attained in the pixel. When a content of the solvent is 90% by mass or less, the amount of the components other than the solvent that are included in the ink and serve to form a functional film (pixel or the like, for example) can be kept above a predetermined amount. Thereby, when a color filter is formed, the amount of ink required for each pixel is not excessively large. For example, when an ink is deposited in a recessed part compartmented with partition walls by using an ink-jet method, ink flooding out of the recessed part and color mixing with adjacent pixels can be inhibited.

The ink-jet ink of the present invention preferably contains a solvent with a high boiling point among the aforementioned solvents, from the viewpoint of the jetting property of the ink from a nozzle and the wettability to the substrate. A solvent with a low boiling point readily vaporizes even on an ink-jet head, causing readily an increase in the ink viscosity, precipitation of solids, or the like on the head, and causing degradation of the jetting property. In addition, when ink wets and spreads on the substrate after reaching the substrate, the solvent vaporizes to increase the ink viscosity at the edge of the wet-spreading region. Thereby, wet-spreading is inhibited by a phenomenon known as "PINNING" in some cases.

A boiling point of the solvent used in the present invention is preferably in the range of 130 to 280° C. If a boiling point of the solvent is lower than 130° C., there may be a case which is undesirable from the viewpoint of the shape uniformity of pixels within the face. If a boiling point of the solvent is higher than 280° C., there may be a case which is undesirable from the viewpoint of removing the solvent by prebaking. In addition, a boiling point of the solvent means a boiling point under a pressure of 1 atm, and can be seen from physical characteristics tables of compound dictionaries (Chapman & Hall), etc. These may be used alone or in a combination of two or more thereof.

<Binder>

It is possible to use a binder in the ink-jet ink of the present invention, for the purpose of adjusting the viscosity, adjusting the ink hardness or the like. A binder that simply dries and solidifies may be used as the binder of the ink-jet ink. For example, the binder may be composed of only a resin or resins having no polymerizability per se. However, in order to impart sufficient strength, durability, and adhesion to a coating film, it is preferred to use a binder that can cure a pixel through polymerization after the formation of a pattern of the pixel on the substrate by an ink-jet method. For example, a binder that can be cured by polymerization may be used, such as a photocurable binder that can be polymerized and cured by an action of visible light, UV light, electron beam or the like, and a thermosetting binder that can be polymerized and cured by heating.

<Crosslinking Agent>

In the case of using an epoxy monomer (epoxy group-containing monomer) or a heat-curable binder resin, generally a crosslinking agent may be combined and compounded therewith. As the crosslinking agent, there may be appropriately used curing agents and accelerators described in Chapter 3 of "General Introduction to Epoxy Resins, Basic Edition I" (The Japan Society of Epoxy Resin Technology, published on Nov. 19, 2003). For example, a polyfunctional carboxylic acid anhydride or polyfunctional carboxylic acid can be used.

<Surfactant>

The ink jet ink of the present invention may further contain a surfactant. Suitable examples of the surfactant include surfactants described in paragraph [0021] of JP-A No. 7-216276, and in JP-A No. 2003-337424 and JP-A No. 11-133600. A content of the surfactant is preferably 5% by mass or less, based on the total amount of the colored curable composition and more preferably 0.1 to 5% by mass.

Other additives include additives described in paragraphs [0058] to [0071] of JP-A No. 2000-310706.

A content of the solvent in the ink-jet ink is preferably in the range of 30 to 90% by mass, based on the total amount of the ink-jet ink, and more preferably 50 to 85% by mass.

<Preparation Method of Ink-Jet Ink>

Preparation of the ink jet ink of the present invention can be carried out by applying a known preparation method of ink-jet ink. For example, the ink-jet ink can be prepared by dissolving the colorant compound represented by Formula (M) or the colorant compound containing a repeating unit represented by Formula (Pb) in a solvent, followed by dissolution of respective components (for example, a polymerizable compound, a binders, etc.) necessary for the ink-jet ink.

In order to prepare a solution of the polymerizable compound, when the solubility of a material to be used in the solvent is low, a treatment such as heating or ultrasonic treatment can be appropriately carried out within the range where the polymerizable compound does not cause polymerization reaction.

When the colorant compound represented by Formula (M) or the colorant compound containing a repeating unit represented by Formula (Pb) is dispersed in an aqueous medium, colored fine particles containing a compound represented by the Formula and an oil-soluble polymer may be dispersed in an aqueous medium as described in JP-A No. 11-286637, JP-A No. 2001-240763 (Japanese Patent Application No. 2000-78491), JP-A No. 2001-262039 (Japanese Patent Application No. 2000-80259), and JP-A No. 2001-247788 (Japanese Patent Application No. 2000-62370), or the compound represented by each Formula dissolved in a high-boiling point organic solvent may be dispersed in an aqueous medium as described in JP-A No. 2001-262018 (Japanese Patent Application No. 2000-78454), JP-A No. 2001-240763 (Japanese Patent Application No. 2000-78491), and JP-A No. 2001-335734 (Japanese Patent Application No. 2000-203856). As the specific method for dispersing the colorant compound represented by Formula (M) or the colorant compound containing a repeating unit represented by Formula (Pb) in an aqueous medium, the oil-soluble polymer to be used, the high-boiling point organic solvent, additives, and the amount thereof, those described in the foregoing patent publications may be preferably used. Alternatively, the compound represented by each Formula may be dispersed in a fine solid particle state. Upon dispersing, a dispersant or a surfactant can be used.

As the dispersing devices, there can be used a simple stirrer, an impeller stirring system, an in-line stirring system, a mill system (such as a colloid mill, a ball mill, a sand mill, an attritor, a roll mill, or an agitator mill), an ultrasonic system, a high-pressure emulsifying and dispersing system (high-pressure homogenizer; as specific commercially available devices, Gaulin Homogenizer, Microfluidizer, DeBEE2000, and the like). The details of the method for preparing the ink-jet ink are described in, other than the foregoing patents, JP-A No. 5-148436, JP-A No. 5-295312, JP-A No. 7-97541, JP-A No. 7-82515, JP-A No. 7-118584, JP-A No. 11-286637, and JP-A No. 2001-271003 (Japanese Patent Application No. 2000-87539), which can be applied to preparation of the ink-jet ink of the present invention.

<Physical Characteristics of Ink-Jet Ink>

Although the physical characteristics of the ink-jet ink according to the present invention are not particularly limited as long as they are within the range that allows jetting through an ink-jet head, the viscosity of the ink upon jetting thereof is preferably in the range of 2 to 30 mPa·s from the viewpoint of attaining stable jetting, and more preferably 2 to 20 mPa·s. In addition, when jetted by a machine, the temperature of the ink-jet ink is preferably kept substantially constant in the range of 20° C. to 80° C. When the temperature of the machine is high, the ink viscosity is lowered and jetting of an ink with a high viscosity is possible; however, a higher temperature may easily cause thermal denaturation and/or heat polymerization reaction of the ink in the head, or evaporation of the solvent on the surface of an ink-jetting nozzle, which easily leads to nozzle clogging. Therefore, the temperature of the machine is preferably in the range of 20° C. to 80° C.

Here, the viscosity is measured with a commonly used E-type viscometer (for example, RE-80L E-type viscometer manufactured by Told Sangyo Co., Ltd.), while the ink-jet ink is kept at 25° C.

The surface tension (static surface tension) of the ink-jet ink at 25° C. is preferably in the range of 20 mN/m to 40 mN/m from the viewpoint of improving the wettability to the non-penetrative substrate and the jetting stability, and more preferably 20 mN/m to 35 mN/m. When jetted by a machine, it is preferable to maintain the temperature of the ink-jet ink substantially constant in the range of from 20° C. to 80° C., and the surface tension at that time is preferably set within a range of from 20 mN/m to 40 mN/m. In order to keep the temperature of the ink-jet ink constant with a certain accuracy, an ink temperature detection device, an ink heating or cooling device, and a controlling device that regulates heating or cooling in accordance with the detected ink temperature may preferably be equipped. Alternatively, it is also preferable to provide a device that regulates the energy applied to the device jetting the ink in accordance with the ink temperature and reduces the influence from the change in ink characteristics.

The surface tension is measured with a commonly used surface tension meter (for example, a surface tension meter FACE SURFACE TENSIOMETER CBVB-A3 manufactured by Kyowa Interface Science Co., Ltd.), using the Wilhermy method at a liquid temperature of 25° C. and 60% RH.

In order to appropriately keep the wet-spreading form after the ink jet ink is deposited on a substrate, it is preferable to maintain predetermined liquid properties of the ink-jet ink after it is deposited on the substrate. For this purpose, it is preferable to maintain the substrate and/or the vicinity of the substrate within a predetermined temperature range. Alternatively, it is also effective to reduce the influence from temperature change by, for example, increasing the heat capacity of a table supporting the substrate.

<Color Filter and Method of Producing the Same>

Although there is no particular limitation to the method of producing a color filter by an ink-jet method using the ink-jet ink of the present invention, there can be used, for example, the method described in paragraphs [0114] to [0128] of JP-A No. 2008-250188.

<Use of color filter of present invention>

The color filter of the present invention has a colored pattern formed by using the colored curable composition of the present invention, and may further include an indium tin oxide (ITO) layer as a transparent conductive film. Examples of the method of forming the ITO layer include an in-line low temperature sputtering method, an in-line high temperature sputtering method, a batchwise low-temperature sputtering method, a batchwise high-temperature sputtering method, a vacuum deposition method, a plasma CVD method, and the like. Particularly the low-temperature sputtering method is preferably used because it reduces damage to the color filter.

The color filter of the present invention can be suitably used without particular limitation, for example, for applications to image display devices (particularly color image displays) such as liquid crystal displays, organic EL displays, liquid crystal projectors, game machines, portable terminals such as mobile phones, digital cameras and car navigators. The image display device of the present invention is provided with the color filter of the present invention. In addition, the color filter of the present invention can be suitably used as a color filter for solid-state image pickup devices such as CCD image sensors and CMOS image sensors used in digital cameras, digital video cameras, endoscopes, mobile phones, and the like. In particular, the color filter is suitable for CCD devices or CMOS devices of high resolution, which may contain more than one million pixels. The configuration of the solid-state image pickup device is not limited as long as it functions as a solid-state image pickup device and includes the color filter of the present invention, but for example, the following configuration is possible. That is, there is a configuration in which a photodiode constituting a light-receiving area and a transfer electrode formed of polysilicon or the like are provided on a substrate, a color filter layer is provided thereon, and then a microlens is stacked thereon.

From the viewpoint of light-induced discoloration of color material, it is preferred that a camera system with the color filter of the present invention is provided with a cover glass, a microlens, and the like in which a camera lens or an IR-cut film is dichroic-coated, and the materials thereof have optical properties of partially or completely absorbing UV light of 400 nm or less. Further, in order to inhibit oxidative discoloration of the color material, a structure of the camera system is preferably configured to have a structure wherein oxygen permeability to the color filter is reduced. For example, the camera system is preferably partially or completely sealed with nitrogen gas.

Although the colored curable composition, the color filter and the method for preparing the same, and the image display device and solid-state image pickup device using the same, and the like in accordance with the second aspect of the invention have been described in detail by way of various embodiments, the present invention is not limited to those embodiments, and it should be understood that various modifications and alterations are possible without departing from the scope of the invention.

EXAMPLES

Hereinafter, the present invention will be further described in detail with reference to the following examples. Materials, reagents, ratios, instruments, operations, and the like given in the following examples may be appropriately modified without departure from the scope of the present invention. Therefore, the present invention is by no means limited to the following specific examples. In the following examples, "%" and "part(s)" refer to "% by mass" and "part(s) by mass" respectively, and "molecular weight" refers to "weight average molecular weight", unless otherwise specifically indicated.

Synthesis Example 1a

<Synthesis of Exemplified Compounds 6a>

In accordance with the following synthesis scheme, Exemplified Compound 6a was synthesized by the following method.

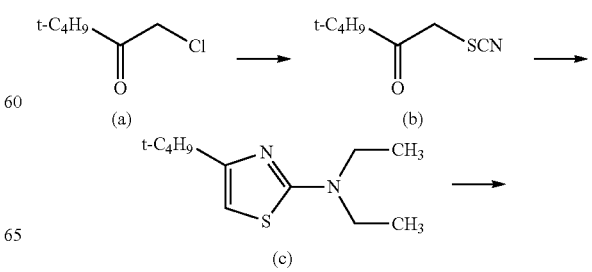

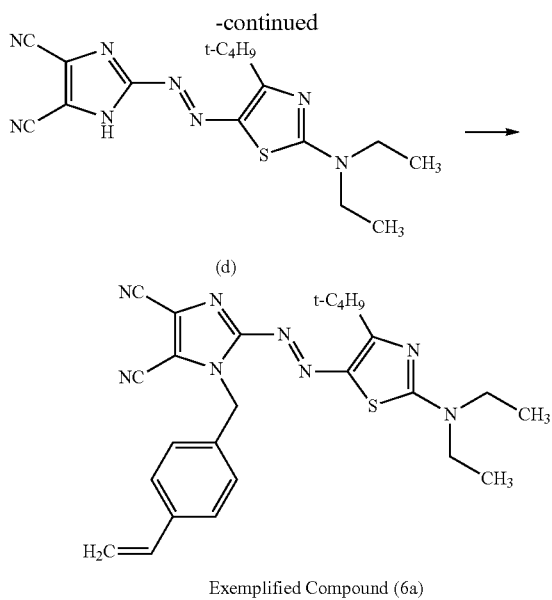

Exemplified Compound (6a)

<Synthesis of Intermediate (b)>

To a reaction container were added 120.5 g (1.48 mol) of sodium thiocyanate and 280 mL of methanol, and an internal temperature of the reaction container was warmed to 55° C. 200 g (1.48 mol) of 1-chloro pinacolone (a) was added dropwise thereto over 30 minutes. After the dropwise addition was completed, the mixture was reacted at an internal temperature of 55° C. for 2 hours. After the reaction was completed, an internal temperature was cooled to 10° C., and 250 mL of water was added, followed by stirring at 10° C. for 30 minutes. Then, crystals were separated by filtration to afford 218 g (yield: 94%) of an intermediate (b) as white crystals. Mass analysis results: (m/z)=158 ([M+1]$^+$, 100%).

<Synthesis of Intermediate (c)>

To a reaction container were added 157 g (1 mol) of the intermediate (b), 800 mL of toluene, and 28.6 mL of acetic acid, and an internal temperature thereof was warmed to 80° C. 104 mL of diethyl amine was gradually added dropwise thereto over 30 minutes. After the dropwise addition was completed, the mixture was reacted at an internal temperature of 80° C. for 3 hours. After the reaction was completed, an internal temperature was cooled to 30° C., and water 500 mL was added to wash a toluene layer. The toluene layer was extracted with 1N hydrochloric acid (2×500 mL). The extract was neutralized with sodium hydroxide, followed by another extraction with ethyl acetate. The extract was dried over magnesium sulfate and concentrated using a rotary evaporator to afford 106 g (yield: 50%) of an intermediate (c) as a pale yellow liquid. Mass analysis results: (m/z)=212 (M$^+$, 100%).

<Synthesis of Intermediate (d)>

(Synthesis of Diazonium Salt)

To a reaction container were added 59.8 g (0.188 mol) of 40% nitrosyl sulfuric acid, 100 mL of acetic acid, and 75 mL of propionic acid, and an internal temperature thereof was cooled to 0° C. 25 g (0.188 mol) of 2-amino imidazole-3,4-dicarbonitrile was added portionwise thereto, followed by stirring at an internal temperature of 0 to 5° C. for 2 hours.

(Coupling Reaction)

To another flask were added 39.9 g (0.188 mol) of the intermediate (c), 350 mL of methanol, and 300 g of sodium acetate, and an internal temperature thereof was cooled to 0° C. The thus synthesized diazonium salt dispersion was gradually added dropwise thereto while maintaining an internal temperature of 10° C. or lower. After the dropwise addition was completed, the mixture was reacted at an internal temperature 0 to 5° C. for 1 hour, and then at room temperature for 1 hour. After the reaction was completed, water 400 mL was added thereto, followed by stirring at room temperature for 60 minutes. Crystals were separated by filtration, and washed with warm water to afford 62 g (yield: 93%) of an intermediate (d) as red crystals. Mass analysis results: (m/z)=357 ([M+1]$^+$, 100%).

<Synthesis of Exemplified Compound 6a>

To a 300 mL three-neck flask were added 14.2 g (0.04 mol) of an intermediate (d), 4-vinyl benzyl chloride (0.044 mol), 16.6 g (0.12 mol) of potassium carbonate, 18 g (0.12 mol) of sodium iodide, 100 mL of N,N-dimethylacetamide, and 0.2 mL of nitrobenzene, and the mixture was reacted at an internal temperature 50° C. for 2 hours. After the reaction was completed, the reaction liquid was allowed to cool to room temperature and 400 mL of water was added thereto, followed by extraction with 300 mL of ethyl acetate. The extract was washed with aqueous sodium bicarbonate and dried over magnesium sulfate. 5 mg of methoxyphenol was added thereto, followed by concentration to dryness using a rotary evaporator. The resulting residue was suspended and washed with 75 mL of methanol, and crystals were separated by filtration to afford 16.1 g (yield: 85%) of Exemplified Compound 6a with metallic gloss as green crystals. Mass analysis results: (m/z) 473 ([M+1]$^+$, 100%). The absorption maximum wavelength in an absorption spectrum of Exemplified Compound 6a in ethyl acetate was 496.4 nm.

<Synthesis of Exemplified Compounds 2a, 4a, 5a, 7a to 12a, 20a, 44a, 71a to 73a, 75a to 77a, 83a, 85a, 89a, 92a, 94a, 95a, 97a, 115a, and 117a>

Exemplified Compounds 2a, 4a, 5a, 7a to 12a, 20a, 44a, 71a to 73a, 75a to 77a, 83a, 85a, 89a, 92a, 94a, 95a, 97a, 115a, and 117a were synthesized by a method in accordance with the above-mentioned Synthesis Example.

In addition, Exemplified Compounds other than Exemplified Compounds 2a, 4a, 5a, 7a to 12a, 20a, 22a, 44a, 71a to 73a, 75a to 77a, 83a, 85a, 89a, 92a, 94a, 95a, 97a, 115a, and 117a can also be synthesized by a method in accordance with the above-mentioned Synthesis Example, from the viewpoint of chemistry.

[Synthesis Example 2a]

<Synthesis of Exemplified Compounds 22a and P26a>

In accordance with the following synthesis scheme, Exemplified Compounds 22a and P26a were synthesized by the following procedure.

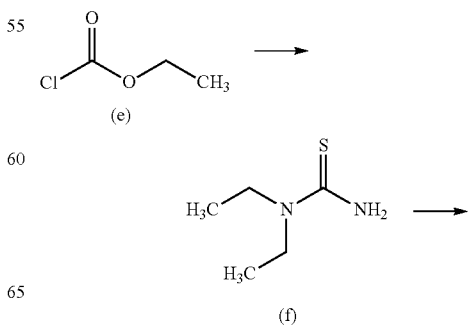

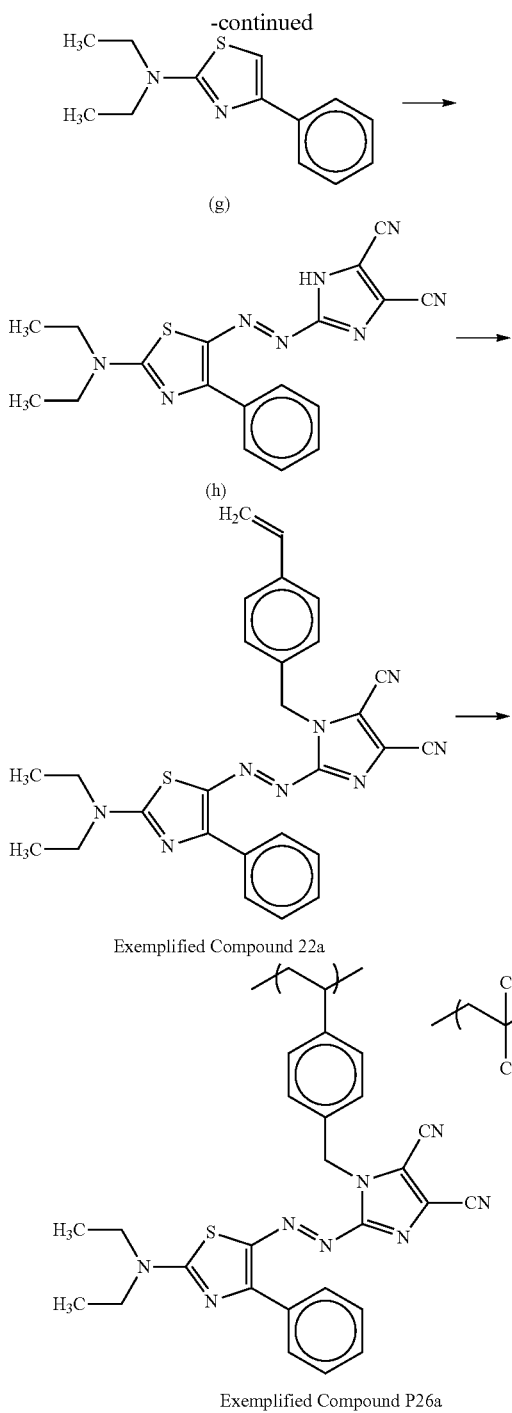

Exemplified Compound 22a

Exemplified Compound P26a

<Synthesis of Intermediate (f)>

To a 3000 mL three-neck flask were added 81.1 g (1.0 mol) of sodium thiocyanate, 800 mL of acetonitrile, and 2 mL of pyridine, and the mixture was cooled to an internal temperature of 5° C. under a nitrogen atmosphere. 119 g (1.1 mol) of ethyl chloroformate (Compound (e) of the above-mentioned synthesis scheme) was gradually added dropwise thereto. After the dropwise addition was completed, the mixture was reacted at room temperature for 2 hours. The reaction liquid was cooled to an internal temperature of 5° C. or lower, and 87.8 g (1.2 mol) of diethyl amine was gradually added dropwise thereto at an internal temperature of 10° C. or lower. After the dropwise addition was completed, the reaction liquid was reacted at room temperature for 1 hour. 2000 mL of water was added thereto, followed by extraction with 1000 mL of ethyl acetate. The extract was concentrated by a rotary evaporator, and 300 mL of water and 60 mL (1.2 mol) of hydrazine monohydrate were added thereto, followed by reaction at 50° C. for 4 hours. This reaction liquid was water-cooled, to which 300 mL of saturated brine was infused, followed by crystallization. Crystals were separated by filtration, and washed sufficiently with water to afford 87 g (yield: 66%) of an intermediate (f) N,N-diethylthiourea as white crystals. Mass analysis results: (m/z)=133 ([M+1]+, 100%).

<Synthesis of Intermediate (g)>

To a 2000 mL three-neck flask were added 66.5 g (0.5 mol) of the intermediate (f), 650 mL of isopropyl alcohol, and 77.3 g (0.5 mol) of phenacyl chloride, followed by heating under reflux for 1 hour, and the reaction liquid was allowed to cool. To another 5000 mL beaker was added 2000 mL of water, and the reaction liquid was infused thereto, followed by neutralization with sodium hydrogen carbonate. After extraction with 1000 mL of ethyl acetate, the extract was washed with saturated brine, and then concentrated by a rotary evaporator to afford 112 g (yield: 97%) of an intermediate (g) as a pale yellow liquid. Mass analysis results: (m/z)=233 ([M+1]+, 100%).

<Synthesis of Intermediate (h)>

(Synthesis of Diazonium Salt)

To a 500 mL three-neck flask was added 80 mL of concentrated sulfuric acid, and 12.9 g (0.188 mol) of sodium nitrite was added portionwise thereto under ice-cooling, followed by stirring at an internal temperature 65° C. for 30 minutes. An internal temperature was cooled to 10° C. or lower, and 100 mL of acetic acid and 66 mL of propionic acid were gradually added dropwise at an internal temperature of 20° C. or lower. An internal temperature was cooled to 5° C. or lower, and 25 g (0.188 mol) of 2-amino-1H-imidazole-4,5-dicarbonitrile was added, followed by stirring at an internal temperature 0 to 5° C. for 1 hour.

(Coupling Reaction)

To another flask were added 43.6 g (0.188 mol) of the intermediate (g), and 250 mL of methanol, followed by cooling to an internal temperature of 0° C. The reaction liquid of the thus synthesized diazonium salt was gradually added dropwise thereto while maintaining an internal temperature of 10° C. or lower. After the dropwise addition was completed, the mixture was reacted at an internal temperature of 0 to 5° C. for 1 hour, and then at room temperature for 1 hour. After the reaction was completed, 400 mL of water was added, followed by stirring at room temperature for 60 minutes, and crystals were separated by filtration and washed with hexane/methanol (volume ratio: 8/2) to afford 67.2 g (yield: 95%) of an intermediate (h) as red crystals. Mass analysis results: (m/z)=377 ([M+1]+, 100%).

<Synthesis of Exemplified Compound 22a>

To a 300 mL three-neck flask were added 28.2 g (0.075 mol) of the intermediate (h), 13.7 g (0.090 mol) of 4-chloromethylstyrene, 31.1 g (0.225 mol) of potassium carbonate, 33.8 g (0.225 mol) of sodium iodide, and 180 mL of N,N-dimethylacetamide, followed by reaction at an internal temperature of 50° C. for 2 hours. The reaction liquid was infused to 1000 mL of water, and precipitated crystals were separated by filtration and washed with methanol to afford 30.4 g (yield: 82%) of Exemplified Compound 22a with metallic gloss as green crystals. Mass analysis results: (m/z)=492 ([M+1]+, 100%). The absorption maximum wavelength in an absorption spectrum of Exemplified Compound 22a in ethyl acetate was 521 nm.

<Synthesis of Exemplified Compound P26a>

To a 100 mL three-neck flask were added 4.00 g (0.0081 mol) of the thus obtained Exemplified Compound 22a, 0.70 g (0.0081 mol) of methacrylic acid, and 10.97 g of cyclohexanone, followed by warming to an internal temperature of 85° C. under a nitrogen atmosphere. While maintaining an internal temperature at 85° C., 112 mg of V-601 (trade name, manufactured by Wako Pure Chemical Industries, Ltd.) was added thereto every 2 hours three times in total. After the reaction was completed, the reaction liquid was warmed to an internal temperature of 90° C., followed by stirring for 2 hours to decompose the unreacted V-601. The reaction liquid was allowed to cool, and re-precipitated with 200 mL of water/methanol (volume ratio: 10/90) to afford 4.20 g (yield: 89%) of an Exemplified Compound P26a as a red powder. Molecular weight analysis results (GPC): number average molecular weight Mn=6,300, weight average molecular weight Mw=9,870, and molecular weight distribution index Mw/Mn=1.57. The absorption maximum wavelength in an absorption spectrum of Exemplified Compound P26a in ethyl acetate was 520 nm.

<Synthesis of Exemplified Compounds P2a, P5a, P31a, P36a, P39a, P40a, P47a, P77a, and P81a>

Exemplified Compounds P2a, P5a, P31a, P36a, P39a, P40a, P47a, P77a, and P81a were synthesized by a method in accordance with the above-mentioned synthesis method. In addition, Exemplified Compounds P1a to P100a other than Exemplified Compounds P2a, P5a, P31a, P36a, P39a, P40a, P47a, P77a, and P81a can also be synthesized by a method in accordance with the above-mentioned Synthesis Example, from the viewpoint of chemistry.

<Evaluation>

The maximum absorption wavelengths in absorption spectra of the obtained Exemplified Compounds 2a, 4a, 5a to 12a, 20a, 44a, 71a to 73a, 75a to 77a, 83a, 85a, 89a, 92a, 94a, 95a, 115a, and 117a in an ethyl acetate solution (concentration: $1 \times 10^{-6}$ mol/L, light path length: 10 mm) are shown in Table 1a. In addition, the maximum absorption wavelengths in absorption spectra of the obtained Exemplified Compounds P2a, P5a, P26a, P31a, P36a, P39a, P40a, P47a, P77a, and P81a in an N-methylpyrrolidone solution (concentration: $1 \times 10^{-6}$ mol/L, light path length: 10 mm) are shown in Table 1a.

Further, FIG. 1 shows the solution transmission spectrum of Exemplified Compound 6a synthesized in Synthesis Example 1a.

TABLE 1a

| Exemplified Compounds | Absorption maximum wavelength (nm) |
|---|---|
| 2a | 492.4 |
| 4a | 494.0 |
| 5a | 494.8 |
| 6a | 496.4 |
| 7a | 496.5 |
| 8a | 496.6 |
| 9a | 493.3 |
| 10a | 489.0 |
| 11a | 499.9 |
| 12a | 493.5 |
| 20a | 526.4 |
| 44a | 541.6 |
| 71a | 497.6 |
| 72a | 495.1 |
| 73a | 489.8 |
| 75a | 496.0 |

TABLE 1a-continued

| Exemplified Compounds | Absorption maximum wavelength (nm) |
|---|---|
| 76a | 498.1 |
| 77a | 499.8 |
| 83a | 501.8 |
| 85a | 503.8 |
| 89a | 500.1 |
| 92a | 501.2 |
| 94a | 498.1 |
| 95a | 499.6 |
| 115a | 502.0 |
| 117a | 500.1 |
| P2a | 494.1 |
| P5a | 522.2 |
| P26a | 520.1 |
| P31a | 520.4 |
| P36a | 520.6 |
| P39a | 520.4 |
| P40a | 520.2 |
| P47a | 530.6 |
| P77a | 494.4 |
| P81a | 521.0 |

Example 1a (1) Preparation of Resist Solution A (Negative Type)

The compounds in the following composition were mixed and dissolved to prepare a resist solution A.

Propylene glycol monomethylether acetate: 5.20 parts

Cyclohexanone: 52.6 parts

Binder: 30.5 parts (benzyl methacrylate/methacrylic acid/2-hydroxyethyl methacrylate) copolymer (molar ratio=60:20:20), average molecular weight 30200 (in terms of polystyrene), 41% cyclohexanone solution Dipentaerythritol hexaacrylate: 10.2 parts Polymerization inhibitor (p-methoxyphenol): 0.006 parts Fluorine-containing surfactant (trade name: F-475, manufactured by DIC corporation): 0.80 parts Photopolymerization initiator: 4-benzoxolane-2,6-bis(trichloromethyl)-s-triazine (TAZ-107, manufactured by Midori Kagaku Co., Ltd.): 0.58 parts.

(2) Preparation of Glass Substrate with Undercoat Layer

A glass substrate (Corning 1737) was ultrasonically washed with an aqueous solution of 0.5% NaOH, and then washed with water and dehydration baking (200° C./20 minutes) was carried out. Next, on the glass substrate, which was washed, the resist solution A obtained in (1) was coated in the post-drying thickness of 2 μm using a spin coater and dried under heat at 220° C. for 1 hour to form a glass substrate with an undercoat layer.

(3) Preparation of colored curable composition

The compounds in the following composition were mixed and dissolved to prepare a colored curable composition.

Cyclohexanone 80: parts

Polymerizable compound: dipentaerythritol hexaacrylate: 14.0 parts

Polymerization inhibitor: p-methoxyphenol: 0.006 parts

Fluorine-containing surfactant (trade name: F-475, manufactured by DIC corporation): 0.80 parts Photopolymerization initiator (TAZ-107, manufactured by Midori Kagaku Co., Ltd.): 2.0 parts Exemplified Compound 95a: 4.0 parts.

(4) Exposure and Development of Colored Curable Composition (Image Formation)

The colored curable composition obtained in (3) above was coated in a post-drying film thickness of 0.6 µm on the undercoat layer of the glass substrate with the undercoat layer obtained in (2) above by using a spin coater and pre-baked at 100° C. for 120 seconds.

Then, the coating film was irradiated with light having a wavelength of 365 nm through a mask with a line width of 2 µm in an exposure dose of 200 mJ/cm² by using an exposure apparatus UX3100-SR (manufactured by Ushio, Inc.). After exposure, the coating film was developed by using a developer solution CD-2000 (manufactured by Fuji Film Electronics Materials Co., Ltd.) under the condition of 25° C. for 40 seconds. Then, after rinsing with running water for 30 seconds, it was spray-dried. Then, post-baking was carried out at 200° C. for 15 minutes.

Figure 2:
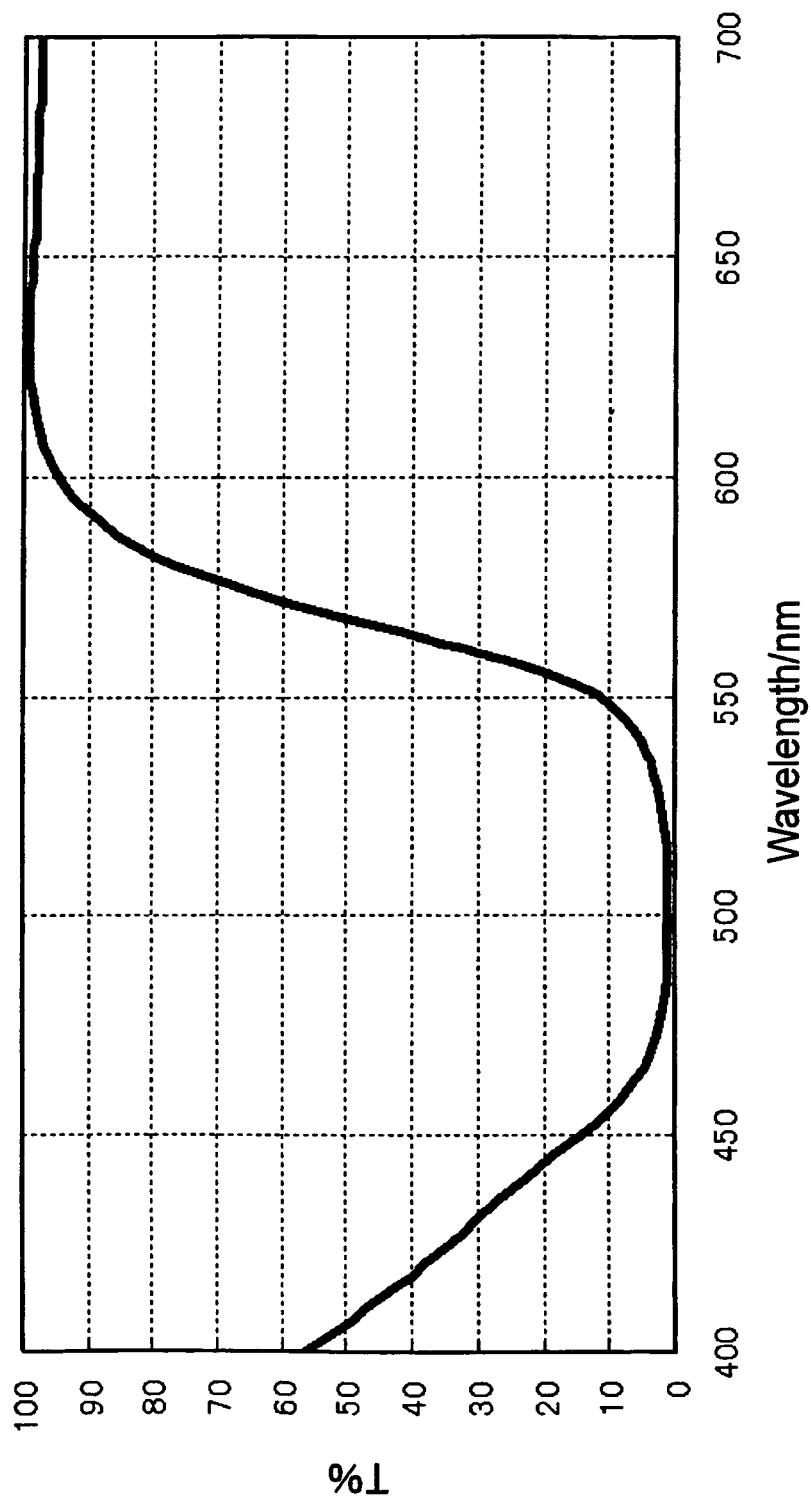
FIG. 2 shows spectral characteristics of a color filter prepared in Example 1a of the present invention.

As a result, a suitable pattern as a red color constituting the color filter was obtained. In addition, FIG. 2 shows the transmission spectrum of the color filter prepared in Example 1a.

(5) Evaluation

In the following manner, the colored curable composition prepared above was evaluated with respect to storage stability over time, and the heat resistance, light resistance, solvent resistance and pattern shape of the coating film produced by the application of the dye resist solution on the glass substrate. The evaluation results are shown in Table 2a.

[Storage Stability Over Time]

After the colored curable composition was stored at room temperature for one month, the degree of precipitation of foreign matters in the composition was evaluated by visual inspection in accordance with the following evaluation criteria.

—Evaluation Criteria—
A: precipitates were not observed.
B: precipitates were observed slightly.
C: precipitates were observed.

[Heat Resistance]

The glass substrate coated with the colored curable composition was placed on a hot plate at 200° C. so that the surface of the substrate was contacted, and heated for 1 hour. Then, the color difference ($\Delta E^*ab$ value) between before and after heating was measured by a chromoscope MCPD-1000 (manufactured by Otsuka Electronics Co., Ltd.) to obtain an index for evaluation of the heat resistance. By using the index, the evaluation was made in accordance with the following evaluation criteria. A smaller $\Delta E^*ab$ value suggests better heat resistance. In addition, the $\Delta E^*ab$ value is a value calculated by the following color difference formula in accordance with CIE1976 (L*, a*, b*) color coordinate system (Color Science Handbook, New Edition, edited by the Color Science Association of Japan (1985), p. 266).

$$\Delta E^*ab=\{(\Delta L^*)^2+(\Delta a^*)^2+(\Delta b^*)^2\}^{1/2}$$

—Evaluation Criteria—
A: $\Delta E^*ab$ value<5
B: $5\leq\Delta E^*ab$ value$\leq15$
C: $\Delta E^*ab$ value>15

[Light Resistance]

The glass substrate coated with the colored curable composition, which was equipped with an ultraviolet ray cut-off filter with a cut-off of 366 nm or less, was irradiated with a xenon lamp at 100,000 lux for 20 hours (corresponding to 2,000,000 lux-h). Then, the color difference ($\Delta E^*ab$ value) between before and after the irradiation was measured to obtain an index for evaluation of the light resistance. Evaluation was made in accordance with the following evaluation criteria.

A smaller $\Delta E^*ab$ value suggests better light resistance.
—Evaluation Criteria—
A: $\Delta E^*ab$ value<5
B: $5\leq\Delta E^*ab$ value$\leq12$
C: $\Delta E^*ab$ value>12

[Solvent Resistance]

Spectrum for each coating film after post-baking obtained in (4) above was measured (spectrum A). The resist solution A obtained in (1) above was coated on the coating film to a film thickness of 1 µm and pre-baking was applied. Then, this was developed by using a developer CD-2000 (manufactured by Fuji Film Electronics Materials Co., Ltd.) under the conditions of 23° C. for 120 seconds to measure the spectrum again (spectrum B). The colorant residual ratio (%) was calculated from the difference between the spectra A and B, and was used as an index for evaluation of the solvent resistance. The obtained value is better in terms of the solvent resistance as the value approaches 100%.

—Evaluation Criteria—
A: dye residual ratio>90%
B: 70%≤dye residual ratio≤90%
C: dye residual ratio<70%

[Pattern Shape]

The development pattern of various post-baked coating films obtained in (4) was examined under a light microscope (digital microscope RX-20, manufactured by Olympus Corporation), and whether or not a definite pattern was formed was evaluated in accordance with the following evaluation criteria.

—Evaluation Criteria—
A: definite pattern can be formed.
B: pattern can be formed, but marginal region of pattern is indefinite.
C: pattern cannot be formed.

Examples 2a to 12a

In Section "(3) Preparation of colored curable composition" of Example 1a, a pattern was formed in the same manner as in Example 1a, except that Exemplified Compound 95a was changed to a colorant given in Table 2a (at equal mass). Further, evaluations similar to the above were carried out. The evaluation results are shown in the following Table 2a.

Comparative Examples 1a to 2a

In "(3) Preparation of colored curable composition" in Example 1a, a pattern was formed in the same manner as in Example 1a, except that Exemplified Compound 95a was replaced with Comparative colorants 1a to 2a (Comparative Examples 1a to 2a) (at equal mass). Further, evaluations similar to the above were carried out. The evaluation results, in conjunction with the results of Examples, are shown in the following Table 2a. The colorants used in Comparative Examples 1a and 2a are as follows.

TABLE 2a

| Example No. | Colorant | Stability over time | Heat resistance | Light resistance | Solvent resistance | Pattern shape |
| --- | --- | --- | --- | --- | --- | --- |
| Example 1a | 95a | A | A | A | A | A |
| Example 2a | 97a | A | A | A | A | A |

TABLE 2a-continued

| Example No. | Colorant | Stability over time | Heat resistance | Light resistance | Solvent resistance | Pattern shape |
|---|---|---|---|---|---|---|
| Example 3a | 109a | A | A | A | A | A |
| Example 4a | 110a | A | A | A | A | A |
| Example 5a | 118a | A | A | A | A | A |
| Example 6a | 10a | A | B | A | A | A |
| Example 7a | 12a | A | B | A | A | A |
| Example 8a | 60a | A | B | A | A | A |
| Example 9a | 61a | A | B | A | A | A |
| Example 10a | P36a | A | A | A | A | A |
| Example 11a | P39a | A | A | A | A | A |
| Example 12a | P77a | A | A | A | A | A |
| Comparative Example 1a | Comparative colorant 1a | C | C | B | C | B |
| Comparative Example 2a | Comparative colorant 2a | A | B | C | B | B |

As shown in Table 2a, all of Examples 1a to 12a using the colorants relating to the present invention exhibited excellent storage stability over time of the colored curable composition. In addition, the pattern formed using this colored curable composition exhibited favorable heat resistance, light resistance, and solvent resistance. On the other hand, Comparative Example 1a exhibited poor storability of the colored curable composition, and the pattern formed using the colored curable composition of Comparative Example 1a exhibited poor heat resistance, light resistance, and solvent resistance, in conjunction with an inferior pattern shape, so that a marginal region was indefinite. Further, the pattern formed using the colored curable composition of Comparative Example 2a exhibited poor light resistance and inferior solvent resistance, and a pattern shape was also poor, so that a marginal region was indefinite.

As shown in Table 2a, among the present inventions (Examples 1a to 12a), particularly Examples 1a to 5a using the azo colorant compound represented by Formula (2) were excellent especially in the heat resistance. In addition, the specific colorant compound of the present invention exhibited very high solubility (for example, ethyl lactate with higher safety, etc.) in a variety of organic solvents including cyclohexane used in Examples, and was also effective from the viewpoint of work safety and of reducing work load.

Further, Examples 10a to 12a using the compound containing at least one repeating unit represented by Formula (Pa) exhibited favorable results in all of the stability over time, heat resistance, light resistance, solvent resistance, and pattern formability.

Comparative Colorant 1a

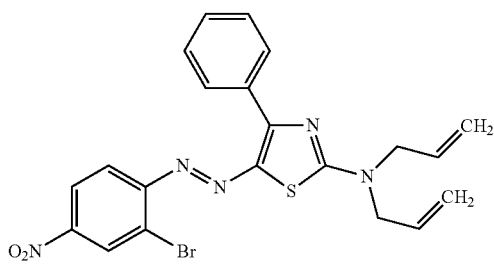

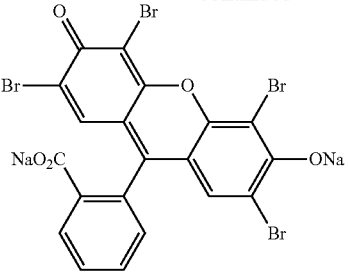

Comparative colorant 2a: C. I. Acid Red 87

Examples 13a to 21a, Comparative Examples 3a and 4a, Examples 22a to 30a, and Comparative Examples 5a and 6a Using the colored curable compositions employed in Examples 1a to 12a and Comparative Examples 1a and 2a, color filters were prepared in the following procedure, and color transfer evaluations were carried out as Examples 13a to 21a, and Comparative Examples 3a and 4a.

In addition, color filters were prepared without the UV irradiation process after the development process, and Examples 22a to 30a, and Comparative Examples 5a and 6a were carried out for the evaluation of color transfer.

—Preparation of Monochromatic Color Filter—

The colored curable composition employed in Examples 1a to 9a, and Comparative Examples 1a and 2a was coated in a dried film thickness of 1 μm on (2) the glass substrate with an undercoat layer prepared in Example 1a by using a spin coater, and pre-baked at 100° C. for 120 seconds to form a colored film. The colored film was exposed at an exposure dose of 200 [mJ/cm$^2$] and a illuminance of 1200 mW/cm$^2$ (integrated irradiation illuminance) through a mask pattern having tetragonal pixels of 7.0 μm arranged in a 4 mm×3 mm region of the substrate, by using an i-ray stepper exposure apparatus FPA-3000i5+(manufactured by Canon Inc.). After the exposure was completed, the colored film was subjected to a paddle development at 23° C. for 60 seconds using a developer solution (trade name: CD-2000, 60%, manufactured by Fuji Film Electronics Materials Co., Ltd.), to form a pattern. Then, after rinsing with running water for 20 seconds, it was spray-dried. Then, as a UV irradiation process after the development process, ultraviolet rays at a dose of 10000 [mJ/cm$^2$] were irradiated all over the pattern-formed glass substrate, using a high-pressure mercury lamp (UMA-802-HC552FFAL, manufactured by Ushio, Inc.). After the irradiation, post-baking was carried out in a hot plate at 220° C. for 300 seconds, thereby forming a colored pattern on the glass substrate. In addition, light with a wavelength of 275 nm or less contained in the irradiation light from the high-pressure mercury lamp was 10%.

In this manner, monochromatic color filters of Examples 13a to 21a, and Comparative Examples 3a and 4a were prepared. In addition, monochromatic color filters of Examples 22a to 30a, and Comparative Examples 5a and 6a were prepared without the post-development UV irradiation.

—Evaluation of Color Transfer—

A CT-2000 L solution (transparent undercoating agent, manufactured by Fuji Film Electronics Materials Co., Ltd.) was coated in a dried film thickness of 1 μm on the colored pattern-formed surface of the thus prepared color filter, and then dried to form a transparent film, followed by a heating treatment at 200° C. for 5 minutes. After the heating was completed, an absorbance of the transparent film adjacent to the colored pattern was measured by using a micro-spectroscopy measuring apparatus (LCF-1500 M, manufactured by Otsuka Electronics Co., Ltd.). A ratio [%] of the absorbance value of the resulting transparent film to the absorbance value of the colored pattern analogously measured before heating was calculated and taken as an index for the evaluation of color transfer.

—Evaluation Criteria—
Color transfer (%) to adjacent pixels
A: color transfer to adjacent pixels<1%
B: 1%<color transfer to adjacent pixels≤10%
C: 10% color transfer to adjacent pixels≤30%
D: color transfer to adjacent pixels>30%

TABLE 3a

| Colorant | | Color transfer to adjacent pixels (with UV irradiation process) |
|---|---|---|
| Example 13a | 95a | A |
| Example 14a | 97a | A |
| Example 15a | 109a | A |
| Example 16a | 110a | A |
| Example 17a | 118a | A |
| Example 18a | 10a | B |
| Example 19a | 12a | B |
| Example 20a | 60a | B |
| Example 21a | 61a | B |
| Comparative Example 3a | Comparative colorant 1a | D |
| Comparative Example 4a | Comparative colorant 2a | C |
| | | Color transfer to adjacent pixels (without UV irradiation process) |
| Example 22a | 95a | B |
| Example 23a | 97a | B |
| Example 24a | 109a | B |
| Example 25a | 110a | B |
| Example 26a | 118a | B |
| Example 27a | 10a | C |
| Example 28a | 12a | C |
| Example 29a | 60a | C |
| Example 30a | 61a | C |
| Comparative Example 5a | Comparative colorant 1a | D |
| Comparative Example 6a | Comparative colorant 2a | D |

Example 31a to Example 39a

—Preparation of Color Filter for Solid-State Image Pickup Device—

(Production of Silicon Wafer Substrate with Undercoat Layer)

A 6-inch silicon wafer was heat-treated in an oven at 200° C. for 30 minutes. Subsequently, resist solution A prepared in (1) of Example 1a was coated on this silicon wafer to obtain a dried film thickness of 1.0 μm, and the silicon wafer was further heated to dry in an oven at 220° C. for 1 hour to form an undercoat layer. Thus, a silicon wafer substrate with an undercoat layer was obtained.

(Preparation of Pattern of Color Filter for Solid-State Image Pickup Device)

Each of the colored curable compositions employed in Examples 1a to 9a was coated on the undercoat layer of the silicon wafer substrate with undercoat layer obtained, to achieve a dried film thickness of respective coating films of 0.8 μm, thereby forming a photocurable coating film. Then, the silicon wafer was heat treated (prebaking) for 120 seconds using a hot plate at 100° C. Subsequently, the silicon wafer was exposed to a 365 nm-wavelength light at 100 mJ/cm$^2$-stepwise varying exposure doses in the range of 100 to 2500 mJ/cm$^2$, through a patterned mask having an island pattern with each side of 1.2 μm, using an i-ray stepper exposure apparatus FPA-3000i5+ (manufactured by Canon, Inc.). Thereafter, the silicon wafer substrate on which an irradiated coating film had been formed, was placed on a horizontal rotary table of a spin-shower developing machine (DW-30 type; manufactured by Chemitronics Co., Ltd.), and subjected to a paddle development at 23° C. for 60 seconds using a 60% CD-2000 (manufactured by Fuji Film Electronics Materials Co., Ltd.), to form a colored pattern on the silicon wafer substrate.

The silicon wafer substrate on which a colored pattern had been formed was fixed to the horizontal rotary table by a vacuum chuck method. While the silicon wafer substrate was rotated by a rotating apparatus at a speed of rotation of 50 rpm, a rinsing treatment was conducted by supplying purified water in shower form from above the rotational center of the silicon wafer from a jetting nozzle, and then the silicon wafer was spray-dried.

Each pattern image obtained using the respective colored curable compositions employed in Examples 1a to 9a was square-shaped and had a rectangular cross-sectional shape. These pattern images are suitable for solid-state image pickup devices, thus showing favorable profiles.

Examples 40a and 41a

Next, preparation of a color filter in accordance with an ink-jet method was carried out. First, as preparations for production of a substrate with a partition wall, Pigment Dispersion K with dispersion of carbon black used in a composition (K1) for the formation of the partition wall was prepared according to the following composition.

<Composition of Pigment Dispersion K>
Carbon black (Nipex35, manufactured by Degussa): 13.1%
Dispersant (Compound B1 of the following structure): 0.65%
Polymer (random copolymer of benzyl methacrylate/methacrylic acid in a molar ratio of 72/28, having a molecular weight of 37,000): 6.72%
Propylene glycol monomethylether acetate: 79.53%

Compound B1

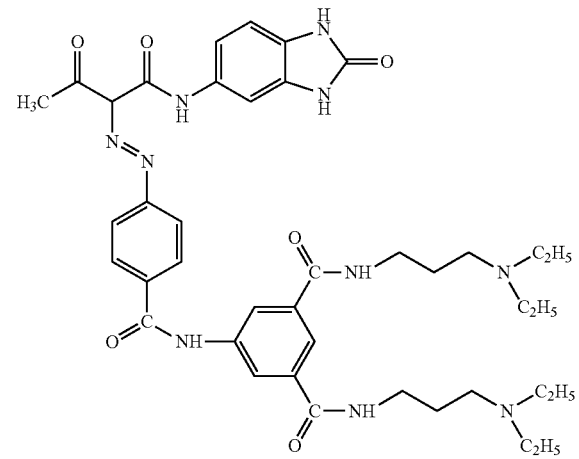

<Preparation of composition (K1) for formation of partition wall>

The composition of a composition (K1) for the formation of a partition wall is given in Table 4a.

Pigment Dispersion K and propylene glycol monomethylether acetate were mixed at a temperature of 24° C. (±2° C.), stirred at 150 rpm for 10 minutes, and with further stirring, methylethyl ketone, Binder 2, hydroquinone monomethylether, DPHA liquid, 2,4-bis(trichloromethyl)-6-[4'-(N,N-bis-diethoxycarbonylmethyl)amino-3'-bromophenyl]-s-triazine, and Surfactant 1 were sequentially added at a temperature of 25° C. (±2° C.), followed by stirring at a temperature 40° C. (±2° C.) and 150 rpm for 30 minutes to obtain a desired composition.

TABLE 4a

| Composition (K1) for formation of partition wall | Amount |
|---|---|
| Pigment Dispersion K | 25 |
| Propylene glycol monomethylether acetate | 8 |
| Methylethyl ketone | 53 |
| Binder 2 | 9.1 |
| Hydroquinone monomethylether | 0.002 |
| DPHA liquid | 4.2 |
| 2,4-bis(trichloromethyl)-6-[4'-N,N-bisethoxycarbonylmethyl]amino-3'-bromophenyl]-s-triazine | 0.16 |
| Surfactant 1 | 0.044 |

<Binder 2>
Polymer (benzyl methacrylate/methacrylic acid (=78/22 molar ratio) random copolymer with a molecular weight of 38,000): 27%
Propylene glycol monomethyl ether acetate: 73%
<DPHA Liquid>
Dipentaerythritol hexaacrylate (trade name: KAYARAD DPHA, containing 500 ppm polymerization inhibitor MEHQ, manufactured by Nippon Kayaku Co., Ltd.): 76%
Propylene glycol monomethyl ether acetate: 24%
<Surfactant 1>
Structure 1 below: 30%
Methyl ethyl ketone: 70%

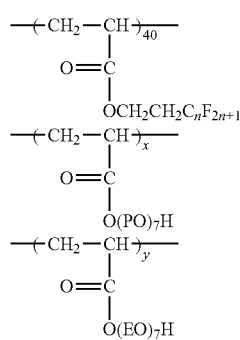

Structure 1

(n = 6, x = 55, y = 5, Mw = 33940, Mw/Mn = 2.55, PO: Propylene oxide, EO: Ethylene oxide)

<Formation of Partition Walls>

An alkali-free glass substrate was washed with a UV cleansing apparatus, then washed with a brush using a detergent, and further washed by ultrasonic cleaning with ultrapure water. The substrate was heat-treated at 120° C. for 3 minutes to stabilize its surface state.

The substrate was cooled, then regulated to a temperature of 23° C., and coated with a composition K1 for the formation of partition walls shown in the above table, by using a glass-substrate coater equipped with a slit-shaped nozzle (trade name: MH-1600, manufactured by F.A.S. Asia). Subsequently, a part of the solvent was evaporated for 30 seconds with a VCD (vacuum drier, manufactured by Tokyo Ohka Kogyo Co., Ltd.) to eliminate the fluidity of the coating layer, and the specimen was pre-baked at 120° C. for 3 minutes to give a substrate having a partition wall-forming layer of 2.3 μm in thickness.

Then, the substrate and a mask were set up perpendicularly with a distance of 200 μm between the surface of the exposure mask and the partition wall-forming layer, and then pattern-wise exposed under a nitrogen atmosphere at an exposure dose of 300 mJ/cm$^2$, a partition wall width of 20 μm and a space width of 100 μm, using a proximity-type exposure device provided with an ultrahigh pressure mercury lamp (manufactured by Hitachi High-Tech Electronics Engineering Co., Ltd.).

Thereafter, the surface of the partition wall-forming layer was uniformly moistened by spraying it with purified water via a shower nozzle, and then developed at 23° C. for 80 seconds with a shower of a KOH-type developer solution (trade name: a 100-fold dilution of CDK-1, containing a nonionic surfactant, manufactured by Fuji Film Electronics Materials Co., Ltd.) at a pressure of 0.04 MPa in a flat nozzle, to give a patterning image.

Subsequently, residues were removed with ultrapure water jetted at a pressure of 9.8 MPa from an ultrahigh-pressure washing nozzle, and the surface of the substrate with the formation of the partition wall-forming layer was subjected to post-exposure at an exposure dose of 2500 mJ/cm$^2$ in the air, followed by heating in an oven at 240° C. for 50 minutes to give a stripe-shaped partition wall having a film thickness of 2.0 μm, an optical density of 4.0, and a 100 μm-wide aperture.

(Ink Repellent Plasma Treatment)

The partition wall-formed substrate was subjected to an ink repellent plasma treatment with a plasma treatment apparatus of cathode-coupling parallel-plate type under the following conditions.

Gas use for the treatment: CF4,
Gas flow rate: 80 sccm,
Pressure: 40 Pa,
RF power: 50 W, and
Treatment time: 30 seconds.

(Preparation of Ink for Red Color (R))

Components set forth in Table 5a below were mixed and stirred for 1 hour. Then, the mixture was filtered under reduced pressure by a micro-filter with an average pore diameter of 0.25 μm (manufactured by Fujifilm Corp.) to prepare an ink liquid for red color (Ink R-1, and Ink R-2) in accordance with the present invention.

TABLE 5a

| | Material | Example 40a Ink R-1 | Example 41a Ink R-2 |
|---|---|---|---|
| Solvent | Cyclohexanone | 68.95 wt % | 78.95 wt % |
| Polymerizable compound | DPCA-60 | 20 wt % | 10 wt % |
| Surfactant | KF-353 | 0.05 wt % | 0.05 wt % |
| Polymerization initiator | V-40 | 1.0 wt % | 1.0 wt % |
| Colorant | Exemplified Compound 99a | 10 wt % | 10 wt % |
| | Ink viscosity (mPa · s) | 8.9 | 5.2 |
| | Surface tension (mN/m) | 25.4 | 30.4 |

Details of materials used in the preparation of an ink for red color (R) are described hereinbelow.

Colorant: Exemplified Compound 99a of the compounds represented by Formula (2)

Polymerizable compound (KAYARAD DPCA-60, manufactured by Nippon Kayaku Co., Ltd.): caprolactone-modified dipentaerythritol hexaacrylate KF-353 (manufactured by Shin-Etsu Silicone Co., Ltd.): polyether-modified silicone oil Polymerization initiator: azobis(cyclohexane-1-carbonitrile) (V-40, manufactured by Wako Pure Chemical Industries, Ltd.)

(Measurement of Viscosity and Surface Tension)

The viscosities of the inks obtained were measured with an E-type viscometer (RE-80L, manufactured by Told Sangyo Co., Ltd.) under the following conditions, while these inks were kept at 25° C.

(Measurement Conditions)

Rotor used for the measurement: 1° 34'×R24,

Measurement time: 2 minutes, and

Measurement temperature: 25° C.

The surface tension of the inks obtained were measured with a surface tension meter (FACE SURFACE TENSIOMETER CBVB-A3, manufactured by Kyowa Interface Science Co., Ltd.), while these inks were kept at 25° C.

(Method of Measuring Contrast)

Figure 3:
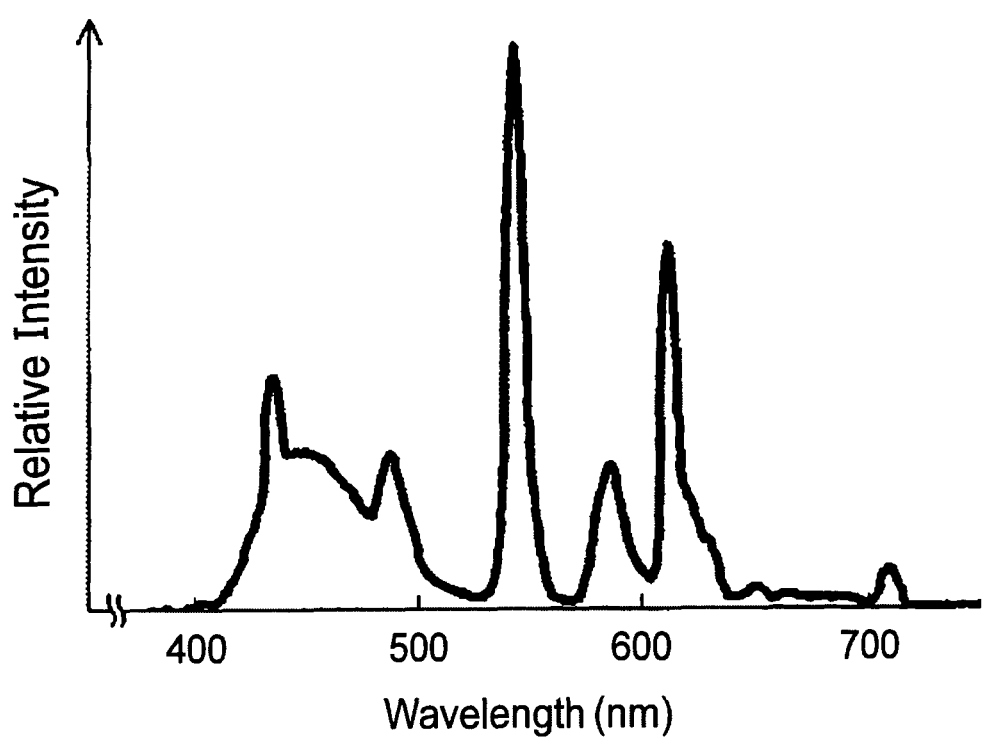
FIG. 3 shows a spectrum of a backlight used in the measurement of contrast.

A cold cathode tube light source (light source emitting a light having a wavelength spectrum distribution shown in FIG. 3) provided with a diffusion substrate was used as a backlight unit, a monochrome substrate was arranged between two polarizing plates (POLAX-15N, manufactured by Luceo Co., Ltd.), and a contrast was calculated by dividing a Y value of a chromaticity of light which passes when polarizing plates are arranged at parallel Nicol by a Y value of a chromaticity of light which passes when arranged at crossed Nicol. For measuring a chromaticity, a color luminance meter (BM-5A, manufactured by Topcon Corporation) was used.

A measurement angle of the color luminance meter was set to 1°, and the measurement was made in a visual field φ5 mm on the sample. A light intensity of the backlight was set in such a manner that the luminance is 400 cd/m$^2$ when two polarizing plates are arranged at parallel Nicol when no sample is arranged.

The monochrome substrate was prepared by the following method. Using one of the R inks (Ink R-1 and Ink R-2) constituting the color filter, a solid film was formed on the glass substrate according to an ink jet method or a spin coating method. Then, as in the formation of a color filter, prebaking (pre-heating) (at a temperature of 100° C. for 2 minutes) and postbaking (post-heating) (at a temperature of 220° C. for 30 minutes) were carried out to form a monochrome substrate having a film thickness of 2 μm.

When the contrasts of the thus obtained monochrome substrates (6 kinds) were measured, values of 50000 or more were obtained for all of them.

(Preparation of ITO Layer)

Next, indium tin oxide (ITO) was sputtered on the thus obtained monochrome substrate using a sputter apparatus at a film surface temperature of 200° C. for 15 minutes to form an ITO film with a film thickness of 1500 Å, thereby preparing an ITO-attached color filter substrate.

(Changes in Spectral Characteristics Between Before and after ITO Sputtering)

Before and after ITO sputtering, a spectrum transmissivity curve in the wavelength range of 400 nm to 700 nm was obtained using a UV-Vis spectrophotometer (V-570, manufactured by Japan Spectroscopic Co., Ltd.). When a spectrum transmissivity change in the maximum peak between before and after sputtering is small, this means that the film is heat-resistant. It could be seen that the spectrum shape before and after ITO sputtering in the prepared substrate was substantially not changed, and the film has high heat resistance.

Comparative Examples 7a and 8a (Preparation of Pigment Dispersion)

17.5 parts of a pigment, C.I. Pigment Red 177 (Cromophtal Red A2B, manufactured by Ciba Specialty Chemicals Inc.), 2.5 parts of a pigment dispersant (above-mentioned Compound B1), and 80 parts of a solvent (1,3-butanediol diacetate) (hereinafter, referred to as "1,3-BGDA") were compounded and pre-mixed, and then dispersed using zirconia beads having a diameter of 0.65 mm at a charge rate of 80% by using a motor mill M-50 (manufactured by Aiger Japan Corp.) at a circumferential rate of 9 m/s for 25 hours, thereby preparing a pigment dispersion for R (R-177).

A pigment dispersion for R (R-254) was prepared in the same manner as in the pigment dispersion for R (R-177), except that the pigment in the pigment dispersion for R (R-177) was changed to C.I. Pigment Red 254 (Irgaphor Red B-CF, manufactured by Ciba Specialty Chemicals Inc.). In addition, when a number average particle diameter of this pigment dispersion was measured using a Nanotrac UPA-EX150 (manufactured by Nikkiso Co., Ltd.), it was 50 nm.

(Preparation of Inks Used in Comparative Examples 7a and 8a)

Using the pigment dispersions (R-177) and (R-254) for Comparative Examples 7a and 8a, Comparative Inks R-3 and R-4 were prepared according to the composition given in Table 6a. In addition, materials used for the preparation of inks are as follows.

Solvent: propylene glycol monomethylether acetate (hereinafter, referred to as "MMPGAC")

Polymerizable compound: KAYARAD DPS100 (manufactured by Nippon Kayaku Co., Ltd.)

Polymerizable compound: KAYARAD TMPTA (manufactured by Nippon Kayaku Co., Ltd.)

Surfactant: Surfactant 1 as described above

Polymerization initiator: azobis(cyclohexane-1-carbonitrile) (V-40, manufactured by Wako Pure Chemical Industries, Ltd.)

TABLE 6a

| | Material | Comparative Example 7a Comparative Ink R-3 | Comparative Example 8a Comparative Ink R-4 |
|---|---|---|---|
| Solvent | 1,3-BGDA | 23.9 mass % | 48.5 mass % |
| | MMPGAC | 20 mass % | — |
| Polymerizable compound | DPS100 | 20 mass % | 10 mass % |
| | TMPTA | — | 5 mass % |
| Surfactant | Surfactant 1 | 0.1 mass % | 0.1 mass % |
| Colorant | Pigment dispersion R-177 | 2.5 mass % | 32.5 mass % |
| | Pigment dispersion R-254 | 32.5 mass % | 2.5 mass % |
| Polymerization initiator | V-40 | 1 mass % | 1.4 mass % |

(Method of Preparing Color Filter for Evaluation)

Each of the thus-prepared Inks R-1 to R-4 was jetted in the region (the recessed part surrounded by the convex part) compartmented by partition walls on the above-obtained substrate, using an ink-jet printer DMP-2831 (manufactured by Fujifilm Dimatix Inc.), followed by heating in an oven at 100° C. for 2 minutes. Then, the thus treated substrate was allowed to stand in an oven at 220° C. for 30 minutes, thereby preparing a monochromatic color filter.

(Evaluation of Ink Storage Stability)

Each of the thus-prepared Inks was stored in a constant-temperature room at 50° C., and the ink viscosity after 30 days was measured and the evaluation was carried out based on the difference (%) with a value immediately after the preparation of the ink [(viscosity after 30 days−viscosity immediately after preparation)/viscosity immediately after preparation]. Evaluation criteria are classified as follows.

A: difference with viscosity immediately after preparation of ink is less than 10%

B: difference with viscosity immediately after preparation of ink is 10% or more and less than 20%

C: difference with viscosity immediately after preparation of ink is 20% or more and less than 30%

D: difference with viscosity immediately after preparation of ink is 30% or more (Evaluation of Continuous Jetting Stability)

Using the thus-prepared Inks, the jetting stability was evaluated. The evaluation was carried out by continuous jetting with an ink-jet printer DMP-2831 (manufactured by Fujifilm Dimatix Inc.) equipped with a head cartridge having a 10 pL jetting volume at a jetting frequency of 10 kHz for 30 minutes. Evaluation criteria are classified as follows.

A: Continuous jetting is possible without problems.

B: Slight non-jetting, jetting disturbance or the like is observed during jetting, but jetting returns to normal state during jetting, thus generally no problem.

C: Non-jetting or jetting disturbance occurs during jetting, and jetting does not return to normal state during jetting, but can be returned to normal state by maintenance.

D: Normal jetting does not proceed due to occurrence of non-jetting or jetting disturbance during jetting, and jetting does not return to normal state even by maintenance.

As for the maintenance, purging (which pressurizes an ink in the head to forcibly eject the ink from a nozzle) and blotting (which brings a head nozzle face into contact with a cleaning pad, to aspirate an ink of a nozzle face) were carried out by DMP-2831.

(Evaluation of Jetting Stability after Pause)

Using the thus-prepared inks, the jetting stability was evaluated. The evaluation was carried out using an ink jet printer DMP-2831 (manufactured by Fujifilm Dimatix Inc.) equipped with a head cartridge having a 10 pL jetting volume at a jetting frequency of 10 kHz, similarly to evaluation of continuous jetting stability, by jetting once for 5 minutes, and after a pause of 24 hours, jetting again under the same conditions, followed by observation of jetting state. Evaluation criteria are classified as follows.

A: Jetting is possible without problems simultaneously in response to jetting instructions.

B: Slight non-jetting, jetting disturbance or the like is observed immediately after jetting instructions, but jetting returns to normal state during jetting, thus generally no problem.

C: Non-jetting or jetting disturbance occurs, and jetting does not return to normal state during jetting, but can be returned to normal state by maintenance.

D: Normal jetting does not proceed due to occurrence of non-jetting or jetting disturbance, and jetting does not return to normal state even by maintenance.

As for the maintenance, purging (which pressurizes an ink in the head to forcibly eject the ink from a nozzle) and blotting (which brings a head nozzle face into contact with a cleaning pad, to aspirate an ink of a nozzle face) were carried out by DMP-2831.

(Evaluation of Heat Resistance)

The above-prepared respective color filters were placed in an oven heated to 230° C., followed by allowing them to stand for 1 hour, and measurement of colors was carried out. Measurement of color was carried out by using a UV-560 (manufactured by Japan Spectroscopic Co., Ltd.). $\Delta E^{*}ab$ of less than 5 between before and after heating was taken as "A". $\Delta E^{*}ab$ of 5 or more and less than 15 was taken as "B", and $\Delta E^{*}ab$ of 15 or more was taken as "C".

(Evaluation of Chemical Resistance)

The above-prepared respective color filters were soaked in chemicals for evaluation (N-methylpyrrolidone, 2-propanol, 5% aqueous sulfuric acid solution, and 5% aqueous sodium hydroxide solution) for 20 minutes, and colors before and after soaking were measured. Measurement of color was carried out by using a UV-560 (manufactured by Japan Spectroscopic Co., Ltd.). $\Delta E^{*}ab$ of less than 5 was taken as "A". $\Delta E^{*}ab$ of 5 or more and less than 15 was taken as "B", and $\Delta E^{*}ab$ of 15 or more was taken as "C". The measurement method of $\Delta E^{*}ab$ is as described above.

Table 7a summarizes the evaluation results of ink-jet inks and color filters.

TABLE 7a

| Evaluation items | Example 40a | Example 41a | Comparative Example 7a | Comparative Example 8a |
|---|---|---|---|---|
| Ink viscosity (mPa · s) | 9.2 | 5.5 | 11.2 | 10.8 |
| Surface tension (mN/m) | 26.1 | 29.2 | 29.5 | 30.2 |
| Ink storage stability | A | A | A | B |
| Continuous jetting stability | A | A | C | C |
| Jetting stability after pause | A | B | D | D |
| Heat resistance | A | A | A | A |
| Chemical resistance (N-methylpyrrolidone) | A | B | A | A |
| Chemical resistance (2-propanol) | A | A | A | A |
| Chemical resistance (5% aqueous sulfuric acid solution) | A | A | A | A |
| Chemical resistance (5% aqueous sodium hydroxide solution) | A | A | B | B |

As shown in Table 7a, ink-jet inks using the colorant having a specific structure in accordance with the present invention had excellent storability and also exhibited superiority in terms of jetting stability. Further, the color filter prepared using the ink-jet ink of the present invention exhibited excellent chemical resistance and heat resistance, which is equivalent to the case when an ink using a pigment was employed.

On the other hand, Comparative Examples 7a and 8a employing the ink using a pigment were inferior in the post-pause jetting stability and were also poor in continuous jetting stability, thereby exhibiting poor practicality.

Synthesis Example 1b

<Synthesis of Comparative colorant 2b and Exemplified Compound P5b>

In accordance with the following synthesis scheme, Comparative colorant 2b and Exemplified Compound P5b were synthesized by the following procedure.

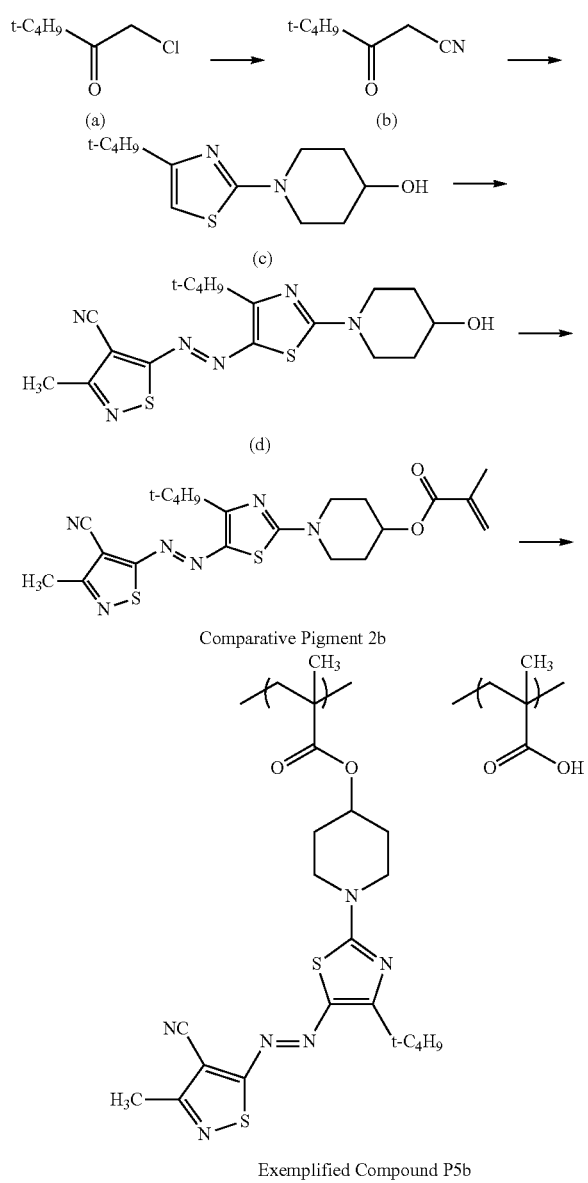

Comparative Pigment 2b

Exemplified Compound P5b

<Synthesis of Intermediate (b)>

To a reaction container were added 120.5 g (1.48 mol) of sodium thiocyanate and 280 mL of methanol, and an internal temperature of the reaction container was warmed to 55° C. 200 g (1.48 mol) of 1-chloro pinacolone (a) was added dropwise thereto over 30 minutes. After the dropwise addition was completed, the mixture was reacted at an internal temperature of 55° C. for 2 hours. After the reaction was completed, an internal temperature was cooled to 10° C., and 250 mL of water was added, followed by stirring at 10° C. for 30 minutes. Then, crystals were separated by filtration to afford 218 g (yield: 94%) of an intermediate (b) as white crystals. Mass analysis results: (m/z)=158 ([M+1]$^+$, 100%).

<Synthesis of Intermediate (c)>

To a reaction container were added 15.7 g (0.10 mol) of the intermediate (b), 71 mL of toluene, and 6.0 g (0.10 mol) of acetic acid, and an internal temperature thereof was warmed to 80° C. 10.1 g of 4-hydroxypiperidine was added portionwise thereto. After the dropwise addition was completed, the mixture was reacted at an internal temperature of 80° C. for 3 hours. After the reaction was completed, an internal temperature was cooled to 30° C., and 50 mL of water and 50 mL of ethyl acetate were added to wash a toluene layer. The toluene layer was extracted with 1N hydrochloric acid (2×50 mL). The extract was neutralized with sodium hydroxide, followed by another extraction with ethyl acetate. The extract was dried over magnesium sulfate and concentrated using a rotary evaporator to afford a pale yellow liquid containing an intermediate (c) as a main component. Mass analysis results: (m/z)=240 (M$^+$, 100%).

<Synthesis of Intermediate (d)>

(Synthesis of Diazonium Salt)

To a reaction container were added 11.1 g (0.08 mol) of 5-amino-4-cyano-3-methyl-isothiazole and 100 mL of phosphoric acid, and an internal temperature thereof was cooled to 0° C. 6.1 g (0.09 mol) of sodium nitrite was added portionwise thereto, followed by stirring at an internal temperature of 0° C. to 5° C. for 1 hour.

(Coupling Reaction)

To another flask were added the resulting pale yellow liquid and 300 mL of methanol, and an internal temperature thereof was cooled to 0° C. The above-synthesized diazonium salt dispersion was gradually added dropwise thereto while maintaining an internal temperature of 20° C. or lower. After the dropwise addition was completed, the mixture was reacted at an internal temperature of 0 to 5° C. for 1 hour, and then at room temperature for 1 hour. After the reaction was completed, 300 mL of water was added thereto, followed by stirring at room temperature for 60 minutes, and crystals were separated by filtration and washed with warm water and acetonitrile to afford 5.0 g (yield: 13%) of an intermediate (d) as red crystals. Mass analysis results: (m/z)=391 ([M+]$^+$, 100%).

<Synthesis of Comparative Colorant 2b>

To a reaction container were added 4.8 g (0.0122 mmol) of the intermediate (d), 13.5 g (0.144 mmol) of methacrylic anhydride, 7.2 mL of pyridine, 20 mL of acetonitrile, and 50 mL of ethyl acetate, followed by reaction at room temperature for 3 days. After the reaction was completed, 200 mL of a mixed solvent of methanol/water=1:2 was added thereto, and the resulting solids were separated by filtration and washed with a mixed solvent of methanol/water=1:2. Then, the solids were dissolved with heating in methanol, filtered through Celite, and concentrated by an evaporator. The resulting crystals were separated by filtration to afford 4.2 g (yield: 74%) of Comparative colorant 2b as crystals. Mass analysis results: (m/z) 459 ([M+1]$^+$, 100%). The absorption maximum wavelength in an absorption spectrum of Comparative colorant 2b in ethyl acetate was 520 nm.

<Synthesis of Exemplified Compound P5b>

To a 100 mL three-neck flask were added 4.0 g (0.0087 mol) of the above-obtained Comparative colorant 2b, 1.00 g (0.0116 mol) of methacrylic acid, and 11.7 g of cyclohexanone, and an internal temperature thereof was warmed to 70° C. under a nitrogen atmosphere. While maintaining an internal temperature at 70° C., 141 mg of V-601 (trade name, manufactured by Wako Pure Chemical Industries, Ltd.) was added thereto every 2 hours three times in total. After the reaction was completed, the reaction liquid was warmed to an internal temperature of 90° C., followed by stirring for 2 hours to decompose the unreacted V-601. The reaction liquid was allowed to cool, and re-precipitated with 100 mL of hexane to afford 4.20 g (yield: 80%) of Exemplified Compound P5b as a red powder. Molecular weight analysis results (GPC): number average molecular weight Mn=22000, weight average molecular weight Mw=44000, and molecular weight distribution index Mw/Mn=2.0. The absorption maximum wavelength in an absorption spectrum of Exemplified Compound P5b in ethyl acetate was 519 nm.

<Synthesis of Exemplified Compounds 2b, 13b, 15b, 24b, 28b, 31b to 33b, 35b to 37b, and 42b>

Exemplified Compounds 2b, 13b, 15b, 24b, 28b, 31b to 33b, 35b to 37b, and 42b were synthesized by a method in accordance with the above-mentioned Synthesis Example.

In addition, Exemplified Compounds other than Exemplified Compounds 2b, 13b, 15b, 24b, 28b, 31b to 33b, 35b to 37b and 42b can also be synthesized by a method in accordance with the above-mentioned Synthesis Example, from the viewpoint of chemistry.

<Synthesis of Exemplified Compounds P2b, P5b, P10b, P36b, P39b, P40b, P47b, P57b, P77b, P80b and P84b>

Exemplified Compounds P2b, P5b, P10b, P36b, P39b, P40b, P47b, P57b, P77b, P80b and P84b were synthesized in accordance with the above-mentioned synthesis method. In addition, Exemplified Compounds P1b to P100b other than Exemplified Compounds P2b, P5b, P10b, P36b, P39b, P40b, P47b, P57b, P77b, P80b and P84b can also be synthesized by a method in accordance with the above-mentioned Synthesis Example, from the viewpoint of chemistry.

Example 1b (1) Preparation of Resist Solution A (Negative Type)

The compounds in the following composition were mixed and dissolved to prepare a resist solution A.

Propylene glycol monomethylether acetate: 5.20 parts
Cyclohexanone: 52.6 parts
Binder: 30.5 parts
(benzyl methacrylate/methacrylic acid/2-hydroxyethyl methacrylate) copolymer (molar ratio=60:20:20), average molecular weight 30200 (in terms of polystyrene), 41% cyclohexanone solution
Dipentaerythritol hexaacrylate: 10.2 parts
Polymerization inhibitor (p-methoxyphenol): 0.006 parts
Fluorine-containing surfactant (trade name: F-475, manufactured by DIC corporation): 0.80 parts
Photopolymerization initiator: 4-benzoxolane-2,6-bis(trichloromethyl)-s-triazine (TAZ-107, manufactured by Midori Kagaku Co., Ltd.): 0.58 parts.

(2) Preparation of Glass Substrate with Undercoat Layer

A glass substrate (Corning 1737) was ultrasonically washed with an aqueous solution of 0.5% NaOH, and then washed with water and dehydration baking (200° C./20 minutes) was carried out. Next, on the glass substrate, which was washed, the resist solution A obtained in (1) was coated in the post-drying thickness of 2 μm using a spin coater and dried under heat at 220° C. for 1 hour to form a glass substrate with undercoat layer.

(3) Preparation of Colored Curable Composition

The compounds in the following composition were mixed and dissolved to prepare a colored curable composition (composition for color resist).

Cyclohexanone: 80 parts
Polymerizable compound: dipentaerythritol hexaacrylate: 14.0 parts
Polymerization inhibitor: p-methoxyphenol: 0.006 parts
Fluorine-containing surfactant (trade name: F-475, manufactured by DIC corporation): 0.80 parts
Photopolymerization initiator (TAZ-107, manufactured by Midori Kagaku Co., Ltd.): 2.0 parts
Exemplified Compound 13b: 4.0 parts.

(4) Exposure and Development of Colored Curable Composition (Image Formation)

The colored curable composition obtained in (3) above was coated in a post-drying film thickness of 0.6 μm on the undercoat layer of the glass substrate with the undercoat layer obtained in (2) above by using a spin coater and pre-baked at 100° C. for 120 seconds.

Then, the coating film was irradiated with light having a wavelength of 365 nm through a mask with a line width of 2 μm in an exposure dose of 200 mJ/cm$^2$ by using an exposure apparatus UX3100-SR (manufactured by Ushio, Inc.). After exposure, the coating film was developed by using a developer solution CD-2000 (manufactured by Fuji Film Electronics Materials Co., Ltd.) under the condition of 25° C. for 40 seconds. Then, after rinsing with running water for 30 seconds, it was spray-dried. Then, post-baking was carried out at 200° C. for 15 minutes.

Figure 4:
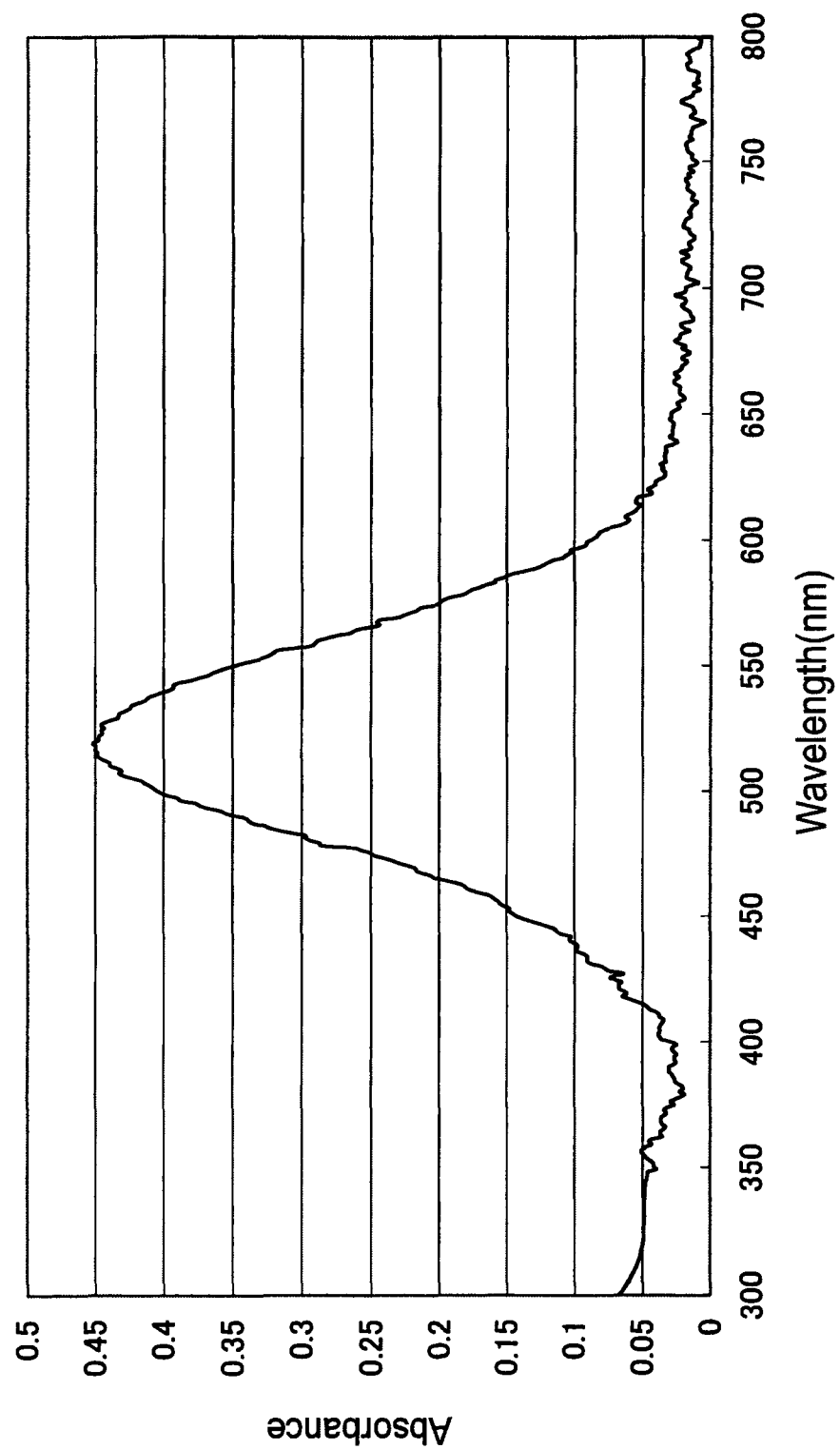
FIG. 4 shows a transmission spectrum of a color filter prepared in Example 1b.

As a result, a suitable pattern as a red color constituting the color filter was obtained. In addition, FIG. 4 shows the transmission spectrum of the color filter prepared in Example 1b.

(5) Evaluation

In the following manner, the colored curable composition prepared above was evaluated with respect to storage stability over time, and the heat resistance, light resistance, solvent resistance and pattern shape of the coating film produced by the application of the colored curable composition on the glass substrate. The evaluation results are shown in Table 5b.

[Storage Stability Over Time]

After the colored curable composition was stored at room temperature for one month, the degree of precipitation of foreign matters in the composition was evaluated by visual inspection in accordance with the following evaluation criteria.

—Evaluation Criteria—

A: precipitates were not observed.
B: precipitates were observed slightly.
C: precipitates were observed.

[Heat Resistance]

The glass substrate coated with the colored curable composition was placed on a hot plate at 200° C. so that the surface of the substrate was contacted, and heated for 1 hour. Then, the color difference (ΔE*ab value) between before and after heating was measured by a chromoscope MCPD-1000 (manufactured by Otsuka Electronics Co., Ltd.) to obtain an index for evaluation of the heat resistance. By using the index, the evaluation was made in accordance with the following evaluation criteria. A smaller ΔE*ab value suggests better heat resistance. In addition, the ΔE*ab value is a value calculated by the following color difference formula in accordance with CIE1976 (L*, a*, b*) color coordinate system (Color Science Handbook, New Edition, edited by the Color Science Association of Japan (1985), p. 266).

$$\Delta E^*ab = \{(\Delta L^*)^2 + (\Delta a^*)^2 + (\Delta b^*)^2\}^{1/2}$$

—Evaluation Criteria—

A: ΔE*ab value<5
B: 5≤ΔE*ab value≤15
C: ΔE*ab value>15

[Light Resistance]

The glass substrate coated with the colored curable composition, which was equipped with an ultraviolet ray cut-off filter with a cut-off of 366 nm or less, was irradiated with a xenon lamp at 100,000 lux for 20 hours (corresponding to 2,000,000 lux·h). Then, the color difference (ΔE*ab value) between before and after the irradiation was measured to obtain an index for evaluation of the light resistance. Evaluation was made in accordance with the following evaluation criteria.

A smaller ΔE*ab value suggests better light resistance.

—Evaluation Criteria—
A: ΔE*ab value<5
B: 5≤ΔE*ab value12
C: ΔE*ab value>12
[Solvent Resistance]

Spectrum for each coating film after post-baking obtained in (4) above was measured (spectrum A). The resist solution A obtained in (1) above was coated on the coating film to a film thickness of 1 μm and pre-baking was applied. Then, this was developed by using a developer CD-2000 (manufactured by Fuji Film Electronics Materials Co., Ltd.) under the conditions of 23° C. for 120 seconds to measure the spectrum again (spectrum B). The colorant residual ratio (%) was calculated from the difference between the spectra A and B, and was used as an index for evaluation of the solvent resistance. The obtained value is better in terms of the solvent resistance as the value approaches 100%.
—Evaluation Criteria—
A: dye residual ratio>90%
B: 70%≤dye residual ratio≤90%
C: dye residual ratio<70%
[Pattern Shape]

The development pattern of post-baked coating films obtained in (4) was examined under a light microscope (digital microscope RX-20, manufactured by Olympus Corporation), and whether or not a definite pattern was formed was evaluated in accordance with the following evaluation criteria.
—Evaluation Criteria—
A: definite pattern can be formed.
B: pattern can be formed, but marginal region of pattern is indefinite.
C: pattern cannot be formed.

Examples 2b to 12b

In Section "(3) Preparation of colored curable composition" of Example 1b, a pattern was formed in the same manner as in Example 1b, except that Exemplified Compound 13b was changed to a colorant (colorant compound) given in Table 5b (at equal mass). Further, evaluations similar to the above were carried out. The evaluation results are shown in the following Table 5b.

Comparative Examples 1b to 2b

In "(3) Preparation of colored curable composition" in Example 1b, a pattern was formed in the same manner as in Example 1b, except that Exemplified Compound 13b was replaced with Comparative colorants 1b to 2b (Comparative Examples 1b to 2b) (at equal mass). Further, evaluations similar to the above were carried out. The evaluation results, in conjunction with the results of Examples, are shown in the following Table 5b.

TABLE 5b

| Example No. | Colorant | Stability over time | Heat resistance | Light resistance | Solvent resistance | Pattern shape |
|---|---|---|---|---|---|---|
| Example 1b | 13b | A | A | A | A | A |
| Example 2b | 15b | B | A | A | B | A |
| Example 3b | 24b | B | A | A | B | B |
| Example 4b | 28b | A | A | A | A | A |
| Example 5b | 35b | A | A | A | A | A |
| Example 6b | 42b | A | B | A | A | A |
| Example 7b | P5b | A | A | A | A | A |

TABLE 5b-continued

| Example No. | Colorant | Stability over time | Heat resistance | Light resistance | Solvent resistance | Pattern shape |
|---|---|---|---|---|---|---|
| Example 8b | P10b | A | A | A | A | A |
| Example 9b | P39b | A | A | A | A | A |
| Example 10b | P40b | A | A | A | A | A |
| Example 11b | P57b | A | A | A | A | A |
| Example 12b | P84b | A | A | A | A | A |
| Comparative Example 1b | Comparative colorant 1b | C | C | B | C | B |
| Comparative Example 2b | Comparative colorant 2b | B | C | B | B | B |

As shown in Table 5B, all of the patterns formed using colored curable compositions of Examples 1b to 12b using the colorant compounds relating to the present invention exhibited favorable heat resistance, light resistance, and solvent resistance.

On the other hand, the pattern formed using the colored curable composition of Comparative Example 1b exhibited poor heat resistance, light resistance, and solvent resistance, in conjunction with an inferior pattern shape, so that a marginal region was indefinite. In addition, the colored curable composition of Comparative Example 1b was also inferior in the storage stability. Further, the pattern formed using the colored curable composition of Comparative Example 2b exhibited poor heat resistance and inferior solvent resistance, and a pattern shape was also poor, so that a marginal region was indefinite.

As shown in Table 5b, among the present inventions (Examples 1b to 12b), particularly Examples 1b and 4b to 6b using the colorant compound represented by Formula (M) wherein n is 1 or more were excellent especially in the storage stability and solvent resistance. In addition, the specific colorant compound of the present invention exhibited very high solubility (for example, ethyl lactate with higher safety, etc.) in a variety of organic solvents including cyclohexanon used in Examples, and was also effective from the viewpoint of work safety and of reducing work load.

Further, Examples 7b to 12b using the colorant compound containing a repeating unit represented by Formula (Pb) exhibited favorable results in all of storage stability, heat resistance, light resistance, solvent resistance, and pattern shape.

Comparative Colorant 1b

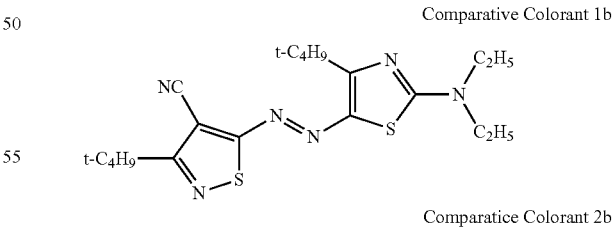

Comparatice Colorant 2b

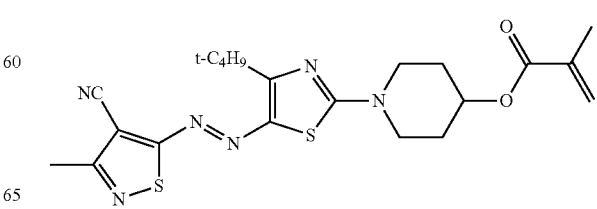

Examples 13b to 21b, Comparative Examples 3b and 4b, Examples 22b to 30b, and Comparative Examples 5b and 6b Using the colored curable composition employed in Examples 1b to 9b, and Comparative Examples 1b and 2b, color filters were prepared in accordance with the following procedure, and color transfer evaluations were carried out as Examples 13b to 21b, and Comparative Examples 3b and 4b.

In addition, color filters were prepared without the UV irradiation process after the development process, and Examples 22b to 30b, and Comparative Examples 5b and 6b were carried out for the evaluation of color transfer.

The results obtained are given in Table 6b.

—Preparation of Monochromatic Color Filter—

The colored curable compositions employed in Examples 1b to 9b, and Comparative Examples 1b and 2b were coated in a dried film thickness of 1 μm on (2) the glass substrate with an undercoat layer prepared in Example 1b by using a spin coater, and pre-baked at 100° C. for 120 seconds to form a colored film. The colored film was exposed at an exposure dose of 200 [mJ/cm$^2$] and a illuminance of 1200 mW/cm$^2$ (integrated irradiation illuminance) through a mask pattern having tetragonal pixels of 7.0 μm arranged in a 4 mm×3 mm region of the substrate, by using an i-ray stepper exposure apparatus FPA-3000i5+(manufactured by Canon Inc.). After the exposure was completed, the colored film was subjected to a paddle development at 23° C. for 60 seconds using a developer solution (trade name: CD-2000, 60%, manufactured by Fuji Film Electronics Materials Co., Ltd.), to form a pattern. Then, after rinsing with running water for 20 seconds, it was spray-dried. Then, as a UV irradiation process after the development process, ultraviolet rays at a dose of 10000 [mJ/cm$^2$] were irradiated all over the pattern-formed glass substrate, using a high-pressure mercury lamp (UMA-802-HC552FFAL, manufactured by Ushio, Inc.). After the irradiation, post-baking was carried out in a hot plate at 220° C. for 300 seconds, thereby forming a colored pattern on the glass substrate. In addition, light with a wavelength of 275 nm or less contained in the irradiation light from the high-pressure mercury lamp was 10%.

In this manner, monochromatic color filters of Examples 13b to 21b, and Comparative Examples 3b and 4b were prepared. In addition, monochromatic color filters of Examples 22b to 30b, and Comparative Examples 5b and 6b were prepared without the post-development UV irradiation.

—Evaluation of Color Transfer—

A CT-2000 L solution (transparent undercoating agent, manufactured by Fuji Film Electronics Materials Co., Ltd.) was coated in a dried film thickness of 1 μm on the colored pattern-formed surface of the thus prepared color filter, and then dried to form a transparent film, followed by a heating treatment at 200° C. for 5 minutes. After the heating was completed, an absorbance of the transparent film adjacent to the colored pattern was measured by using a micro-spectroscopy measuring apparatus (LCF-1500 M, manufactured by Otsuka Electronics Co., Ltd.). A ratio [%] of the absorbance value of the resulting transparent film to the absorbance value of the colored pattern analogously measured before heating was calculated and taken as an index for the evaluation of color transfer.

—Evaluation Criteria—

Color transfer (%) to adjacent pixels
A: color transfer to adjacent pixels<1%
B: 1%≤color transfer to adjacent pixels≤10%
C: 10%<color transfer to adjacent pixels≤30%
D: color transfer to adjacent pixels>30%

TABLE 6b

| | Colorant | Color transfer to adjacent pixels (with UV irradiation process) |
|---|---|---|
| Example 13b | 13b | B |
| Example 14b | 15b | C |
| Example 15b | 24b | C |
| Example 16b | 28b | A |
| Example 17b | 35b | A |
| Example 18b | 42b | A |
| Example 19b | P5b | A |
| Example 20b | P10b | A |
| Example 21b | P39b | A |
| Comparative Example 3b | Comparative colorant 1b | D |
| Comparative Example 4b | Comparative pigment 2b | C |

| | | Color transfer to adjacent pixels (without UV irradiation process) |
|---|---|---|
| Example 22b | 13b | C |
| Example 23b | 15b | D |
| Example 24b | 24b | D |
| Example 25b | 28b | B |
| Example 26b | 35b | B |
| Example 27b | 42b | B |
| Example 28b | P5b | B |
| Example 29b | P10b | B |
| Example 30b | P39b | B |
| Comparative Example 5b | Comparative pigment 1b | D |
| Comparative Example 6b | Comparative pigment 2b | D |

Example 31b to Example 39b

—Preparation of Color Filter for Solid-State Image Pickup Device—

(Production of Silicon Wafer Substrate with Undercoat Layer)

A 6-inch silicon wafer was heat-treated in an oven at 200° C. for 30 minutes. Subsequently, resist solution A prepared in (1) of Example 1b was coated on this silicon wafer to obtain a dried film thickness of 1.0 and the silicon wafer was further heated to dry in an oven at 220° C. for 1 hour to form an undercoat layer. Thus, a silicon wafer substrate with an undercoat layer was obtained.

(Preparation of Pattern of Color Filter for Solid-State Image Pickup Device)

Each of the colored curable compositions employed in Examples 1b to 9b was coated on the undercoat layer of the silicon wafer substrate with an undercoat layer obtained, to achieve a dried film thickness of respective coating films of 0.8 μm, thereby forming a photocurable coating film. Then, the silicon wafer was heat treated (prebaking) for 120 seconds using a hot plate at 100° C. Subsequently, the silicon wafer was exposed to a 365 nm-wavelength light at 100 mJ/cm$^2$-stepwise varying exposure doses in the range of 100 to 2500 mJ/cm$^2$, through a patterned mask having an island pattern with each side of 1.2 μm, using an i-ray stepper exposure apparatus FPA-3000i5+ (manufactured by Canon, Inc.). Thereafter, the silicon wafer substrate on which an irradiated coating film had been formed was placed on a horizontal rotary table of a spin-shower developing machine (DW-30 type; manufactured by Chemitronics Co., Ltd.), and subjected to a paddle development at 23° C. for 60 seconds using a 60% CD-2000 (manufactured by Fuji Film Electronics Materials Co., Ltd.), to form a colored pattern on the silicon wafer substrate.

The silicon wafer substrate on which a colored pattern had been formed was fixed to the horizontal rotary table by a vacuum chuck method. While the silicon wafer substrate was rotated by a rotating apparatus at a speed of rotation of 50 rpm, a rinsing treatment was conducted by supplying purified water in shower form from above the rotational center of the silicon wafer from a jetting nozzle, and then the silicon wafer was spray-dried.

Each pattern image obtained using the respective colored curable compositions employed in Examples 1b to 9b was square-shaped and had a rectangular cross-sectional shape. These pattern images are suitable for solid-state image pickup devices, thus showing favorable profiles.

Examples 40b and 41b

Next, preparation of a color filter in accordance with an ink-jet method was carried out. First, as preparations for production of a substrate with a partition wall, Pigment Dispersion K with dispersion of carbon black used in a composition (K1) for the formation of the partition wall was prepared according to the following composition.

<Composition of Pigment Dispersion K>
Carbon black (Nipex35, manufactured by Degussa): 13.1%
Dispersant (Compound B1 of the following structure): 0.65%
Polymer (random copolymer of benzyl methacrylate/methacrylic acid in a molar ratio of 72/28, having a molecular weight of 37,000): 6.72%
Propylene glycol monomethylether acetate: 79.53%

Compound B1

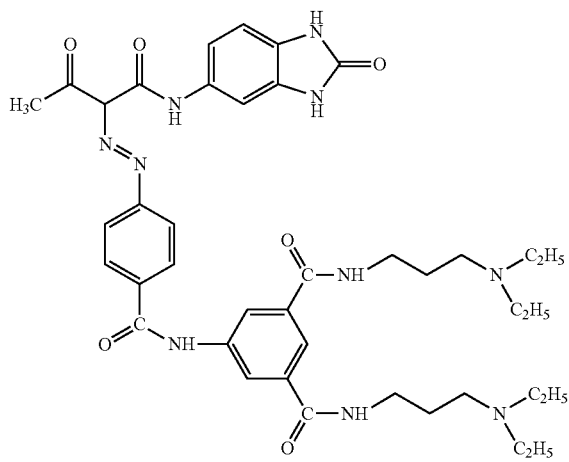

<Preparation of Composition (K1) for Formation of Partition Wall>

The composition of a composition (K1) for the formation of a partition wall is given in Table 7b.

Pigment Dispersion K and propylene glycol monomethylether acetate were mixed at a temperature of 24° C. (±2° C.), stirred at 150 rpm for 10 minutes, and with further stirring, methylethyl ketone, Binder 2, hydroquinone monomethylether, DPHA liquid, 2,4-bis(trichloromethyl)-6-[4'-(N,N-bis-diethoxycarbonylmethyl)amino-3'-bromophenyl]-s-triazine, and Surfactant 1 were sequentially added at a temperature of 25° C. (±2° C.), followed by stirring at a temperature 40° C. (±2° C.) and 150 rpm for 30 minutes to obtain a desired composition. In addition, the term "Amount" in the table denotes "parts by mass".

TABLE 7b

| Composition (K1) for formation of partition wall | Amount |
|---|---|
| Pigment Dispersion K | 25 |
| Propylene glycol monomethylether acetate | 8 |
| Methylethyl ketone | 53 |
| Binder 2 | 9.1 |
| Hydroquinone monomethylether | 0.002 |
| DPHA liquid | 4.2 |
| 2,4-bis(trichloromethyl)-6-[4'-(N,N-bisethoxycarbonylmethyl)amino-3'-bromophenyl]-s-triazine | 0.16 |
| Surfactant 1 | 0.044 |

<Binder 2>
Polymer (benzyl methacrylate/methacrylic acid (=78/22 molar ratio) random copolymer with a molecular weight of 38,000): 27%
Propylene glycol monomethyl ether acetate: 73%
<DPHA liquid>
Dipentaerythritol hexaacrylate (trade name: KAYARAD DPHA, containing 500 ppm polymerization inhibitor MEHQ, manufactured by Nippon Kayaku Co., Ltd.): 76%
Propylene glycol monomethyl ether acetate: 24%
<Surfactant 1>
Structure 1 below: 30%
Methyl ethyl ketone: 70%

Structure 1

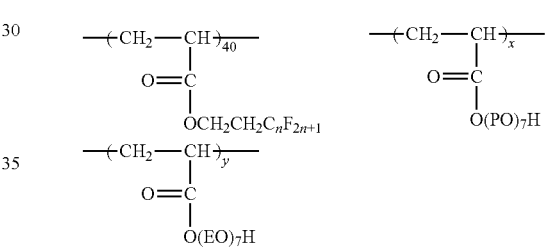

(n = 6, x = 55, y = 5, Mw = 33940, Mw/Mn = 2.55, PO: Propylene oxide, EO: Ethylene oxide)

<Formation of Partition Walls>
An alkali-free glass substrate was washed with a UV cleansing apparatus, then washed with a brush using a detergent, and further washed by ultrasonic cleaning with ultrapure water. The substrate was heat-treated at 120° C. for 3 minutes to stabilize its surface state.

The substrate was cooled, then regulated to a temperature of 23° C., and coated with a composition K1 for the formation of partition walls shown in the above table, by using a glass-substrate coater equipped with a slit-shaped nozzle (trade name: MH-1600, manufactured by F.A.S. Asia). Subsequently, a part of the solvent was evaporated for 30 seconds with a VCD (vacuum drier, manufactured by Tokyo Ohka Kogyo Co., Ltd.) to eliminate the fluidity of the coating layer, and the specimen was pre-baked at 120° C. for 3 minutes to give a substrate having a partition wall-forming layer of 2.3 µm in thickness.

Then, the substrate and a mask were set up perpendicularly with a distance of 200 µm between the surface of the exposure mask and the partition wall-forming layer, and then pattern-wise exposed under a nitrogen atmosphere at an exposure dose of 300 mJ/cm$^2$, a partition wall width of 20 µm and a space width of 100 µm, using a proximity-type exposure device provided with an ultrahigh pressure mercury lamp (manufactured by Hitachi High-Tech Electronics Engineering Co., Ltd.).

Thereafter, the surface of the partition wall-forming layer was uniformly moistened by spraying it with purified water via a shower nozzle, and then developed at 23° C. for 80 seconds with a shower of a KOH-type developer solution (trade name: a 100-fold dilution of CDK-1, containing a nonionic surfactant, manufactured by Fuji Film Electronics Materials Co., Ltd.) at a pressure of 0.04 MPa in a flat nozzle, to give a patterning image.

Subsequently, residues were removed with ultrapure water jetted at a pressure of 9.8 MPa from an ultrahigh-pressure washing nozzle, and the surface of the substrate with the formation of the partition wall-forming layer was subjected to post-exposure at an exposure dose of 2500 mJ/cm$^2$ in the air, followed by heating in an oven at 240° C. for 50 minutes to give a stripe-shaped partition wall having a film thickness of 2.0 μm, an optical density of 4.0, and a 100 μm-wide aperture.

(Ink Repellent Plasma Treatment)

The partition wall-formed substrate was subjected to an ink repellent plasma treatment with a plasma treatment apparatus of cathode-coupling parallel-plate type under the following conditions.

Gas use for the treatment: $CF_4$,
Gas flow rate: 80 sccm,
Pressure: 40 Pa,
RF power: 50 W, and
Treatment time: 30 seconds.

(Preparation of Ink for Red Color (R))

Components set forth in Table 8b below were mixed and stirred for 1 hour. Then, the mixture was filtered under reduced pressure by a micro-filter with an average pore diameter of 0.25 μm (manufactured by Fujifilm Corp.) to prepare an ink liquid for red color (Ink R-1, and Ink R-2) in accordance with the present invention.

TABLE 8b

| | Material | Example 40b Ink R-1 | Example 41b Ink R-2 |
|---|---|---|---|
| Solvent | Cyclohexanone | 68.95% | 78.95% |
| Polymerizable compound | DPCA-60 | 20% | 10% |
| Surfactant | KF-353 | 0.05% | 0.05% |
| Polymerization initiator | V-40 | 1.0% | 1.0% |
| Colorant | Exemplified Compound P80b | 10% | 10% |
| | Ink viscosity (mPa · s) | 9.2 | 5.5 |
| | Surface tension (mN/m) | 26.1 | 29.2 |

Details of materials used in the preparation of an ink for red color (R) are described hereinbelow.

Colorant: Exemplified Compound P80b of the colorant compound containing a repeating unit represented by Formula (Pb)

Polymerizable compound (KAYARAD DPCA-60, manufactured by Nippon Kayaku Co., Ltd.): caprolactone-modified dipentaerythritol hexaacrylate KF-353 (manufactured by Shin-Etsu Silicone Co., Ltd.): polyether-modified silicone oil Polymerization initiator: azobis(cyclohexane-1-carbonitrile) (V-40, manufactured by Wako Pure Chemical Industries, Ltd.)

(Measurement of Viscosity and Surface Tension)

The viscosities of the inks obtained were measured with an E-type viscometer (RE-80L, manufactured by Toki Sangyo Co., Ltd.) under the following conditions, while these inks were kept at 25° C.

(Measurement Conditions)

Rotor used for the measurement: 1° 34'×R24,
Measurement time: 2 minutes, and
Measurement temperature: 25° C.

The surface tension of the inks obtained were measured with a surface tension meter (FACE SURFACE TENSIOMETER CBVB-A3, manufactured by Kyowa Interface Science Co., Ltd.), while these inks were kept at 25° C.

(Method of Measuring Contrast)

Figure 5:
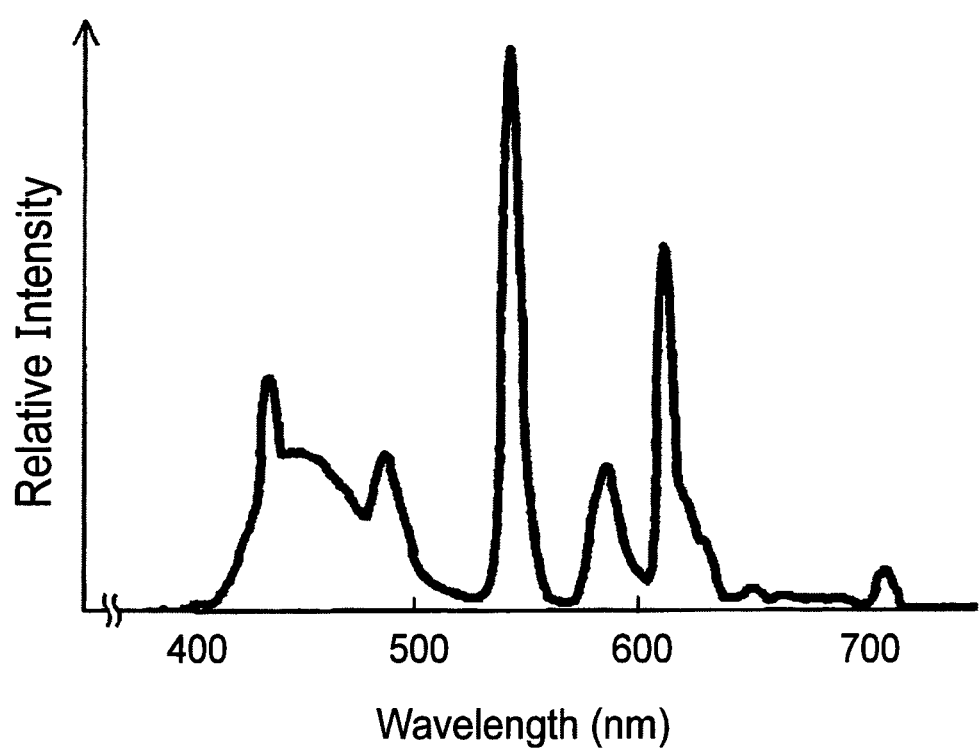
FIG. 5 shows a wavelength spectrum distribution of a cold cathode tube light source.

A cold cathode tube light source (light source emitting a light having a wavelength spectrum distribution shown in FIG. 5) provided with a diffusion substrate was used as a backlight unit, a monochrome substrate was arranged between two polarizing plates (POLAX-15N, manufactured by Luceo Co., Ltd.), and a contrast was calculated by dividing a Y value of a chromaticity of light which passes when polarizing plates are arranged at parallel Nicol by a Y value of a chromaticity of light which passes when arranged at crossed Nicol. For measuring a chromaticity, a color luminance meter (BM-5A, manufactured by Topcon Corporation) was used.

A measurement angle of the color luminance meter was set to 1°, and the measurement was made in a visual field ϕ5 mm on the sample. A light intensity of the backlight was set in such a manner that the luminance is 400 cd/m$^2$ when two polarizing plates are arranged at parallel Nicol when no sample is arranged.

The monochrome substrate was prepared by the following method. Using one of the R inks (Ink R-1 and Ink R-2) constituting the color filter, a solid film was formed on the glass substrate according to an ink jet method or a spin coating method. Then, as in the formation of a color filter, prebaking (pre-heating) (at a temperature of 100° C. for 2 minutes) and postbaking (post-heating) (at a temperature of 220° C. for 30 minutes) were carried out to form a monochrome substrate having a film thickness of 2 μm.

When the contrasts of the thus obtained monochrome substrates (2 kinds) were measured, values of 50000 or more were obtained for all of them.

(Preparation of ITO Layer)

Next, indium tin oxide (ITO) was sputtered on the thus obtained monochrome substrate using a sputter apparatus at a film surface temperature of 200° C. for 15 minutes to form an ITO film with a film thickness of 1500 Å, thereby preparing an ITO-attached color filter substrate.

(Changes in Spectral Characteristics Between Before and after ITO Sputtering)

Before and after ITO sputtering, a spectrum transmissivity curve in the wavelength range of 400 nm to 700 nm was obtained using a UV-Vis spectrophotometer (V-570, manufactured by Japan Spectroscopic Co., Ltd.). When a spectrum transmissivity change in the maximum peak between before and after sputtering is small, this means that the film is heat-resistant. It could be seen that the spectrum shape before and after ITO sputtering in the prepared substrate was substantially not changed, and the film has high heat resistance.

Comparative Examples 7b and 8b (Preparation of Pigment Dispersion)

17.5 parts of a pigment, C.I. Pigment Red 177 (Cromophtal Red A2B, manufactured by Ciba Specialty Chemicals Inc.), 2.5 parts of a pigment dispersant (above-mentioned Compound B1), and 80 parts of a solvent (1,3-butanediol diacetate) (hereinafter, referred to as "1,3-BGDA") were compounded and pre-mixed, and then dispersed using zirconia beads having a diameter of 0.65 mm at a charge rate of 80% by using a motor mill M-50 (manufactured by Aiger Japan Corp.) at a circumferential rate of 9 m/s for 25 hours, thereby preparing a pigment dispersion for R (R-177).

A pigment dispersion for R (R-254) was prepared in the same manner as in the pigment dispersion for R (R-177), except that the pigment in the pigment dispersion for R (R-177) was changed to C.I. Pigment Red 254 (Irgaphor Red B-CF, manufactured by Ciba Specialty Chemicals Inc.). In addition, when a number average particle diameter of this pigment dispersion was measured using a Nanotrac UPA-EX150 (manufactured by Nikkiso Co., Ltd.), it was 50 nm.

(Preparation of Inks Used in Comparative Examples 7b and 8b

Using the pigment dispersions (R-177) and (R-254) for Comparative Examples 7b and 8b, Comparative Inks R-3 and R-4 were prepared according to the composition given in, Table 9b. In addition, materials used for the preparation of inks are as follows.

Solvent: propylene glycol monomethylether acetate (hereinafter, referred to as "MMPGAC")
Polymerizable compound: KAYARAD DPS100 (manufactured by Nippon Kayaku Co., Ltd.)
Polymerizable compound: KAYARAD TMPTA (manufactured by Nippon Kayaku Co., Ltd.)
Surfactant: Surfactant 1 as described above
Polymerization initiator: azobis(cyclohexane-1-carbonitrile) (V-40, manufactured by Wako Pure Chemical Industries, Ltd.)

TABLE 9b

|  | Material | Comparative Example 7b Comparative Ink R-3 | Comparative Example 8b Comparative Ink R-4 |
|---|---|---|---|
| Solvent | 1,3-BGDA | 23.9 mass % | 48.5 mass % |
|  | MMPGAC | 20 mass % | — |
| Polymerizable compound | DPS100 | 20 mass % | 10 mass % |
|  | TMPTA | — | 5 mass % |
| Surfactant | Surfactant 1 | 0.1 mass % | 0.1 mass % |
| Colorant | Pigment dispersion R-177 | 2.5 mass % | 32.5 mass % |
|  | Pigment dispersion R-254 | 32.5 mass % | 2.5 mass % |
| Polymerization initiator | V-40 | 1 mass % | 1.4 mass % |

(Method of Preparing Color Filter for Evaluation)

Each of the thus-prepared Inks R-1 to R-4 was jetted in the region (the recessed part surrounded by the convex part) compartmented by partition walls on the above-obtained substrate, using an ink-jet printer DMP-2831 (manufactured by Fujifilm Dimatix Inc.), followed by heating in an oven at 100° C. for 2 minutes. Then, the thus treated substrate was allowed to stand in an oven at 220° C. for 30 minutes, thereby preparing a monochromatic color filter.

(Evaluation of Ink Storage Stability)

Each of the thus-prepared Inks was stored in a constant-temperature room at 50° C., and the ink viscosity after 30 days was measured and the evaluation was carried out based on the difference (%) with a value immediately after the preparation of the ink [(viscosity after 30 days−viscosity immediately after preparation)/viscosity immediately after preparation]. Evaluation criteria are classified as follows.

A: difference with viscosity immediately after preparation of ink is less than 10%
B: difference with viscosity immediately after preparation of ink is 10% or more and less than 20%
C: difference with viscosity immediately after preparation of ink is 20% or more and less than 30%
D: difference with viscosity immediately after preparation of ink is 30% or more (Evaluation of Continuous Jetting Stability)

Using the thus-prepared inks, the jetting stability was evaluated. The evaluation was carried out by continuous jetting with an ink-jet printer DMP-2831 (manufactured by Fujifilm Dimatix Inc.) equipped with a head cartridge having a 10 pL jetting volume at a jetting frequency of 10 kHz for 30 minutes. Evaluation criteria are classified as follows.

A: Continuous jetting is possible without problems.
B: Slight non-jetting, jetting disturbance or the like is observed during jetting, but jetting returns to normal state during jetting, thus generally no problem.
C: Non-jetting or jetting disturbance occurs during jetting, and jetting does not return to normal state during jetting, but can be returned to normal state by maintenance.
D: Normal jetting does not proceed due to occurrence of non-jetting or jetting disturbance during jetting, and jetting does not return to normal state even by maintenance.

As for the maintenance, purging (which pressurizes an ink in the head to forcibly eject the ink from a nozzle) and blotting (which brings a head nozzle face into contact with a cleaning pad, to aspirate an ink of a nozzle face) were carried out by DMP-2831.

(Evaluation of Jetting Stability after Pause)

Using the thus-prepared inks, the jetting stability was evaluated. The evaluation was carried out using an ink jet printer DMP-2831 (manufactured by Fujifilm Dimatix Inc.) equipped with a head cartridge having a 10 pL jetting volume at a jetting frequency of 10 kHz, similarly to evaluation of continuous jetting stability, by jetting once for 5 minutes, and after a pause of 24 hours, jetting again under the same conditions, followed by observation of jetting state. Evaluation criteria are classified as follows.

A: Jetting is possible without problems simultaneously in response to jetting instructions.
B: Slight non-jetting, jetting disturbance or the like is observed immediately after jetting instructions, but jetting returns to normal state during jetting, thus generally no problem.
C: Non-jetting or jetting disturbance occurs, and jetting does not return to normal state during jetting, but can be returned to normal state by maintenance.
D: Normal jetting does not proceed due to occurrence of non-jetting or jetting disturbance, and jetting does not return to normal state even by maintenance.

As for the maintenance, purging (which pressurizes an ink in the head to forcibly eject the ink from a nozzle) and blotting (which brings a head nozzle face into contact with a cleaning pad, to aspirate an ink of a nozzle face) were carried out by DMP-2831.

(Evaluation of Heat Resistance)

The above-prepared respective color filters were placed in an oven heated to 230° C., followed by allowing them to stand for 1 hour, and measurement of colors was carried out. Measurement of color was carried out by using a UV-560 (manufactured by Japan Spectroscopic Co., Ltd.). $\Delta E^*ab$ of less than 5 between before and after heating was taken as "A". $\Delta E^*ab$ of 5 or more and less than 15 was taken as "B", and $\Delta E^*ab$ of 15 or more was taken as "C". The measurement method of $\Delta E^*ab$ is as described above.

(Evaluation of Chemical Resistance)

The above-prepared respective color filters were soaked in chemicals for evaluation (N-methylpyrrolidone, 2-propanol, 5% aqueous sulfuric acid solution, and 5% aqueous sodium hydroxide (caustic soda) solution) for 20 minutes, and colors before and after soaking were measured. Measurement of color was carried out by using a UV-560 (manufactured by Japan Spectroscopic Co., Ltd.). ΔE*ab of less than 5 was taken as "A". ΔE*ab of 5 or more and less than 15 was taken as "B", and ΔE*ab of 15 or more was taken as "C". The measurement method of ΔE*ab is as described above.

Table 10b summarizes the evaluation results of ink-jet inks and color filters.

TABLE 10B

| Evaluation items | Example 40b | Example 41b | Comparative Example 7b | Comparative Example 8b |
|---|---|---|---|---|
| Ink viscosity (mPa·s) | 9.2 | 5.5 | 11.2 | 10.8 |
| Surface tension (mN/m) | 26.1 | 29.2 | 29.5 | 30.2 |
| Ink storage stability | A | A | A | B |
| Continuous jetting stability | A | A | C | C |
| Jetting stability after pause | A | B | D | D |
| Heat resistance | A | A | A | A |
| Chemical resistance (N-methylpyrrolidone) | A | B | A | A |
| Chemical resistance (2-propanol) | A | A | A | A |
| Chemical resistance (5% aqueous sulfuric acid solution) | A | A | A | A |
| Chemical resistance (5% aqueous sodium hydroxide solution) | A | A | B | B |

As shown in Table 10b, ink jet inks using the colorant compound relating to the present invention had excellent storability and also exhibited superiority in terms of jetting stability. Further, the color filter prepared using the ink-jet ink of the present invention exhibited excellent chemical resistance and heat resistance, which is equivalent to the case when an ink using a pigment was employed.

On the other hand, Comparative Examples 7b and 8b employing the ink using a pigment were inferior in the post-pause jetting stability and were also poor in continuous jetting stability, thereby exhibiting poor practicality.

This application is based on and claims priority from Japanese Patent Application No. 2009-139117 filed on Jun. 10, 2009, Japanese Patent Application No. 2009-186381 filed on Aug. 11, 2009, and Japanese Patent Application No. 2009-228538 filed on Sep. 30, 2009, the disclosures of which are incorporated by reference herein.

All publications, patent applications, and technical standards mentioned in this specification are herein incorporated by reference to the same extent as if each individual publication, patent application, or technical standard was specifically and individually indicated to be incorporated by reference.

The invention claimed is:

1. A colored curable composition comprising:
    at least one selected from the group consisting of a compound represented by the following Formula (2) and a tautomer thereof; and
    at least one polymerizable compound:

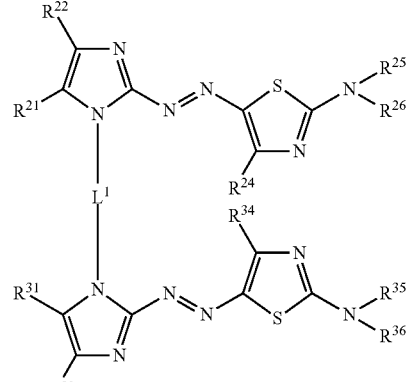

(2)

wherein $R^{21}$, $R^{22}$, $R^{24}$, $R^{25}$, $R^{26}$, $R^{31}$, $R^{32}$, $R^{34}$, $R^{35}$, and $R^{36}$ each independently represents a hydrogen atom or a monovalent substituent; $L^1$ represents a divalent linking group; and $R^{21}$ and $R^{22}$, $R^{25}$ and $R^{26}$, $R^{31}$ and $R^{32}$, and $R^{35}$ and $R^{36}$ independently may bond to each other in each pair to form a ring.

2. An ink-jet ink comprising the colored curable composition of claim 1, where the ink-jet ink is used in the formation of a colored pixel according to an ink-jet method.

3. The colored curable composition according to claim 1, wherein the polymerizable compound is a compound having two or more ethylenically unsaturated groups in a molecule thereof.

4. A color resist comprising the colored curable composition of claim 1, wherein the color resist is used in the formation of a colored pixel according to a photolithographic method.

5. A color filter formed using the colored curable composition of claim 1.

6. An organic EL display comprising the color filter of claim 5.

7. A method for producing a color filter, comprising:
    coating the colored curable composition of claim 1 on a substrate to form a colored layer;
    exposing the colored layer through a mask; and
    developing the colored layer after the exposure to form a pattern.

8. A colored curable composition comprising:
    at least one selected from the group consisting of a compound represented by the following Formula (1a) and a tautomer thereof; and
    at least one polymerizable compound,

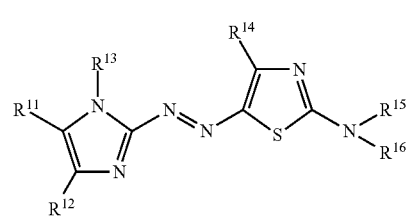

(1a)

wherein $R^{11}$, $R^{12}$, $R^{13}$, $R^{14}$, $R^{15}$, and $R^{16}$ each independently represents a hydrogen atom or a monovalent substituent; and $R^{11}$ and $R^{12}$, and $R^{15}$ and $R^{16}$ independently may bond to each other in each pair to form a ring, wherein the compound represented by Formula (1a) is a compound comprising at least one repeating unit represented by the following Formula (Pa):

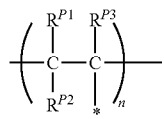

(Pa)

wherein $R^{P1}$, $R^{P2}$, and $R^{P3}$ each independently represents a hydrogen atom or a monovalent substituent; * represents a residue obtained by removing one hydrogen atom from a compound represented by Formula (1a); and n represents an integer from 1 to 100.

9. The colored curable composition according to claim 8, wherein the polymerizable compound is a compound having two or more ethylenically unsaturated groups in a molecule thereof.

10. A color resist comprising the colored curable composition of claim 8, wherein the color resist is used in the formation of a colored pixel according to a photolithographic method.

11. A color filter formed using the colored curable composition of claim 8.

12. A solid-state image pickup device comprising the color filter of claim 11.

13. An image display device comprising the color filter of claim 11.

14. A liquid crystal display comprising the color filter of claim 11.

15. A method for producing a color filter, comprising:
coating the colored curable composition of claim 8 on a substrate to form a colored layer;
exposing the colored layer through a mask; and
developing the colored layer after the exposure to form a pattern.

16. The method according to claim 15, further comprising irradiating ultraviolet rays after the process of forming a pattern by the development.

17. A method for producing a color filter, comprising depositing the colored curable composition of claim 8, by an ink-jet method in a recessed part compartmented with partition walls formed on a substrate, to form a colored pixel.

18. A colorant compound represented by the following Formula (2) or a tautomer thereof

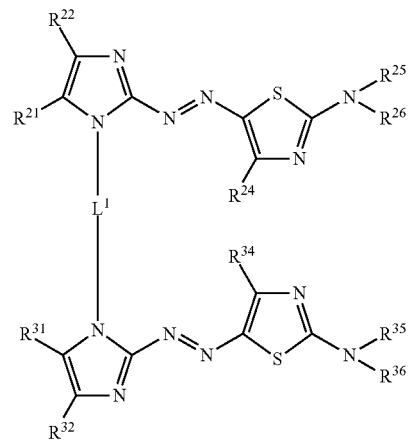

(2)

wherein $R^{21}$, $R^{22}$, $R^{24}$, $R^{25}$, $R^{26}$, $R^{31}$, $R^{32}$, $R^{34}$, $R^{35}$, and $R^{36}$ each independently represents a hydrogen atom or a monovalent substituent; $L^1$ represents a divalent linking group; and $R^{21}$ and $R^{22}$, $R^{25}$ and $R^{26}$, $R^{31}$ and $R^{32}$, and $R^{35}$ and $R^{36}$ independently may bond to each other in each pair to form a ring.

19. A colorant compound comprising at least one repeating unit represented by the following Formula (Pa), or a tautomer thereof

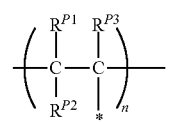

(Pa)

wherein $R^{P1}$, $R^{P2}$, and $R^{P3}$ each independently represents a hydrogen atom or a monovalent substituent; * represents a residue obtained by removing one hydrogen atom from a compound represented by the following Formula (1a); and n represents an integer from 1 to 100

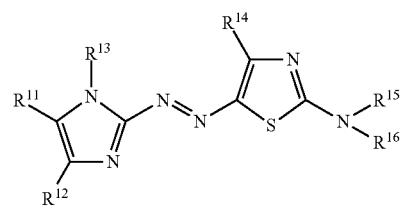

(1a)

wherein $R^{11}$, $R^{12}$, $R^{13}$, $R^{14}$, $R^{15}$, and $R^{16}$ each independently represents a hydrogen atom or a monovalent substituent; and $R^{11}$ and $R^{12}$, and $R^{15}$ and $R^{16}$ independently may bond to each other in each pair to form a ring.

20. The colorant compound or tautomer thereof according to claim 19, wherein the colorant compound has an acid group in a range of from 25 mgKOH/g to 200 mgKOH/g.

* * * * *